United States Patent [19]

Osano

[11] Patent Number: 5,442,569
[45] Date of Patent: Aug. 15, 1995

[54] METHOD AND APPARATUS FOR SYSTEM CHARACTERIZATION AND ANALYSIS USING FINITE ELEMENT METHODS

[75] Inventor: Minetada Osano, Tokyo, Japan
[73] Assignee: Oceanautes Inc., Tokyo, Japan
[21] Appl. No.: 82,409
[22] Filed: Jun. 23, 1993
[51] Int. Cl.[6] ............................................. G06F 15/20
[52] U.S. Cl. ...................................................... 364/578
[58] Field of Search ................ 364/578, 512, 735, 736, 364/754, 801, 804, 232.3, 577, 474.24; 395/500, 920

[56] References Cited

U.S. PATENT DOCUMENTS

| | | | |
|---|---|---|---|
| 4,399,702 | 8/1983 | Suzuki | 73/597 |
| 4,744,027 | 5/1988 | Bayer et al. | 364/402 |
| 4,744,028 | 5/1988 | Karmarkar | 364/402 |
| 4,797,842 | 1/1989 | Nackman | 364/578 |
| 4,819,161 | 4/1989 | Konno et al. | 364/578 |
| 4,912,664 | 3/1990 | Weiss et al. | 364/577 |
| 4,914,515 | 4/1990 | Van Luyt | 358/141 |
| 4,914,563 | 4/1990 | Karmarkar et al. | 364/148 |
| 4,914,615 | 4/1990 | Karmarkar et al. | 364/754 |
| 4,933,889 | 6/1990 | Meshkat et al. | 364/578 |
| 5,107,452 | 4/1992 | Karmarkar et al. | 364/754 |
| 5,287,529 | 2/1994 | Pentland | 364/735 |

OTHER PUBLICATIONS

Kratzer; "Massingly Parallel Sparse LU Factorization"; IEEE 1992.

Primary Examiner—Ellis B. Ramirez
Attorney, Agent, or Firm—Seed & Berry

[57] ABSTRACT

A method and apparatus for analyzing and producing systems based upon finite element modeling and partial differential equations is presented. The apparatus includes the capability for parallel processing and decomposition of a model into parts. The method permits a model to be assembled from parts stored in a memory or database. The model is produced by interconnecting into a package the partition subsystems through an interface. The system does not require processing of data relating to an entire model at a single time. It thus permits analyses to be performed with reduced processing times and memory capacity requirements.

20 Claims, 43 Drawing Sheets $$1.0X_1 + 2.0X_2 + 3.0X_3 + 4.0X_4 + 1.0 = 0.0$$
$$5.0X_1 + 1.0X_2 + 6.0X_3 + 7.0X_4 + 2.0 = 0.0$$
$$8.0X_2 + 1.0X_3 + 9.0X_4 + 3.0 = 0.0$$
$$10.0X_3 + 1.0X_4 + 4.0 = 0.0$$

FIG. 1A

$$\begin{pmatrix} 1.0 & 2.0 & 3.0 & 4.0 \\ 5.0 & 1.0 & 6.0 & 7.0 \\ 0.0 & 8.0 & 1.0 & 9.0 \\ 0.0 & 0.0 & 10.0 & 1.0 \end{pmatrix} \begin{pmatrix} X_1 \\ X_2 \\ X_3 \\ X_4 \end{pmatrix} = \begin{pmatrix} -1.0 \\ -2.0 \\ -3.0 \\ -4.0 \end{pmatrix}$$

$$A \quad \cdot \quad X \quad = \quad b$$

FIG. 1B

$$\boxed{1.0X_1} + 2.0X_2 + 3.0X_3 + 4.0X_4 + 1.0 = 0.0$$

$$5.0X_1 + \boxed{1.0X_2} + 6.0X_3 + 7.0X_4 + 2.0 = 0.0$$

$$8.0X_2 + \boxed{1.0X_3} + 9.0X_4 + 3.0 = 0.0$$

$$10.0X_3 + \boxed{1.0X_4} + 4.0 = 0.0$$

Internal Variables $$[1.0]\ [X_1] = [\,-2.0\ \ -3.0\ \ -4.0\,] \begin{pmatrix} X_2 \\ X_3 \\ X_4 \end{pmatrix} + [\,-1.0\,]$$

$$[Xd] = [Au] \cdot [Xu] + [b]$$

$$\begin{bmatrix} 1.0 & 2.0 \\ 5.0 & 1.0 \end{bmatrix} \begin{Bmatrix} X_1 \\ X_2 \end{Bmatrix} = \begin{bmatrix} -3.0 & -4.0 \\ -6.0 & -7.0 \end{bmatrix} \begin{Bmatrix} X_3 \\ X_4 \end{Bmatrix} + \begin{Bmatrix} -1.0 \\ -2.0 \end{Bmatrix}$$

$$X_d = A_u \cdot X_u + b$$

FIG. 3C

$$\begin{bmatrix} 1.0 & 0.0 \\ 0.0 & 1.0 \end{bmatrix} \begin{Bmatrix} X_1 \\ X_3 \end{Bmatrix} = \begin{bmatrix} -1.0 & -1.1111 \\ -1.0 & -1.4444 \end{bmatrix} \begin{Bmatrix} X_3 \\ X_4 \end{Bmatrix} + \begin{Bmatrix} -0.33333 \\ -0.33333 \end{Bmatrix}$$

$$X_d = A_u \cdot X_u + b$$

FIG. 3D

$$\begin{bmatrix} 1.0 & 0.0 & 0.0 \\ 0.0 & 1.0 & 0.0 \\ 0.0 & 0.0 & 1.0 \end{bmatrix} \begin{Bmatrix} X_1 \\ X_2 \\ X_3 \end{Bmatrix} = \begin{Bmatrix} -0.746032 \\ -1.079365 \\ -0.365079 \end{Bmatrix} [X_4] + \begin{Bmatrix} -0.380952 \\ -0.380952 \\ 0.047619 \end{Bmatrix}$$

$$X_d = A_u \cdot X_u + b$$

FIG. 3E

$$\begin{bmatrix} 1.0 & 0.0 & 0.0 & 0.0 \\ 0.0 & 1.0 & 0.0 & 0.0 \\ 0.0 & 0.0 & 1.0 & 0.0 \\ 0.0 & 0.0 & 0.0 & 1.0 \end{bmatrix} \begin{Bmatrix} X_1 \\ X_2 \\ X_3 \\ X_4 \end{Bmatrix} = \begin{Bmatrix} -1.640714 \\ -2.203593 \\ -0.568862 \\ -1.688623 \end{Bmatrix}$$

$$\begin{pmatrix} 1.0 & 2.0 \\ 5.0 & 1.0 \end{pmatrix} \begin{pmatrix} X_1 \\ X_2 \end{pmatrix} = \begin{pmatrix} -3.0 & -4.0 \\ -6.0 & -7.0 \end{pmatrix} \begin{pmatrix} X_3 \\ X_4 \end{pmatrix} + \begin{pmatrix} -1.0 \\ -2.0 \end{pmatrix}$$

FIG. 6A

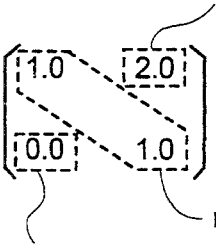

FIG. 6B

$$\begin{pmatrix} 1.0 & 2.0 & 3.0 \\ 0.0 & 1.0 & 1.0 \\ 0.0 & 0.0 & 1.0 \end{pmatrix} \begin{pmatrix} X_1 \\ X_2 \\ X_3 \end{pmatrix} = \begin{pmatrix} -4.0 \\ -1.444444 \\ -0.365079 \end{pmatrix} [X_4] + \begin{pmatrix} -1.0 \\ -0.333333 \\ 0.047619 \end{pmatrix}$$

FIG. 6C

$$\begin{pmatrix} 1.0 & 2.0 & 3.0 & 4.0 \\ 0.0 & 1.0 & 1.0 & 1.444444 \\ 0.0 & 0.0 & 1.0 & 0.365079 \\ 0.0 & 0.0 & 0.0 & 1.0 \end{pmatrix} \begin{pmatrix} X_1 \\ X_2 \\ X_3 \\ X_4 \end{pmatrix} = \begin{pmatrix} -1.0 \\ -0.333333 \\ 0.047619 \\ 1.688625 \end{pmatrix}$$

Subsystem 1:

$1.0X_1 + 0.2X_2 + 0.3X_3 + 0.4X_4 + 1.0 = 0.0$ $0.5X_1 + 1.0X_2 + 0.6X_3 + 0.7X_4 + 0.9Y_2 + 0.2Y_3 + 2.0 = 0.0$ $1.0X_3 + 0.8X_4 + 0.6Z_3 = 0.0$ $0.9X_2 + 0.8X_3 + 1.0X_4 + 0.3Y_3 + 4.0 = 0.0$

Subsystem 2:

$1.0Y_1 + 0.2Y_2 + 0.3Y_3 + 0.4Y_4 = 0.0$ $0.3X_4 + 0.5Y_1 + 1.0Y_2 + 0.6Y_3 + 0.7Y_4 = 0.0$ $0.5X_4 + 0.8Y_2 + 1.0Y_3 + 0.9Y_4 + 0.7Z_2 + 3.0 = 0.0$ $0.8Y_3 + 1.0Y_4 + 4.0 = 0.0$

Subsystem 1:

$$\begin{pmatrix} 1.0 & 0.0 & 0.0 & 0.0 \\ 0.0 & 1.0 & 0.0 & 0.0 \\ 0.0 & 0.0 & 1.0 & 0.0 \\ 0.0 & 0.0 & 0.0 & 1.0 \end{pmatrix} \begin{pmatrix} X_1 \\ X_2 \\ X_3 \\ X_4 \end{pmatrix} = \begin{pmatrix} -0.327273 & 0.103030 & -0.003030 \\ -1.636364 & -0.151515 & 0.151515 \\ -3.272728 & 0.363636 & -1.363636 \\ 4.090909 & -0.454546 & 0.954545 \end{pmatrix} \begin{pmatrix} Y_2 \\ Y_3 \\ Z_3 \end{pmatrix} + \begin{pmatrix} 0.797980 \\ 0.101010 \\ 9.090911 \\ -11.363638 \end{pmatrix}$$

FIG. 12B

|       | $Y_2$     | $Y_3$     | $Z_3$     | b          |
|-------|-----------|-----------|-----------|------------|
| $X_1$ | -0.327273 | 0.103030  | -0.003030 | 0.797980   |
| $X_2$ | -1.636364 | -0.151515 | 0.151515  | 0.101010   |
| $X_3$ | -3.272728 | 0.363636  | -1.363636 | 9.090911   |
| $X_4$ | 4.090909  | -0.454546 | 0.954545  | -11.363638 |

FIG. 12C

|  | $Y_2$ | $Y_3$ | $Z_3$ | $b$ |
|---|---|---|---|---|
| $X_1$ | -0.327273 | 0.103030 | -0.003030 | 0.797980 |
| $X_2$ | -1.636364 | -0.151515 | 0.151515 | 0.101010 |
| $X_3$ | -3.272728 | 0.363636 | -1.363636 | 9.090911 |
| $X_4$ | 4.090909 | -0.454546 | 0.954545 | -11.363638 |

|  | $X_4$ | $Z_2$ | $b$ |
|---|---|---|---|
| $Y_1$ | -4.844312 | -3.814372 | -1.640719 |
| $Y_2$ | -5.221557 | -5.071856 | -2.203593 |
| $Y_3$ | -0.413174 | -0.377245 | -0.568862 |
| $Y_4$ | 4.131737 | 3.772455 | 1.688623 |

|  | $Y_4$ | $Y_2$ | $X_4$ | $b$ |
|---|---|---|---|---|
| $Z_1$ | 0.888889 | -2.222222 | 1.151899 | 0.399437 |
| $Z_2$ | -4.444445 | 1.111111 | 1.531646 | 0.509142 |
| $Z_3$ | 0.000000 | 0.000000 | 0.113924 | -0.367089 |
| $Z_4$ | 0.000000 | 0.000000 | -1.139241 | -0.329114 |

|     | b         |
| --- | --------- |
| $X_4$ | -0.095912 |
| $Y_2$ | -0.126412 |
| $Y_3$ | -0.411983 |
| $Y_4$ | 0.119833  |
| $Z_2$ | -0.310808 |
| $Z_3$ | -0.378015 |

FIG. 12F

|     | b         |
| --- | --------- |
| $X_1$ | -0.050955 |
| $X_2$ | -0.335777 |
| $X_3$ | 0.035386  |
| $Y_1$ | 0.009444  |
| $Z_1$ | 0.676391  |
| $Z_4$ | -0.219847 |

FIG. 12G

Multistage Decomposition

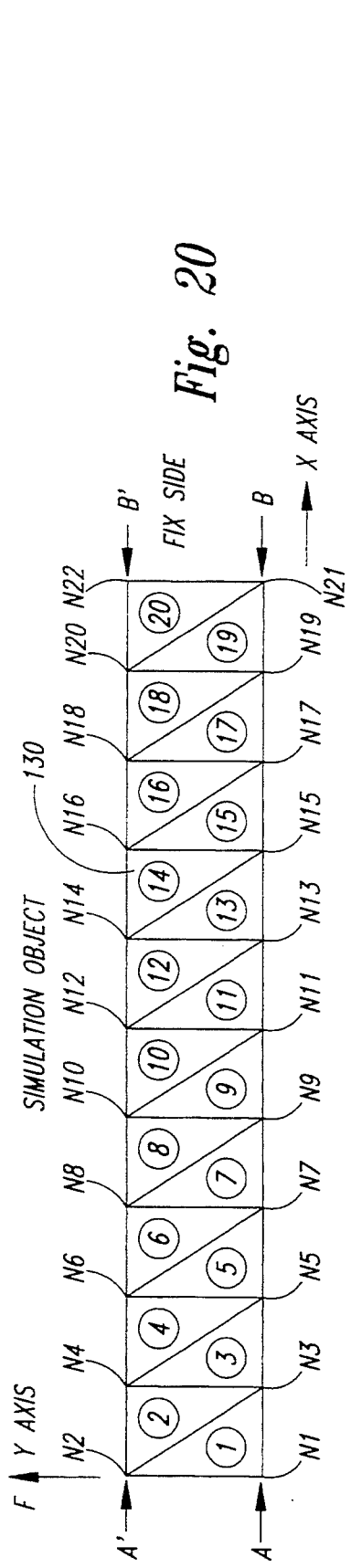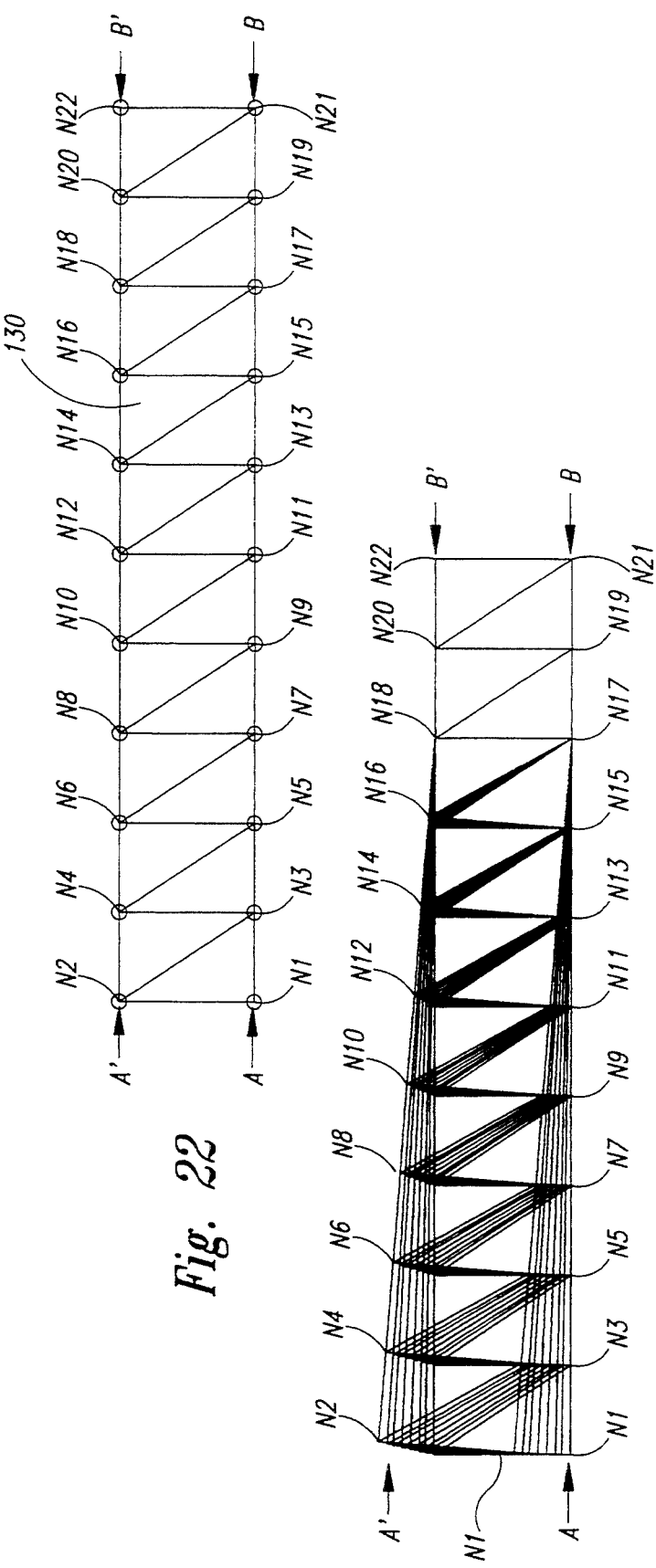
Fig. 20
Fig. 22

| Xd VARIABLE TERM | B CONSTANT TERM | COMPONENT OF Au MATRIX ON NODE NUMBER 1 | | | |
|---|---|---|---|---|---|
| | | NODE NUMBER 2 | | NODE NUMBER 3 | |
| | | x2 | y2 | x3 | y3 |
| x1 | -0.000010 | 0.300416 | -0.240333 | 0.699584 | 0.240333 |
| y2 | 0.000018 | 0.101130 | 0.919096 | -0.101130 | 0.080904 |

FIG. 21A

| Xd VARIABLE TERM | B CONSTANT TERM | COMPONENT OF Au MATRIX ON NODE NUMBER 2 | | | |
|---|---|---|---|---|---|
| | | NODE NUMBER 3 | | NODE NUMBER 4 | |
| | | x3 | y3 | x4 | y4 |
| x1 | -0.000027 | 1.000000 | 0.065241 | 0.000000 | -0.065240 |
| y1 | 0.000103 | -1.249999 | 0.189908 | 1.249999 | 0.810092 |
| x2 | 0.000115 | 0.000000 | -0.448476 | 1.000000 | 0.448476 |
| y2 | 0.000023 | -1.249999 | 0.167946 | 1.249999 | 0.832054 |

FIG. 21B

| Xd VARIABLE TERM | B CONSTANT TERM | COMPONENT OF Au MATRIX ON NODE NUMBER 3 | | | |
|---|---|---|---|---|---|
| | | NODE NUMBER 4 | | NODE NUMBER 5 | |
| | | x4 | y4 | x5 | y5 |
| x1 | -0.000078 | 0.330017 | -0.264013 | 0.669983 | 0.264013 |
| y1 | 0.000183 | 0.851358 | 1.318913 | -0.851358 | -0.318913 |
| x2 | 0.000016 | 0.977071 | 0.018343 | 0.022929 | -0.018343 |
| y2 | 0.000170 | 0.850235 | 1.319811 | -0.850235 | -0.319812 |
| x3 | -0.000052 | 0.326681 | -0.261345 | 0.673319 | 0.261345 |
| y3 | 0.000015 | 0.051127 | 0.959099 | -0.051127 | 0.040901 |

FIG. 21C

| Xd VARIABLE TERM | B CONSTANT TERM | COMPONENT OF Au MATRIX ON NODE NUMBER 4 | | | |
|---|---|---|---|---|---|
| | | NODE NUMBER 5 | | NODE NUMBER 6 | |
| | | x5 | y5 | x6 | y6 |
| x1 | -0.000098 | 0.999999 | 0.070899 | 0.000001 | -0.070898 |
| y1 | 0.000447 | -2.499994 | -0.477437 | 2.499993 | 1.477433 |
| x2 | 0.000084 | 0.000001 | -0.454227 | 0.999999 | 0.454226 |
| y2 | 0.000434 | -2.499994 | -0.477678 | 2.499993 | 1.477674 |
| x3 | -0.000071 | 0.999999 | 0.070182 | 0.000001 | -0.070182 |
| y3 | 0.000170 | -1.249997 | 0.180815 | 1.249997 | 0.819183 |
| x4 | 0.000067 | 0.000001 | -0.449301 | 0.999999 | 0.449301 |
| y4 | 0.000157 | -1.249997 | 0.169831 | 1.249997 | 0.830167 |

*FIG. 21D*

| Xd VARIABLE TERM | B CONSTANT TERM | COMPONENT OF Au MATRIX ON NODE NUMBER 12 | | | |
|---|---|---|---|---|---|
| | | NODE NUMBER 13 | | NODE NUMBER 14 | |
| | | x13 | y13 | x14 | y14 |
| x1 | -0.000817 | 0.999918 | 0.070931 | 0.000083 | -0.070916 |
| y1 | 0.008339 | -7.499078 | -3.103473 | 7.499073 | 4.103307 |
| x2 | 0.000765 | 0.000075 | -0.454262 | 0.999924 | 0.454248 |
| y2 | 0.008326 | -7.499078 | -3.103473 | 7.499073 | 4.103307 |
| x3 | -0.000790 | 0.999918 | 0.070931 | 0.000082 | -0.070917 |
| y3 | 0.006311 | -6.249275 | -2.446984 | 6.249273 | 3.446851 |
| x4 | 0.000748 | 0.000075 | -0.454262 | 0.999924 | 0.454249 |
| y4 | 0.006299 | -6.249276 | -2.446984 | 6.249273 | 3.446851 |
| x5 | -0.000720 | 0.999922 | 0.070933 | 0.000078 | -0.070919 |
| y5 | 0.004393 | -4.999476 | -1.790494 | 4.999475 | 2.790397 |
| x6 | 0.000687 | 0.000073 | -0.454263 | 0.999927 | 0.454250 |
| y6 | 0.004380 | -4.999477 | -1.790494 | 4.999475 | 2.790398 |
| x7 | -0.000606 | 0.999931 | 0.070936 | 0.000070 | -0.070923 |
| y7 | 0.002693 | -3.749663 | -1.133999 | 3.749662 | 2.133935 |
| x8 | 0.000582 | 0.000065 | -0.454265 | 0.999934 | 0.454253 |
| y8 | 0.002681 | -3.749665 | -1.134001 | 3.749664 | 2.133938 |
| x9 | -0.000448 | 0.999946 | 0.070934 | 0.000054 | -0.070923 |
| y9 | 0.001322 | -2.499826 | -0.477475 | 2.499826 | 1.477441 |
| x10 | 0.000434 | 0.000052 | -0.454216 | 0.999948 | 0.454207 |
| y10 | 0.001310 | -2.499829 | -0.477596 | 2.499828 | 1.477563 |
| x11 | -0.000246 | 0.999969 | 0.070171 | 0.000031 | -0.070165 |
| y11 | 0.000389 | -1.249945 | 0.180833 | 1.249945 | 0.819156 |
| x12 | 0.000242 | 0.000030 | -0.449290 | 0.999969 | 0.449284 |
| y12 | 0.000376 | -1.249948 | 0.169850 | 1.249948 | 0.830139 |

*FIG. 21E*

| Xd (B) VECTOR TERM ON NODE NUMBER 22 ; Au MATRIX IS ZERO MATRIX ||||
|---|---|---|---|
| x1= -0.002235 | y1= 0.037214 | x2= 0.002146 | y2= 0.037201 |
| x3= -0.002208 | y3= 0.031688 | x4= 0.002129 | y4= 0.031676 |
| x5= -0.002138 | y5= 0.026272 | x6= 0.002068 | y6= 0.026259 |
| x7= -0.002024 | y7= 0.021074 | x8= 0.001963 | y8= 0.021062 |
| x9= -0.001866 | y9= 0.016205 | x10= 0.001815 | y10= 0.016192 |
| x11= -0.001664 | y11= 0.011773 | x12= 0.001622 | y12= 0.011761 |
| x13= -0.001419 | y13= 0.007888 | x14= 0.001386 | y14= 0.007876 |
| x15= -0.001130 | y15= 0.004659 | x16= 0.001107 | y16= 0.004647 |
| x17= -0.000797 | y17= 0.002196 | x18= 0.000784 | y18= 0.002183 |
| x19= -0.000421 | y19= 0.000607 | x20= 0.000416 | y20= 0.000594 |
| x21= 0.000000 | y21= 0.000000 | x22= 0.000000 | y22= 0.000000 |

*FIG. 21F*

| NODE NUMBER | CONVENTIONAL METHOD RESULT ||
|---|---|---|
| | x-AXIS COMPONENT | y-AXIS COMPONENT |
| 1 | -0.2234827E-02 | 0.3721555E-01 |
| 2 | 0.2145915E-02 | 0.3720304E-01 |
| 3 | -0.2208256E-02 | 0.3168961E-01 |
| 4 | 0.2128724E-02 | 0.3167710E-01 |
| 5 | -0.2137925E-02 | 0.2627308E-01 |
| 6 | 0.2067770E-02 | 0.2626058E-01 |
| 7 | -0.2023848E-02 | 0.2107536E-01 |
| 8 | 0.1963065E-02 | 0.2106287E-01 |
| 9 | -0.1866033E-02 | 0.1620582E-01 |
| 10 | 0.1814621E-02 | 0.1619332E-01 |
| 11 | -0.1664487E-02 | 0.1177377E-01 |
| 12 | 0.1622443E-02 | 0.1176128E-01 |
| 13 | -0.1419214E-02 | 0.7888542E-02 |
| 14 | 0.1386537E-02 | 0.7876049E-02 |
| 15 | -0.1130215E-02 | 0.4659449E-02 |
| 16 | 0.1106906E-02 | 0.4646957E-02 |
| 17 | -0.7974942E-03 | 0.2195800E-02 |
| 18 | 0.7835499E-03 | 0.2183310E-02 |
| 19 | -0.4210414E-03 | 0.6068781E-03 |
| 20 | 0.4164111E-03 | 0.5945237E-03 |
| 21 | 0.0000000E+00 | 0.0000000E+00 |
| 22 | 0.0000000E+00 | 0.0000000E+00 |

FIG. 21G

| INTERFACE TERMINAL CONTRASTED TABLE | | |
|---|---|---|
| Tk PARTS NUMBER | NODE NUMBER | |
| | INTERNAL NODE (IN EACH PARTS) | EXTERNAL NODE |
| 1 | 101(7)　　102(8) | 201　　202 |
| 2 | 201(1)　　202(2) | 101　　102 |
| 3 | 203(7)　　204(8) 301(1)　　302(2) | 301　　302 203　　204 |

*FIG. 31*

| Xdt1 | Bt1 | COMPONENT OF Aut1 MATRIX ON PARTS T1 | | | |
|---|---|---|---|---|---|
| | | x201 | y201 | x202 | y202 |
| x101 | -0.000159 | 0.999991 | 0.070180 | 0.000009 | -0.070178 |
| y101 | 0.000279 | -1.249982 | 0.180819 | 1.249982 | 0.819176 |
| x102 | 0.000154 | 0.000009 | -0.449299 | 0.999991 | 0.449296 |
| y102 | 0.000267 | -1.249983 | 0.169836 | 1.249983 | 0.830159 |

*FIG. 32A*

| Xdt2 | Bt2 | COMPONENT OF Aut2 MATRIX ON PARTS T2 | | | | |
|---|---|---|---|---|---|---|
| | | x101<br>y303 | y101<br>x304 | x102<br>y304 | y102 | x303 |
| x201 | 0.0 | 0.557742<br>-0.017814 | 0.220835<br>0.192258 | 0.204439<br>0.097153 | -0.300174 | 0.045561 |
| y201 | 0.0 | 0.630130<br>-0.009561 | 0.477404<br>0.307369 | -0.662059<br>0.188623 | 0.343534 | -0.275439 |
| x202 | 0.0 | 0.191658<br>-0.077054 | 0.060932<br>0.058343 | 0.557375<br>0.000198 | 0.015924 | 0.192625 |
| y202 | 0.0 | 0.626963<br>-0.004479 | 0.458405<br>0.310536 | -0.599727<br>0.196640 | 0.349432 | -0.337771 |
| x203 | 0.0 | 0.058342<br>0.015924 | 0.000198<br>0.191658 | 0.192625<br>0.060932 | -0.077054 | 0.557375 |
| y203 | 0.0 | 0.310536<br>0.349432 | 0.196640<br>0.626963 | -0.337771<br>0.458405 | -0.004479 | -0.599727 |
| x204 | 0.0 | 0.192258<br>-0.300174 | 0.097153<br>0.557742 | 0.045561<br>0.220835 | -0.017814 | 0.204439 |
| y204 | 0.0 | 0.307369<br>0.343534 | 0.188623<br>0.630130 | -0.275439<br>0.477403 | -0.009561 | -0.662059 |

*FIG. 32B*

| Xdt3 | Bt3 | COMPONENT OF Aut3 MATRIX ON PARTS T3 | | | |
|---|---|---|---|---|---|
| | | x203 | y203 | x204 | y204 |
| x301 | 0.0 | 0.557742 | 0.220835 | 0.204439 | -0.300174 |
| y301 | 0.0 | 0.630130 | 0.477404 | -0.662059 | 0.343534 |
| x302 | 0.0 | 0.191658 | 0.060932 | 0.557375 | 0.015924 |
| y302 | 0.0 | 0.626963 | 0.458405 | -0.599727 | 0.349432 |

*FIG. 32C*

| Xdp | Aup | COMPONENT OF Ctp MATRIX ON PARTS TP12 | | | |
|---|---|---|---|---|---|
| | | xtp1 / xtp3 | ytp1 / ytp3 | xtp2 / xtp4 | ytp2 / ytp4 |
| xdp1 | 0.0 | 0.557742 | 0.220835 | 0.204439 | -0.300174 |
| | | 0.045561 | -0.017814 | 0.192258 | 0.097153 |
| ydp1 | 0.0 | 0.630130 | 0.477404 | -0.662059 | 0.343534 |
| | | -0.275439 | -0.009561 | 0.307369 | 0.188623 |
| xdp2 | 0.0 | 0.191658 | 0.060932 | 0.557375 | 0.015924 |
| | | 0.192625 | -0.077054 | 0.058343 | 0.000198 |
| ydp2 | 0.0 | 0.626963 | 0.458405 | -0.599727 | 0.349432 |
| | | -0.337771 | -0.004479 | 0.310536 | 0.196640 |
| xdp3 | 0.0 | 0.058342 | 0.000198 | 0.192625 | -0.077054 |
| | | 0.557375 | 0.015924 | 0.191658 | 0.060932 |
| ydp3 | 0.0 | 0.310536 | 0.196640 | -0.337771 | -0.004479 |
| | | -0.599727 | 0.349432 | 0.626963 | 0.458405 |
| xdp4 | 0.0 | 0.192258 | 0.097153 | 0.045561 | -0.017814 |
| | | 0.204439 | -0.300174 | 0.557742 | 0.220835 |
| ydp4 | 0.0 | 0.307369 | 0.188623 | -0.275439 | -0.009561 |
| | | -0.662059 | 0.343534 | 0.630130 | 0.477403 |

*FIG. 33*

| Xd12 | B12 | COMPONENT OF Aut12 MATRIX ON T12 | | | |
|---|---|---|---|---|---|
| | | x301 | y301 | x302 | y302 |
| x101 | -0.000895 | 0.999863 | 0.070909 | 0.000135 | -0.070888 |
| y101 | 0.005268 | -4.999135 | -1.790352 | 4.999139 | 2.790215 |
| x102 | 0.000862 | 0.000126 | -0.454240 | 0.999873 | 0.454221 |
| y102 | 0.005255 | -4.999137 | -1.790353 | 4.999141 | 2.790216 |
| x201 | -0.000737 | 0.999882 | 0.070916 | 0.000117 | -0.070898 |
| y201 | 0.003185 | -3.749457 | -1.133913 | 3.749460 | 2.133826 |
| x202 | 0.000714 | 0.000110 | -0.454246 | 0.999890 | 0.454229 |
| y202 | 0.003173 | -3.749460 | -1.133916 | 3.749463 | 2.133828 |
| x203 | -0.000290 | 0.999949 | 0.070164 | 0.000050 | -0.070155 |
| y203 | 0.000443 | -1.249916 | 0.180845 | 1.249917 | 0.819140 |
| x204 | 0.000285 | 0.000049 | -0.449282 | 0.999951 | 0.449274 |
| y204 | 0.000431 | -1.249919 | 0.169861 | 1.249920 | 0.830124 |

*FIG. 34A*

| Xdt12 | Bt12 | COMPONENT OF Aut12 MATRIX ON T12 | | | |
|---|---|---|---|---|---|
| | | x301 | y301 | x302 | y302 |
| x203 | -0.000290 | 0.999949 | 0.070164 | 0.000050 | -0.070155 |
| y203 | 0.000443 | -1.249916 | 0.180845 | 1.249917 | 0.819140 |
| x204 | 0.000285 | 0.000049 | -0.449282 | 0.999951 | 0.449274 |
| y204 | 0.000431 | -1.249919 | 0.169861 | 1.249920 | 0.830124 |

*FIG. 34B*

| NODE NUMBER | COMPONENT OF Aut123 MATRIX ON T123 | | | |
|---|---|---|---|---|
| | VARIABLE x | | VARIABLE y | |
| 203 | x203 | -0.001419 | y203 | 0.007888 |
| 204 | x204 | 0.001386 | y204 | 0.007876 |
| 301 | x301 | -0.001130 | y301 | 0.004659 |
| 302 | x302 | 0.001107 | y302 | 0.004647 |

| NODE NUMBER | COMPONENT OF Bt1 MATRIX ON PARTS T1 | | | |
|---|---|---|---|---|
| | x VALUE | | y VALUE | |
| 101 | x101 | -0.002024 | y101 | 0.021074 |
| 102 | x102 | 0.001963 | y102 | 0.021062 |
| 201 | x201 | -0.001866 | y201 | 0.016205 |
| 202 | x202 | -0.001815 | y202 | 0.016193 |

*FIG. 35*

METHOD AND APPARATUS FOR SYSTEM CHARACTERIZATION AND ANALYSIS USING FINITE ELEMENT METHODS

TECHNICAL FIELD

The present invention relates to a decomposition method and apparatus for solving partial differential equations and finite element modeling for analyzing a physical system using the decomposition method for solving a linear system with topological or parallel processing.

BACKGROUND OF THE INVENTION

In a conventional scheme, when a numerical analysis of a physical phenomenon such as elastic structure analysis, thermal conductance analysis, heat transfer analysis, fluid flow analysis, electrical and magnetic field analysis on a computing machine including products or physical systems is performed by solving a partial differential equation, the finite element method (FEM) is one of the most widely used computer aided engineering tools. Thanks to the advent of large-scale computers, particularly supercomputers, the finite element method has become an extremely effective technique for analyzing phenomena such as large-scale structures or systems. Its range of applications continues to expand.

The FEM method had its beginning as a method for structural analysis, but today it is used in the design and analysis of all kinds of product systems and physical systems.

In terms of the analysis itself, the finite analysis method assumes that a system to be analyzed can be constructed from numerous elements hinging upon many nodes. A system of simultaneous equations discretized for these elements is created and their solution is calculated. For this system of simultaneous equations, the computing time and the memory requirements grow as the number of separate elements increases. Numerous researchers are working to reduce the memory requirements, but despite their efforts, the need for ever larger memory capacity and computing time cannot be avoided.

In an analysis using the FEM method, a two- or three-dimensional region to be drawn for a numerical calculation is divided into small regions called "meshes" or "elements" and linear equations approximately equivalent to partial differential equations are determined on the vertices called "nodes" of each element under the boundary condition. For example, in a set of linear equations that are determined for each node, one element is represented by the following expression which is described by balancing equations, which could represent, for example, an elastic structure analysis, $$[K_q] \cdot [U_q] = [f_q] \tag{1}$$

where the subscript "q" shows the qth number of the element; $\{q=1,2,\ldots,n;$ n is the total number of elements in an analytical system$\}$ and $[K_q]$ is a constant matrix, $[f_q]$ is a constant vector determined with the boundary condition on each node and $[U_q]$ is a vector of unknown variables. Next, by using equation (1), a linear equation for the entire analytical system is obtained with the following equation (2), where [K] is a constant matrix, [f] is a constant vector and [U] is a vector of unknown variables.

$$[K] \cdot [U] = [f] \tag{2}$$

The solution of linear equation (2) is obtained by generating the inverse matrix $[K]^{-1}$ of the constant matrix [K] using a general numerical technique of the mathematical method. The result is a solution of the physical phenomenon.

A system of linear equations required to be solved with FEM techniques is often a large and complex structure and computationally difficult to solve because of the limitation of the memory contents and the time imposed on a computer system for processing the large coefficient matrix [K] of equation (2). However, as this large matrix is a sparse matrix, the nonzero elements exist only in a very small percentage of the matrix [K]. Moreover, [K] is a band diagonal matrix. That is, the nonzero elements construct a band diagonal form in all cases.

Many systems and methods for solving equations having sparse and band diagonal matrices that arise in the application of the FEM have been proposed. The methods and systems can be categorized in two groups: the direct method and the iterative method.

The direct method is an analytical technique for solving linear equations. Examples of this method are the Gaussian Elimination Method and the LU Factorization Method which considers only the nonzero elements of the [K] matrix, the Cholesky-band matrix method and the skyline method which uses the characteristic of diagonal band structure of nonzero elements in the matrix [K], the Wave Front method and the Sub-structure method which decompose a system into a number of subsystems of the same structure. The direct method can generally guarantee a solution with a finite amount of processing.

The iterative method is not an analytical method of solving linear equations. An example of this method is the Conjugate Gradient method which produces an approximated solution within a predetermined error. The iterative method performs iterative calculations on an initial data set to derive a solution within the desired error. Iterative processing does not guarantee to produce the solution in a finite amount of processing.

The direct method has been used as a linear system solver in a Neumann-type computer system using sequential processing, but recently, the iterative method has also been used for solving large linear systems in a parallel processing computational machine for reducing the time and processing required.

Two methods suitable for parallel processing have recently been proposed. One is an analytical solution method called the "parallel structure method" by C. Farhat and E. Wilson and the other is an iterative solution method called the "domain decomposition method."

The parallel substructure method uses the characteristics of two kinds of matrix structures: a border band block form and a diagonal block form, which are called "BBD Matrix." Each form is constructed by decomposing a large system into the boundary elements and the internal elements. In this process, each diagonal block can be processed simultaneously in parallel and the results for each block are substituted in the corresponding boundary border bound block for reducing the original matrix. This reduced matrix has smaller dimensions than the original one and can be solved in a shortened processing time.

The domain decomposition method is an iterative decentralized computational process using two kinds of methods. They are the Normal Direct Method for each domain decomposed and Conjugate Gradient Method for adjusting the boundary conditions of connecting adjacent domains. With these methods, the iterative process of each parallel processing is processed until a mismatch of the calculated solution error enters into the range of a limited value. However, when an analysis for a larger system is performed, in spite of parallel processing realized by such high-level computations systems as a pipeline and a parallel multiprocessor having a high speed of execution, the computational systems become impractical and inefficient. This is because the iterative processing time and the connective size between domains increase as a function of system structure.

SUMMARY OF THE INVENTION

The object of the present invention is to provide an efficient method and apparatus based on the FEM method for analyzing a physical system. The new technique effectively reduces the memory capacity requirements and computing time problems for analyses using the finite element method. The present invention applies a new method of finite element analysis termed the ON method to a physical system model. The ON method is a recently proposed new method of solving systems of linear simultaneous equations without requiring knowledge of the entire system at any time.

This method is applied to the analysis portion of the finite element method. This application differs from solution techniques for the finite element method which have generally been used up to now. Conventional techniques develop a system of equations for the system as a whole, and from there establish boundary conditions and solve the system of equations. In contrast, the ON Method technique goes through a mathematical modeling of each sub-element, establishes boundary conditions, and then goes on to determine the state of the sub-elements.

The ON method produces a series of partially solved systems (PSS). A first PSS is obtained by placing selected "determined" variables of the first linear equation of a system of N linear equations on the left side, placing the remaining "undetermined" variables and constants of the first linear equation on the right side. Next, an ith PSS is obtained for an arbitrary ith linear equation which is selected topologically from among the N linear equations, for i=2 to N, by placing the selected "determined" variable of the ith linear equation in the group of determined variables on the left side of the ith linear equation and placing the undetermined variables in the group of undetermined variables and constants of the ith linear equation on the right side.

The last stage of the process is that all variables of the linear equations are the determined variables on the left side of the last PSS equation, and the undetermined variables on the right side do not exist. Then the Nth PSS provides all solutions of the linear system.

The ON method is performed by inputting into an apparatus a system of N linear equations, where $N \geq 2$, which model a physical system. For each linear equation in the system of N linear equations, a variable for that linear equation is selected which is subsequently called the internal variable for that equation. The variables not selected are called the external variables of that linear equation. Each selected internal variable of a linear equation is different from the selected internal variables of the other linear equations.

Next, a first partially solved system (PSS) is formed using a first linear equation of the system of N linear equations. The first PSS is formed by placing the selected internal variable of the first linear equation on the left side of the first linear equation, placing the external variables and constant of the first linear equation on the right side of the first linear equation, and making a coefficient of the selected internal variable of the first linear equation one. Next an ith PSS is repeatedly formed using an ith linear equation of the system of N linear equations, for i=2 to N. The Nth PSS provides a solution to the system of N linear equations.

The ith PSS is derived by forming an intermediate PSS including the ith linear equation and an (i−1)th PSS; placing the selected internal variables of the linear equations in the intermediate PSS on the left side of each linear equation in the intermediate PSS; placing the external variables and constants of the linear equations in the intermediate PSS on the right side of each linear equation in the intermediate PSS; and operating on the intermediate PSS to make in the ith linear equation a coefficient of the selected internal variable of the ith linear equation one, to make in the ith linear equation coefficients of the selected internal variables of the 1 to (i−1)th linear equations zero, and to make in the 1 to (i−1)th linear equations a coefficient of the selected internal variable of the ith linear equation zero.

After solving, the control parameters of the physical system are then set based on the solution to the system of linear equations. The physical system is then controlled in accordance with the set control parameters. Alternatively, the solution to the system of linear equations is used to determine the operating conditions of the physical system.

Prior to forming the first PSS, the linear equations in the system of linear equations may be arranged in a certain order to reduce the time required to obtain the last PSS. Additionally, forming of an ith PSS can be performed by upper triangular implementation. In the upper triangular implementation, after the formation of the first PSS, an ith upper triangular PSS is repeatedly formed using an ith linear equation of the system of N linear equations, for i=2 to N. The Nth upper triangular PSS provides a solution to the selected internal variable of the Nth linear equation. An ith upper triangular PSS is formed by forming an intermediate upper triangular PSS including the ith linear equation and the (i−1)th upper triangular PSS; placing the selected internal variables of the 1 to ith linear equations on the left side of each linear equation in the intermediate upper triangular PSS; placing the external variables and constants of the linear equations in the intermediate upper triangular PSS on the right side of each linear equation in the intermediate upper triangular PSS; and operating on the intermediate upper triangular PSS to make a coefficient of the selected internal variable of the ith linear equation in the ith linear equation one, and to make coefficients of the selected internal variables of the 1 to i−1 linear equations in the ith linear equation zero.

A solution to the system of N linear equations is then determined by backsolving using the solution to the selected internal variable of the Nth linear equation. This solution is used to set control parameters or determine the operating conditions of the physical system.

The upper triangular implementation can reduce processing time since the number of coefficients required to be made zero has been reduced.

Complex physical systems can be modeled by a large number of linear equations which may exceed hardware and user limitations such as time and memory space constraints. However, since the ON method does not require knowledge of the entire system of linear equations at any one time, by implementing a decomposition approach to the ON method, even for extremely complex physical systems, the user and hardware requirements can be met. In the decomposition approach to the ON method, a system of linear equations modeling a physical system are divided into a number of subsystems. The 0N method is then applied to each subsystem. The final PSS of each subsystem while not immediately producing a solution to the system of linear equations reduces the number of linear equations necessary to determine a solution. After formation of the last PSS in each subsystem, the external variables, without duplicates, are identified in the last PSS of each subsystem of linear equations. A second system of linear equations is then formed including the linear equations from the last PSSs which have a selected internal variable as one of the identified external variables. Next, a first PSS is formed for the second system of equations using a first linear equation of the second system of linear equations, and then a PSS corresponding to each linear equation in the second system of linear equations is repeatedly formed until the last PSS is formed. The last PSS provides the solution to the second system of linear equations. A solution to the system of N linear equations is found by backsolving, using the solution to the second system of linear equations.

Some physical systems are so complex that even after formation of a second system of linear equations it may be necessary to divide the second system of linear equations into subsystems, and continue dividing the successively formed systems of equations into subsystems until a manageable system of equations is acquired. At that time, the solution to the first system of linear equations can be determined through backsolving.

The decomposition approach can be further modified by ordering the consecutively determined systems of equations before or after division into subsystems. The ON decomposition method is then applied to a system represented by a large number of linear equations using a computer system configured to apply the FEM method.

In one embodiment, the present invention employs a decomposition technique to reduce extremely complex systems to sets of simpler equations. When this decomposition method with the ON method is to be applied for extremely complex physical systems, a system is divided into a number of subsystems called "parts" in the decomposition process. The ON method is then applied to each part and a final PSS equation of each part is produced. The final PSS of each part has both the group of determined variables on the left side and the group of determined variables on the right side. These variables are called internal nodes and external terminal nodes. As an internal node of a part is regarded as an external node from the point of view of some other parts, all such external nodes are called the internal terminal nodes in order to distinguish them from the internal nodes that do not relate to all the other parts.

The main principle of the decomposition method is that a part is represented only as a relation between the internal terminal nodes and the external terminal nodes. Each part has a set of interface terminal parts like an Integrated Circuit Device, that is called a "terminal part system" (TPS). If the interface terminal parts are connected with interface terminals of some other parts, the state of external or internal terminal variables that constitute the interface terminals are determined by a PSS produced by the ON method. Then, if all parts are assembled to one system by connecting freely the interface terminals of each part, the states of all external variables are determined and the state of the first system of linear equation can be determined through backsolving of each part.

An object of the invention is to present an apparatus for analyzing a physical or produced system based on linear systems in finite element modeling or partial differential modeling by applying a partially solved system (PSS) to topologically solve a linear equation without requiring knowledge of the entire system at any time, comprising an input device for data such as the physical data, boundary condition data, and information data of how to divide a simulation object to elements in the modeling system; a display device for the simulation result obtained; a solver(a) device; a generating node block which arranges nodes on an object, selects a node for deciding itself, numbers its node as a kth node; a generating element block which constructs only elements of relating to the selected kth node by dividing an object in accordance with a design of the shape data and numbers its elements; a generating element equation block for generating element equations from the elements generated above; an assembly means for assembling the element equations connected to a selected node; a memory block for storing the assembled element equations; a generating block for generating nodal equations which generates the nodal equations for the kth node by selecting the equations connected to the node from the element equations stored in memory block; a PSS equation-making block which assembles the node equations and boundary conditions of kth node into a basic PSS equation; a PSS equation-determining block; a memory block for storing the basic PSS equation; and a judgment block for determining if the kth node is the final node. Another object of the invention is to present the apparatus, further comprising means for analyzing a physical or produced systems based on linear systems and nonlinear systems, including the dynamic systems or the time dependent systems, by applying finite element modeling or partial differential modeling using the PSS. Another object of the invention further includes means for including a solver of a large scale matrices having nonzero components or diagonal band structures with nonzero components; and a solver of Gaussian Elimination Method or LU Factorization Method using PSS. Another object of the invention further comprises an error comparison block, the error comparison block operative to cause a cessation of an operation upon determining a solution within a predetermined error.

Another object of the invention is to present a method for analyzing a physical or produced system based on linear systems using finite element modeling or partial differential modeling, comprising the steps of (a) inputting the physical data, boundary condition data, and information data defining to divide an object to be analyzed into elements of a modeling system; (b) arranging nodes of the object to be analyzed in accordance with information of input data; (c) numbering the arranged nodes; (d) selecting one node as a kth node to be determined where k is 1 for the first node selected and subsequent nodes are incremented; (e) constructing only elements connected to the selected kth node within the modeling system data; (f) numbering the elements constructed; (g) generating element equations for all elements generated based on a partial differential equation; (h) storing the element equations in memory; (i) generating nodal equations for the selected kth node by selecting the equations in respect of kth node from the element equations stored in memory; (j) assembling the nodal equations and boundary conditions of the kth node into a basic PSS equation; (k) finding a solution to the basic PSS equation; (l) storing the solution to the basic PSS equation in memory; (m) judging the state in reference with the condition that, if the kth node is not last node, returning to step (d) and repeating steps (b) to (m) until the kth node is the last node or if kth node is the last node, then ending the simulation process and outputting the analyzed results.

Another object of the invention is to provide a topological analysis and the propagating state by the effect of boundary conditions on each node using PSSs of the ON method.

Another object for the invention is to provide interface terminal parts in which a structure for the finite element model is divided into smaller structures.

Another object of the invention is to provide a package gathering the similar interface terminal parts that gives a new aspect of a simulation technique for simple treatment in the finite element model.

Still another object of the invention is to provide a construction technique of parts or packages for analyzing the finite element model with parallel or hierarchical parallel processing.

In one aspect, the steps of arranging and numbering nodes comprises the steps of optimally arranging nodes and numbering selected nodes in a predetermined topological order.

In another aspect of the method, the step of constructing elements comprises the step of optimally constructing elements for an object to be analyzed in consideration of an accuracy calculated in partially processing the PSS; and further includes the step of dividing a simulation object into an element vector having a triangular structure, square structure, isoparametric structure, or similar geometric structure in a two-dimensional field or a hexahedral structure, tetrahedral structure, or similar geometric form in a three-dimensional field.

In another aspect, the step of generating the element equation comprises the steps of storing the element equation generated; eliminating unneeded element equations such that only necessary element equations remain; and rearranging the necessary element equations in the memory.

In another aspect, the step of generating the node equation comprises the step of generating the kth node equation by selecting equations relating to the kth node from the element equations stored in the memory.

In another aspect, the step of assembling the node equations into the basic PSS equation of the ON method comprises the steps of assembling, wherein the assembling technique is performed using a first nodal equation of the system by placing the selected determined variables of the first nodal equation on the left side of the first basic PSS equation and placing the undetermined variables and constants of the first node equation on the right side of the first basic PSS equation; forming a kth base PSS equation from an arbitrary kth linear equation which is selected topologically from the node equations, for k=2 to N, by placing the selected determined variables of the kth node equation on the left side of the kth basic PSS equation in determined variables vector; and placing the determined variables and constants of the kth node equation on the right side of the kth basic PSS equation in the determined variables vector and constant vector, each vector being denoted by a k notation indicating the kth order of a the determined node.

In another aspect, the step of determining the basic PSS equation comprises the step of reducing a coefficient matrix of the determined variable vector in the kth basic PSS equation to a unit matrix or an LU matrix.

In another aspect, the analysis of the propagating state of the boundary condition on the object to be analyzed comprises the step of making the determined variable vector equal to a zero element vector for each determining loop such that the determined variable vector of the basic PSS equation becomes the constant vector.

In another aspect, the inventive method further includes the step of producing a terminal part by decomposing the object to be analyzed to produce an interface terminal part.

The invention can be summarized as a new solution technique and new solution system which is a type of direct method. The new solution system enables a large system to be analyzed with a small computer using PSSs of the ON method and the constructive techniques of TPS of the FEM method. The use of PSSs with the ON method is a topological partially solved system which can be processed without knowledge of the total system of linear equations, and is thus able to make the parts or packages easily into which a large finite element model is decomposed.

The TPS is constructed easily and analyzed by parallel or hierarchical parallel processing and is assembled into a system much like an electrical system or radio system, i.e., it is generated by connecting many sets of devices with an interface terminal. The TPS provides a new concept of a database technique of parts or packages in analysis techniques. If each part or package is constructed by one kind of data in a computer system, TPS is able to assembly freely any similar systems or different systems by using these databases. Physical objects having different characteristics such as material, fluid, electrical or magnetic field parameters can thus be modeled together. This allows an interchange of parts of an analyzed model by simply interchanging parts of a database of TPS.

Specific physical structures to which the invention is applied are described herein. These include the analysis of the displacement and stress in the structure of an elastically deformable member such as a steel beam. Another is an apparatus having seven main processing parts, including an input device, a generating parts device, one or more solver devices, a memory device, and an output device.

The present invention will be apparent from the following detailed description taken in conjunction with the accompanying drawings.

BRIEF DESCRIPTION OF THE DRAWINGS

FIG. 1a is a system of liner equations.

FIG. 1b is a matrix form representation of the system of linear equations in FIG. 1a.

FIG. 1c is a diagraph representation of the system of linear equations in FIG. 1a.

FIGS. 3a-3f illustrate the steps of the ON method FIGS. 2a-2c as applied to the system, of linear equations in FIG. 1a.

FIGS. 6a-6d illustrate the upper triangular implementation of the ON method as applied to the system of linear equations in FIG. 1a.

FIGS. 7a and 7b are diagraphs used to illustrate ordering of the system of linear equation FIG. 1a.

FIG. 8 is the system of linear equations in FIG. 1a reconstructed from linked lists after being ordered.

FIGS. 12a-12g illustrate the Decomposition Approach to the ON method on a system of linear equations.

FIG 14 shows the steps of the Multi-stage Decomposition Approach to the ON

FIG. 20 is an explanatory diagram depicting an example of a physical object such as a steel beam that is divided with triangular elements, for demonstrating and evaluating in accordance with the process flow shown in FIG. 17A using the apparatus shown in FIG. 16A.

FIGS. 21A-E illustrate each step of ON method in the NFEM with the example shown in FIG. 20.

FIG. 21F illustrates the solutions produced using conventional FEM with an example shown in FIG. 20 in comparison with the result of FIG. 6E.

FIG. 22 is a schematic representation of the object of FIG. 20 analyzed using the inventive method.

FIG. 31 is a tabular diagram for contrasting interface terminal node number against external terminal node number in belonging to each parts.

FIGS. 32A-C are tabular diagrams showing the relations of the internal and external terminal variable in three parts shown in FIG. 15 produced from TPS.

FIG. 33 is a tabular diagram of showing the relations of the terminal variables of a package b y relating to two parts T2, T3 on NFEM shown in FIG. 30.

FIG. 34A is a tabular diagram of the results for new parts P12 that are gotten by the connection process of two parts T1 and T2.

FIG. 34B is a tabular diagram of the results for a new interface terminal parts T12 produced from P12.

FIG. 35(A-B) are tabular diagrams of the result for a new part P123 that are gotten by the connection process of two parts T12 and T3.

DETAILED DESCRIPTION OF THE INVENTION

Figure 2B:
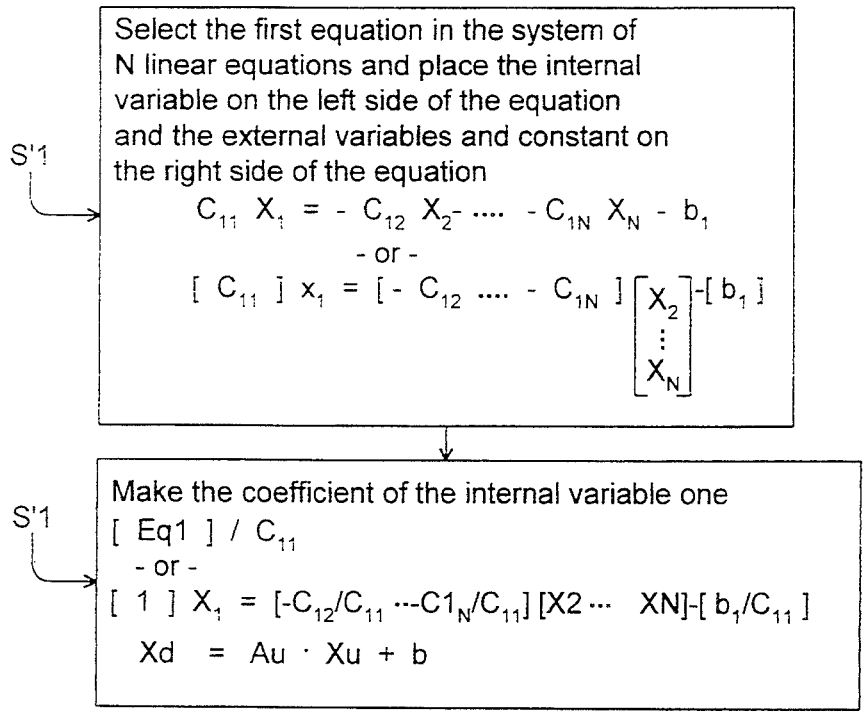
FIGS. 2a-2c show the steps of the ON method.

The method and apparatus of the invention will be described in greater detail with reference to the drawings as follows. Prior to this discussion, a summary of the ON method is helpful in understanding the present invention.

The ON Method

Short Summary of the ON Method

The ON method is a type of method to solve linear simultaneous equations. The basic manner of solving these equations with this technique follows below. The fundamental expression (determining equation) is given as:

$$Ad \cdot xd = Au \cdot xu + B$$

where,
- $x_d$: Determined variables (1) [m-dimensional]
- $x_u$: Undetermined variables [n-dimensional]
- B: Constant vector [m-dimensional]
- $A_d$: Determined array [m n-dimensional]
- $A_u$: Undetermined array [m ,n-dimensional]

States are determined by using this equation at each node. First, determined equations are formed up to the k−1 node. Transforming the Ad matrix from the fundamental expression obtained at this point with the identity matrix and rewriting, the equation can be expressed as:

$$X_d k-1 = Au k-1 \cdot X_u k-1 + B k-1 \tag{2}$$

Next, for the fundamental expression for the kth node, by finding its connection to other nodes, combining equations (1) and (2), and making the Ad matrix into the identity matrix, we get the following equation:

$$X_d k = A_u k \cdot X_u k + B k \tag{3}$$

If we carry out this process for all nodes, a solution can be obtained for all nodes.

Conventional analytical techniques find all the connection equations for each element and then solve all of the connection equations. However, the ON Method is an organic processing method in which the analysis structure is partitioned into many elements. Equations are generated for each node which make up these element groups as processing goes along. The processing steps for this technique of the ON method are given below.

Step (0-1)

Assign nodes for the purpose of generating the elements in the analysis system.

Step (0-2) Allocate how each node will be used to generate elements.

Step (0-3) Assign a predetermined sequence number (node numbers from 1 to n, where n is the last number) to each node.

Next, repeat the procedure from Step (1) to Step (6) n times.

Step (1) Select an arbitrary node j. However, select j in sequence from node 1 to the last node n.

Step (2) Generate elements which are connected to node j from the perspective of the analysis system.

Step (3) Generate relations from all of the elements which are connected to node j. These are called the element equations.

Step (4) Extract only the equations which connect to node j from these element equations. Assemble all of these to create the equations which relate to node j. These are called the node equations.

Step (5) Rewrite these node equations using the fundamental expression form of the ON Method.

Step (6) Install the node equations of the ON Method form in the ON Method fundamental expression, and find (the solution to) this expression as an equation of the form (3).

Step (0-4) When these operations have been performed on all nodes up to the last node n, the analysis is complete.

A more specific explanation of how each step is processed is given below.

Detailed Description of the ON Method

Figure 2C:
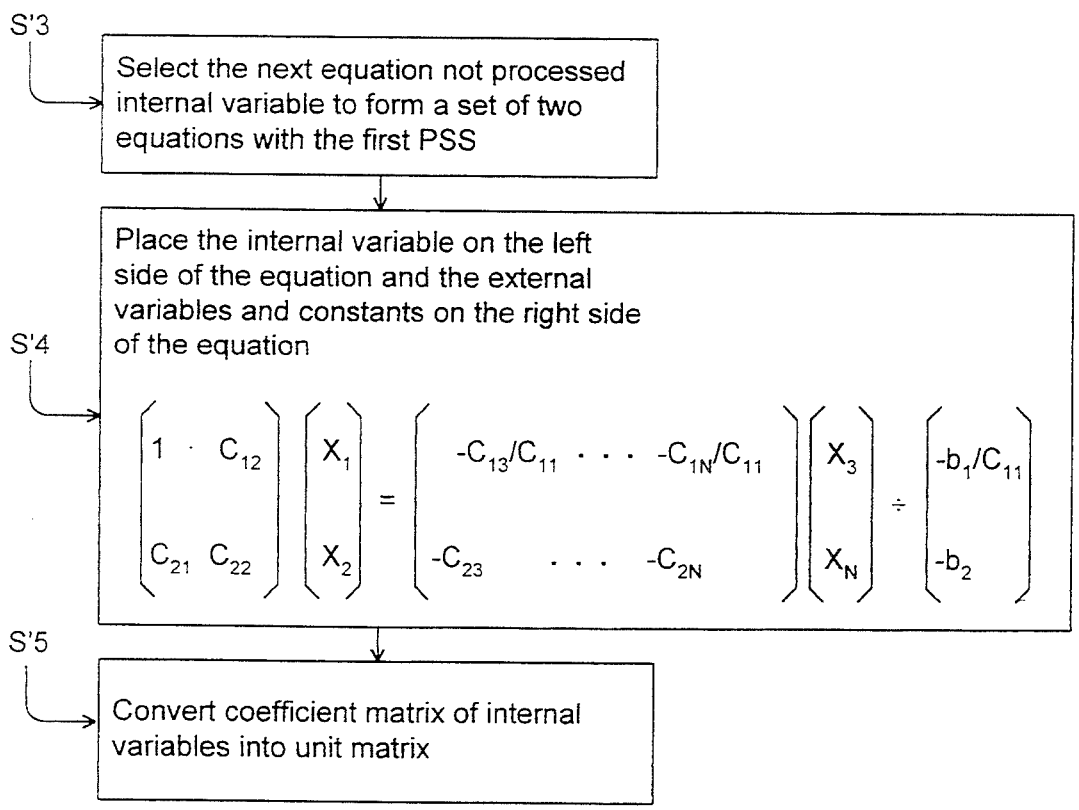
Figure 1C:
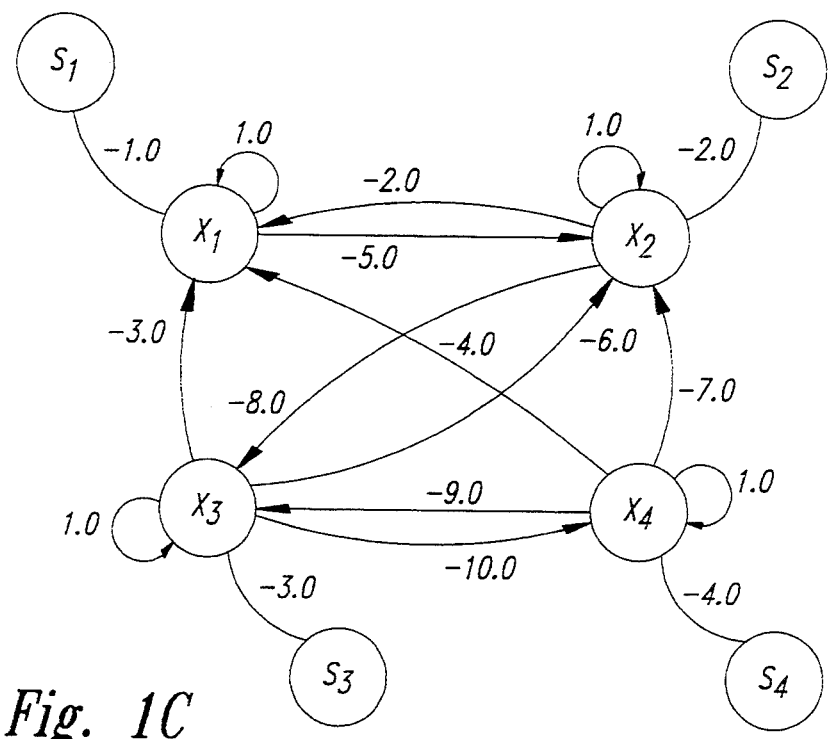

The following detailed description of the ON method is useful for a more detailed understanding of the present invention. FIG. 1a shows an example system of linear equations which will be used to illustrate the method of the present invention hereinafter called the ON method. FIG. 1b shows a matrix representation of the system of linear equations in FIG. 1a. FIG. 1c shows a diagraph representation of the system of linear equations in FIG. 1a; which will be discussed further below. The steps of the ON method are shown in FIGS. 2a-2c and illustrated by example in FIGS. 3a-f.

Figure 2A:
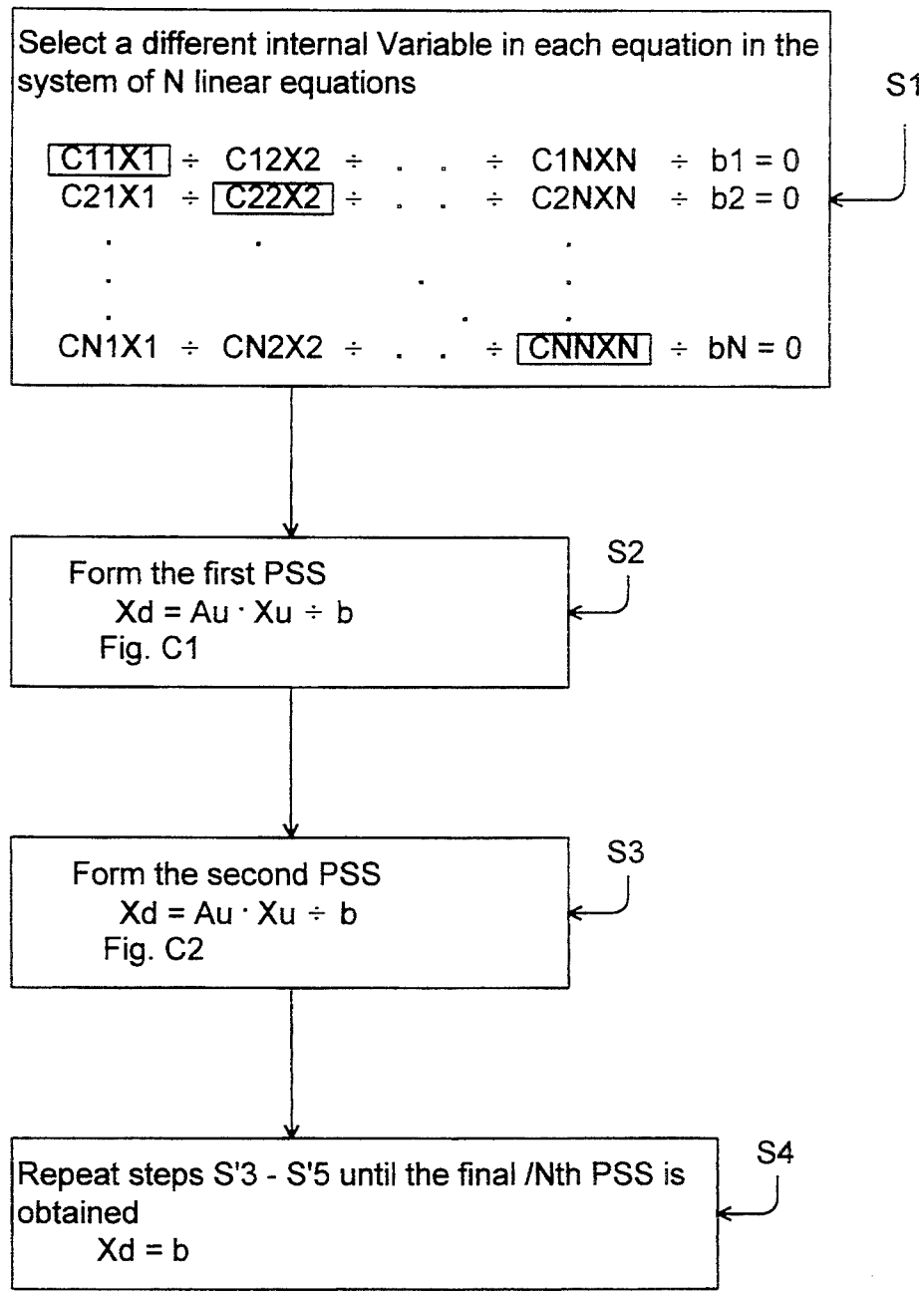
Figures 3A, 3B:
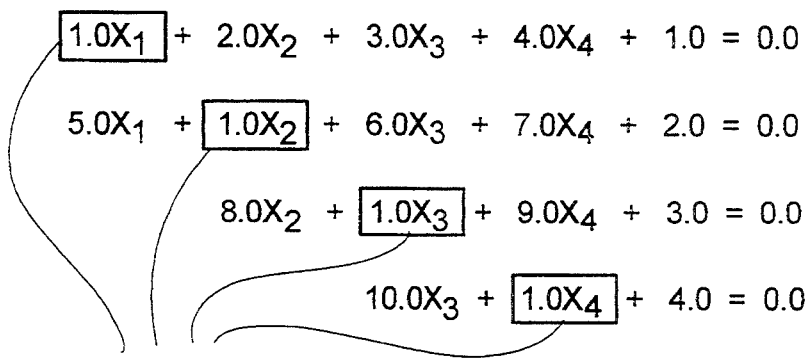

As shown in FIG. 2a, in step S1, an internal variable for each equation in a system of N linear equation is selected. The selected internal variable for each equation in step S1 is enclosed in a square. For each subsequent equation, the selected internal variable differs from those previously selected. FIG. 3a exemplifies step S1 using the system of equations in FIG. 1a. Upon selection of an internal variable for a given equation, the remaining non-internal variables are called external variables.

In step S2 the first partially solved system (PSS) is formed by isolating the selected internal variable on the left side of its respective linear equation forming the matrix equation:

$$x_d = A_u * x_u + b \tag{4}$$

where $x_d$ and $x_u$ are the vectors of the internal and external variables respectively, $A_u$ is the coefficient matrix of the vector $x_u$, and b is the vector of the constants of the variables of $x_d$. FIG. 2b shows the two step process of obtaining the first PSS for the first linear equation of the system of block S1 of FIG. 2a.

In step S'I the form of the first PSS is derived by placing on the left hand side the selected internal variable of the first equation, and placing the external variables and constant on the right hand side of the equation. If the coefficient of the selected internal variable is not one, then in step S'2 the entire equation is divided by the internal variable coefficient to obtain a unitary selected internal variable coefficient. This completes the formation of the first PSS.

FIG. 3b exemplifies step S'I as applied to the first equation of the system of linear equations of FIG. 1a. In the example of FIGS. 3b, the coefficient of the internal variable is unity, eliminating the need to perform step S'2. The equations in FIGS. 3b-3f are represented in matrix form to simplify understanding of the ON method.

In step S3 of the ON method, the second PSS is formed as detailed in FIG. 2c. In step S'3, the equation of the second internal variable is selected to form an intermediate PSS with the first PSS. In step S'4 the internal variables are placed on the left side of the equation and the external variables and constants are placed on the right side of the equation. Since both $x_1$ and $x_2$ are internal variables, these variables must appear on the left side of each equation. See FIG. 3c for the representation of this step with respect to the example system of equations in FIG. 1a. In step S'5 the coefficient matrix of the internal variables is transformed into the unit matrix by any well-known technique, such as Gaussian elimination. In other words, operating on the intermediate PSS to make in an ith linear equation a coefficient of the selected internal variable of the ith linear equation one, to make in the ith linear equation coefficients of the selected internal variables of the 1 to (i−1)th linear equation zero, and to make in the 1 to (i−1)th linear equations a coefficient of the selected internal variable of the ith linear equation zero. This step is shown with respect to the example system of equations of FIG. 3a in FIG. 3d.

In step S4 of FIG. 2a, the steps S'3–S'5 of FIG. 2c are repeated to obtain a 3rd, 4th, ... Nth PSS. The final or Nth PSS is obtained wherein $x_d = b$. In the example of FIGS. 3a–3f the fourth PSS is the final PSS. FIGS. 3e and 3f show the third and fourth(last) PSS, respectively for the example system of linear equations of FIG. 3a. It is readily apparent that the last PSS is the solution to the set of linear equations.

Sparse Matrix Memory Management

A set of linear equations is generally represented in matrix form.

$$A \cdot x = b.$$

A complete representation of the equation requires data relating to all coefficients in matrix A and constants in matrix b. However, unlike the Gaussian elimination method, knowledge of the entire system of linear equations at any time is not required with the ON method.

In a sparse matrix, several of the coefficients in the coefficient matrix A are 0. An efficient representation of a sparse matrix is a diagraph. A diagraph is a graphical representation of the way a system of linear equations is stored in the memory of an ON method apparatus.

Figure 4:
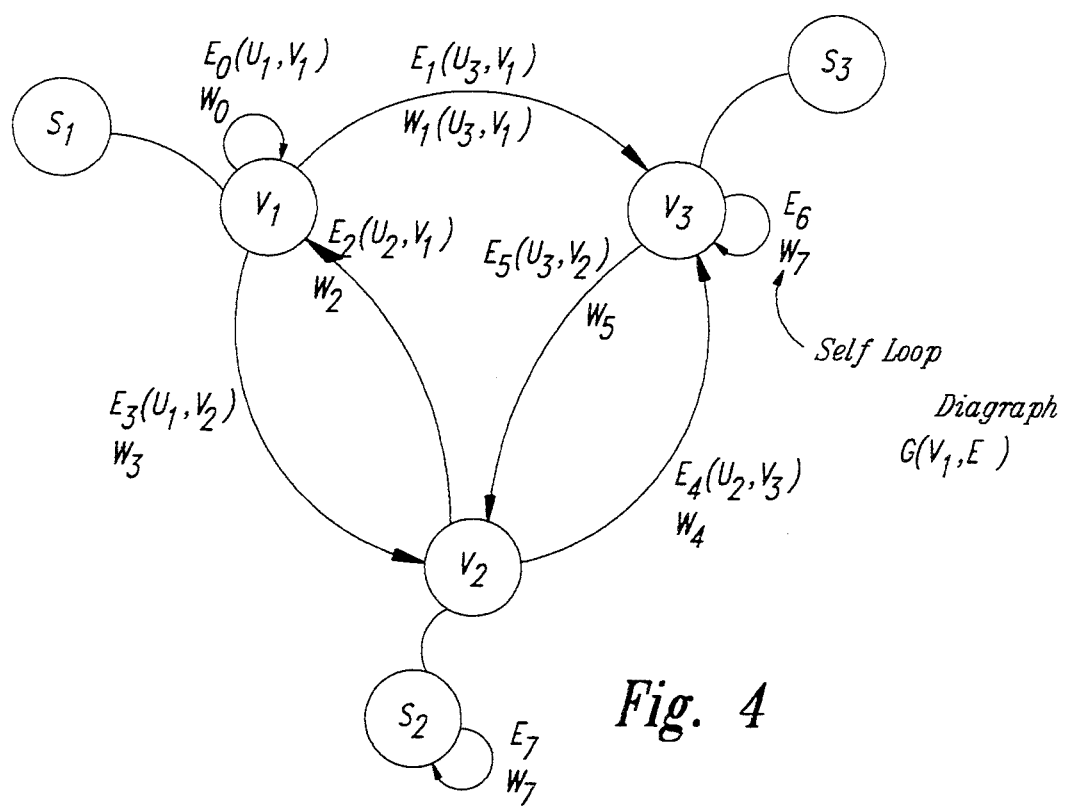
FIG. 4 is a diagraph.

In a diagraph, references to zero coefficients are eliminated, saving memory space and memory management time. In FIG. 4, diagraph $G = (V, E)$ is shown. Diagraph $G = (V, E)$ is an ordered pair of the set of V elements called vertices, which represent the variables of the set of linear equations, and the set E of ordered pairs called edges, defining the relationship between the vertices. Edge $\epsilon E (u, v)$ is called an incoming edge of the vertex v. If $u = v$, the edge is called a self-loop. In FIG. 4 an edge is shown by and arrow connecting two vertices. With an edge is associated a weight $w(u, v)$, further defining the relationship between two vertices. As stated above, FIG. 1c is a diagraph representation of the system of linear equations in FIG. 1a.

Let $a_i$ denote the element located at the ith row and jth column of matrix A in FIG. 1b. For a system of linear equations as shown in FIG. 1a, we assume without loss of generality that $a_1 \neq 0$ for $i = 1, 2, \ldots, n$. Let $x = (x_1, x_2, \ldots, x_n)$ be the set of variables, $n = 4$ in FIGS. 1a–1c. For a pair of indices i and j with $1 \leq i$ and $j \leq n$, variable $x_1$ is topologically related to variable $x_1$ if $a_1$ if $a_1 \neq 0$. Since $a_1 \neq 0$ for each i, every variable x, is topological related to itself, represented by self-loops in FIG. 1c. Thus all the topological-relationships f or A may be expressed by a diagraph $G(A) = (x, E(A))$ in the following way: each variable x, is represented by a vertex V1, the terms vertex and variable being interchangeable. If a variable $x_1$ is topologically related to another variable $x_1$ the edge $(V_1, V_j) \epsilon E(A)$ is created with a weight $w(V_1, V_j) = -a_1$. Note that the diagraph has a self-loop for each vertice.

In order to represent the non-zero constants of vector b, for each non-zero constant $b_k$, where $k = 1$ to n, a source vertex $s_k$, is created; let S denote the set of source vertices $s_k$. For each $s_k \epsilon S$ an associated weight $w(s_k, X_k = b_k$ is created. Thus, the diagraph $G(V, E) = G(A \cup b)$ where $V = x \cup S$ and $E = E(A) \cup E(b)$.

Storage Implementation of a Sparse Matrix

Figure 5:
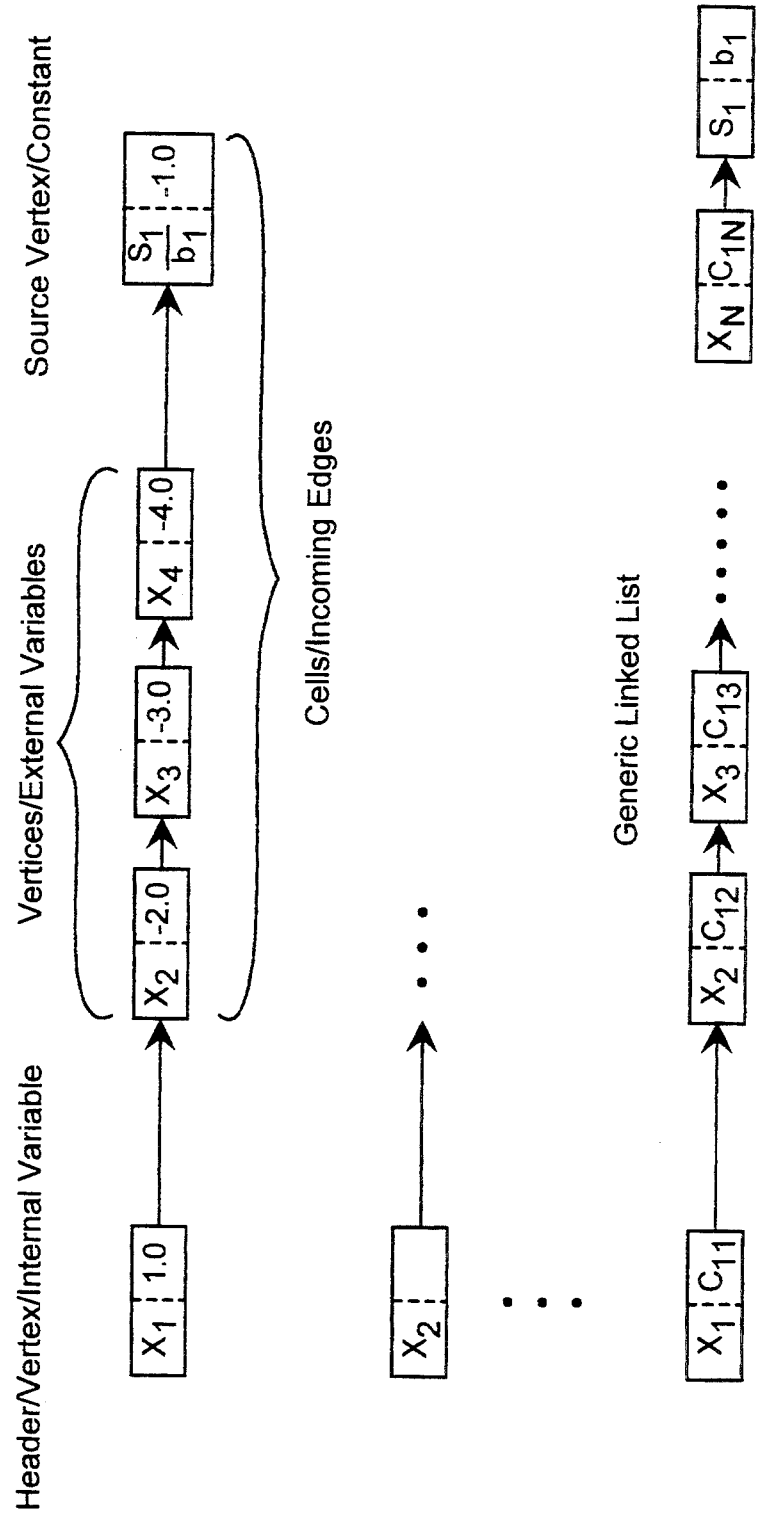
FIG. 5 shows the system of linear equations in FIG. 1a stored as linked lists.

In storing a sparse matrix in memory, storage is by linked lists, of which a diagraph is the representation thereof. The diagraph of FIG. 1c stored as a set of linked lists is shown in FIG. 5, which eliminates useless storage of zero coefficients. In storing a sparse matrix, a vertex is chosen as the header of the linked list. In FIG. 5 $x_1, x_2, x_3$, and $x_4$ are the headers of the four linked lists representing the system of linear equations. By choosing each vertex as the header, step S1 of the ON method is performed because each header/vertex is also the internal variable for that equation. Each header stores the self loop weight of that vertex, i.e., the coefficient of the variable.

Each header is linked to a set of cells, which represents an incoming edge of the vertex. A cell identifies the variable from which an incoming edge to the vertex is from, the weight of the incoming edge, and a pointer to another cell; unless it is the last cell of the linked list for that header. In FIG. 5, the first header, $x_1$, points to the cell representing the incoming edge from variable $x_2$, which points to another incoming edge from variable $x_3$. The incoming edge from variable x, points to the incoming edge from variable $x_4$, and the incoming edge from variable $x_4$ points to the incoming edge from source vertex $S_1$, (constant b for internal variable $x_1$). The ON method is then performed upon the set of linked lists.

Dense matrix

In a dense matrix, few or no zero coefficients, it is more efficient to store the set of linear equations in matrix form. However, as is obvious to one skilled in the art from the above description, the ON method does not require operations upon the entire matrix.

Upper Triangular Implementations

Instead of converting the coefficient matrix of an internal variable into the unit matrix, processing time reduction is achieved by using the upper triangular method. In the upper triangular method, the main diagonal of the internal variable coefficient matrix is still converted to unity. However, only the lower triangular region of the coefficient matrix is operated on to obtain zeros. Therefore, the last PSS only gives a solution to $x_n$, and it is necessary to back solve to obtain the solution to the remaining variables. FIGS. 6a–6d illustrate the ON method using upper triangular implementation for the system of linear equations in FIG. 1a. FIG. 6a is the same as FIG. 3c in which step S'4 for forming the second PSS has just been completed. In FIG. 6b the coefficient matrix of the internal variables has been operated on according to the upper triangular implementation discussed above. In FIG. 6c the third PSS has been formed according to the upper triangular implementation. In FIG. 6d the fourth and final PSS has been formed according to the upper triangular implementation. In FIG. 6d only a solution for $x_4$ has been determined. It is necessary to backsolve, substitute the value of $x_4$, into the equation above, to solve for $x_3$, and continue to backsolve to determine the values of $x_2$ and $x_1$.

The upper triangular implementation reduces processing time, but not without a trade off in using extra memory space. Thus the increased need for extra memory is minimized. It is obvious to one skilled in the art that instead of upper triangular, lower triangular implementations are possible, and that a choice between upper and lower triangular implementations can be made based upon the position of non-zero and zero coefficients.

Ordering

Processing time can be further reduced through ordering. Ordering is a procedure for ordering the system of linear equations so that the first and subsequent PSS's are formed in an order that minimizes processing time. Ordering also determines the internal variable for each equation. Ordering will be described with reference to the diagraph of FIG. 1c. To understand ordering it is first necessary to understand the concept of in-degree. In-degree is the number of incoming edges from external variables to a vertex reduced by the number of incoming edges from previously ordered external variables. In other words, in-degree is the number of external variables in a linear equation minus the number of external variables in that linear equation which are internal variables for previously ordered linear equations.

In FIG. 1c, when ordering is first begun, no external variables have been previously ordered. The in-degree of $x_1$, is 3. There are three incoming edges from $x_2$, $x_3$, and $x_4$ respectively. The in-degree of $x_2$, is 3, there are three incoming edges from $x_1$, $x_3$, and $x_4$, respectively. The in-degree of $x_3$, is 2, there are two incoming edges from $x_3$, and $x_4$, respectively. The in-degree of $x_4$, is 1, there is one incoming edge from $x_3$.

Since x, has the smallest in-degree the linear equation where $x_4$, is the internal variable is ordered as the first linear equation in the system of linear equations. The linear equation where is x, is the internal variable is already represented in the diagraph of FIG. 1c which is saved as a linked list as shown in FIG. 5.

Figure 7A:
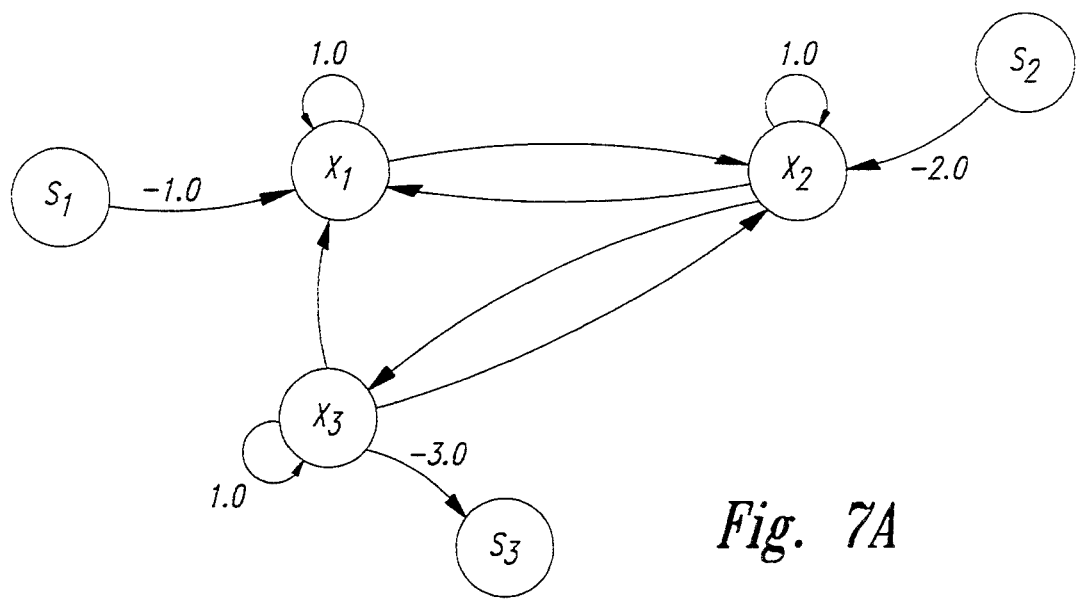

Next, the ordering process is repeated for the remaining variables $x_1$, $x_2$, and $x_3$. FIG. 7a is provided to help visualize the reduction calculation in determining the in-degree of the remaining variables. The in-degree of $x_1$, is now 2, there are three incoming edges from $x_2$, $x_3$, and $x_4$ minus the one incoming edge from $x_4$, since $x_4$ has been previously ordered. As shown in FIG. 7a, the vertex for, and edges from $x_4$, have been deleted. The number of incoming edges to $x_1$, is therefore 2, one from both $x_2$ and $x_3$. Thus the in-degree for $x_1$, is 2. Similarly the in-degree for $x_2$, is 2, and the in-degree for $x_3$, is 1. Since $x_3$, has the smallest in-degree of the remaining variables, the equation where $x_3$, is the internal variable is ordered as the next equation in the system of linear equations. Again the equation where is $x_3$, is the internal variable is already represented in the diagraph of FIG. 1c which is saved as a linked list as shown in FIG. 5.

Figure 7B:
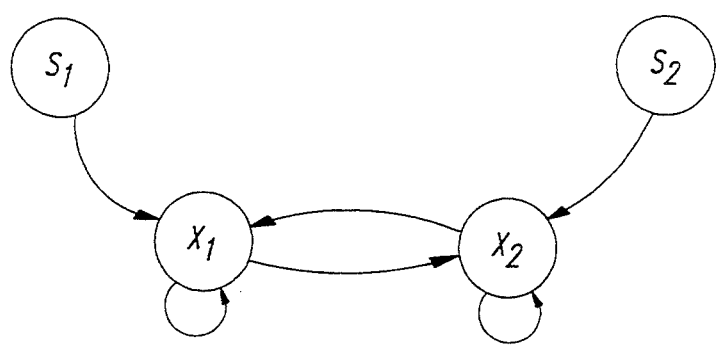

As shown in FIG. 7b the in-degree for the remaining two variable $x_1$, and $x_2$, is the same, 1. ,The ordering of the last two equations where $x_1$, and $x_2$, are the internal variables, respectively, may be performed arbitrarily. Whenever the in-degree of two or more variables is the same ordering of those variables is arbitrarily performed. FIG. 8 shows the order of the system of linear equation obtained through the above in-degree ordering process. The system of equations as shown in FIG. 8 represents the form of each linear equation when reconstructed from a linked list.

Hardware Implementation of the ON Method

Figure 9:
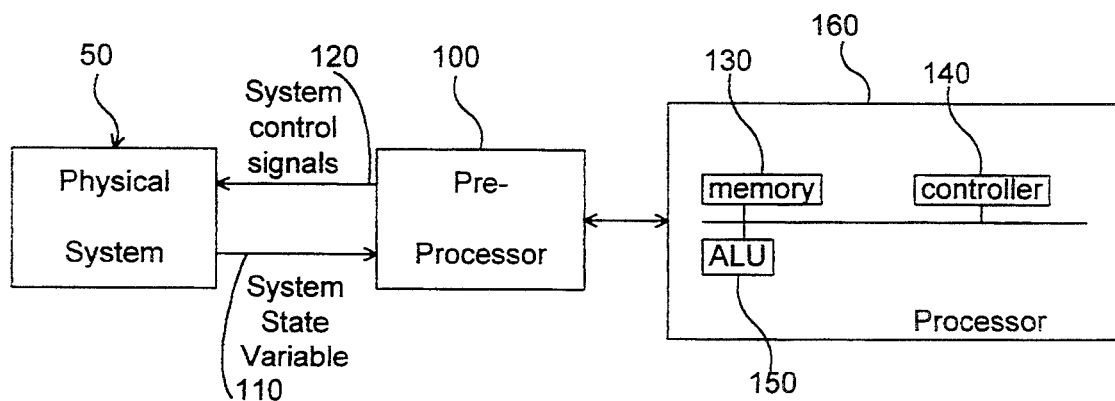
FIG. 9 is a first embodiment of an apparatus for performing the ON method.

FIG. 9 shows an apparatus for carrying out the ON method. The apparatus is a general purpose processor or processors connected to a physical system 50. While, the apparatus of FIG. 9 depicts a programmable implementation of the present invention, a "hardwired" approach would be obvious to one skilled in the art based on the present detailed description.

In FIG. 9, a preprocessor 100 receives system state variables/signals 110 from a physical system 50; for example a resource allocation environment or electronic circuit. The preprocessor performs some type of initial processing upon the received system state variables, such as modeling the physical system as a system of linear equations based on the system state variables and ordering the equations of the system of linear equations as discussed above. The preprocessor 100 is not necessarily required for operation of the present invention.

Preprocessor 100 outputs processed data to processor 160 which stores the data as described above in memory 130. Processor 160 is capable of performing the functions of preprocessor 100 and thus eliminate the need for preprocessor 100. Controller 140 manages memory 130, and controls the operation of arithmetic logic unit (ALU) 150 to carry out the ON method on the linear equations in memory 130. The solution to the system of linear equations representing physical system 50 is then output to preprocessor 100. Preprocessor 100 then sets control parameters of the physical system, and controls the physical system based on the set control parameters by outputting system control signals 120.

Figure 10:
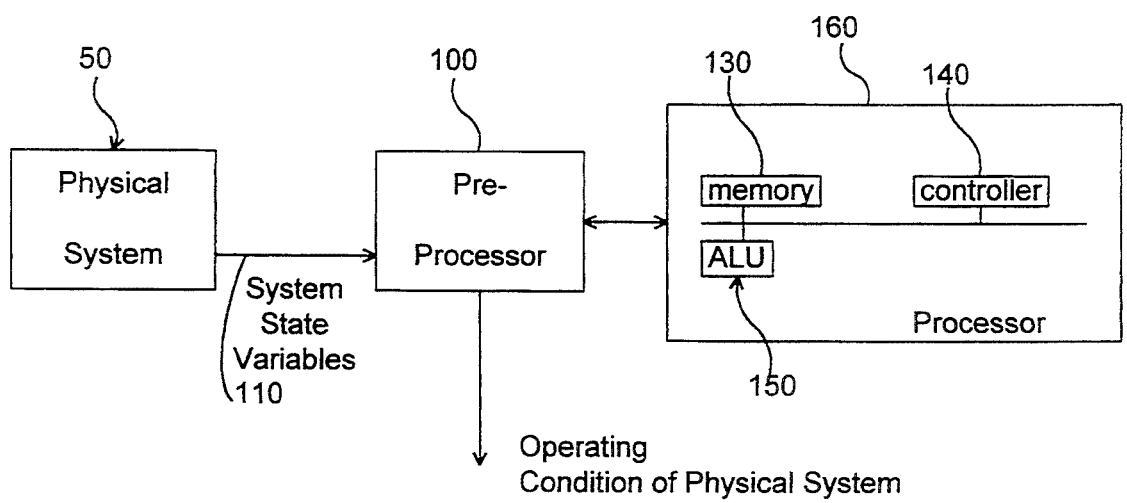
FIG. 10 is a second embodiment of an apparatus for performing the ON method.
Figure 11A:
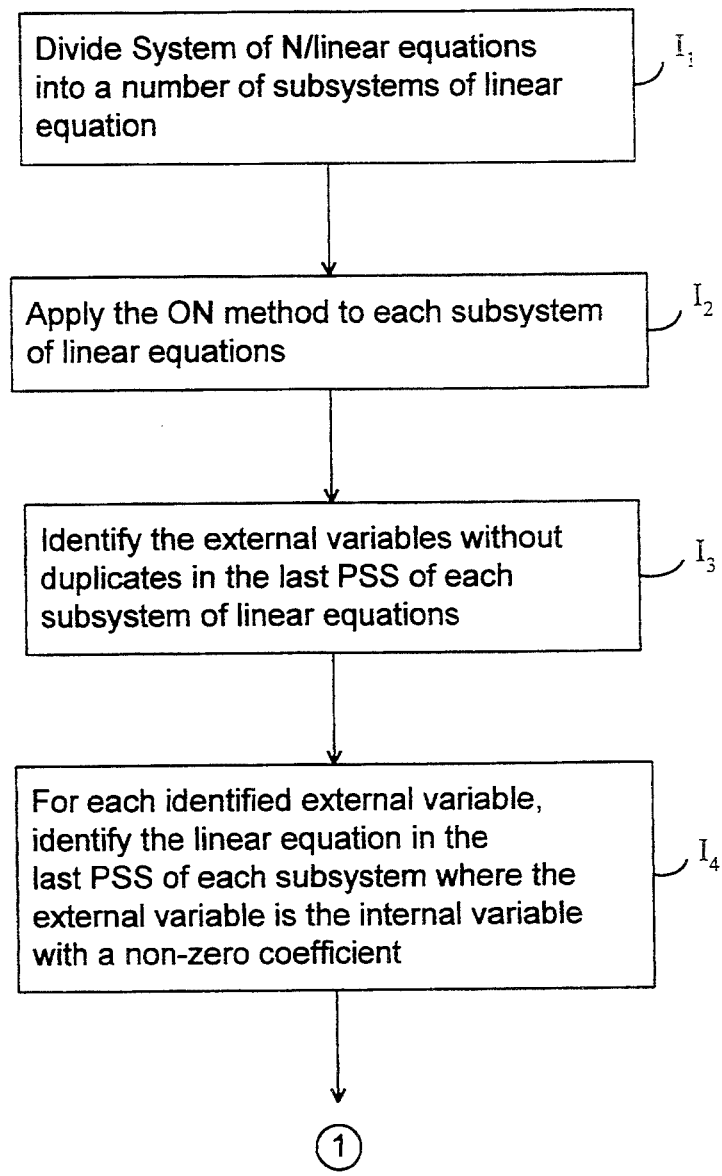
FIGS. 11a and 11b show the steps of the Decomposition Approach to the ON method.
Figure 11B:
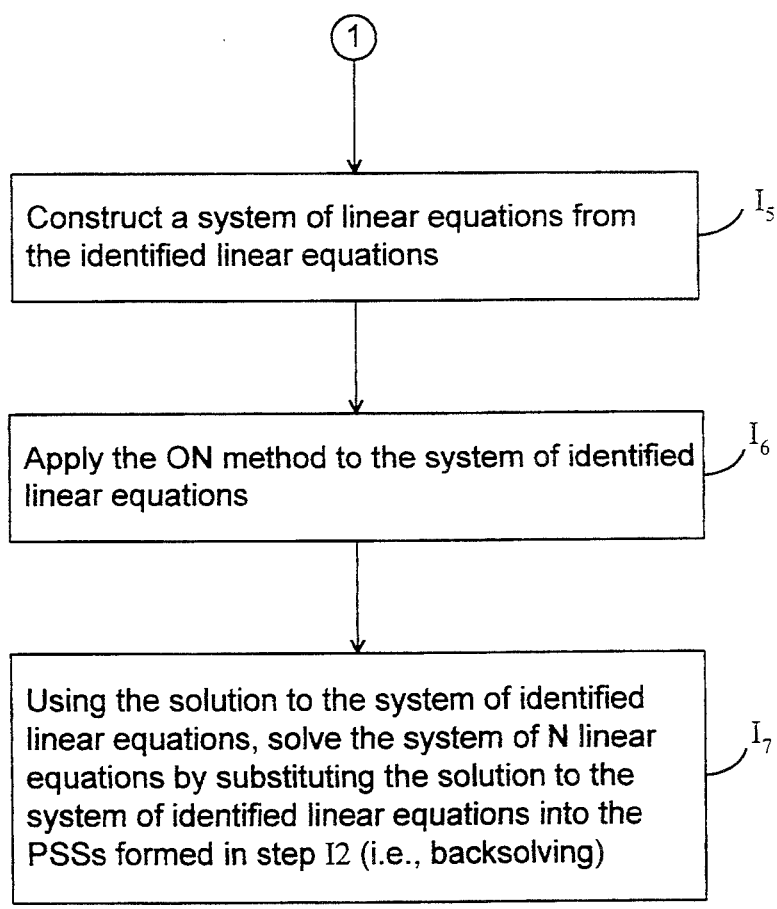

The ON method has two principle applications, control and analysis. When using the ON method as a controller i.e. resource allocation, the preprocessor 100 outputs system control signals 120 to control the physical system 50, i.e. cause the allocation of various resources to the proper place. When using the ON method as an analyzer, i.e. electronic circuit analyzer, the ON method operates to determine the operating condition of a physical system which can then be used by preprocessor 100 or a human user to determine if the physical system is operating within design specifications. FIG. 10 illustrates an apparatus using the ON method in an analysis capacity.

While the ON method can be performed by means of a single general processing computer as shown in FIGS. 9 and 10, i.e., NEC 9800, for a physical system represented by a large number of linear equations more efficient parallel processing apparatuses are shown in FIGS. 13a–13c and 15a–15b which will be discussed below with respect to the Decomposition Approach to the ON method.

Decomposition Approach to the ON Method

Figures 12D, 12E:
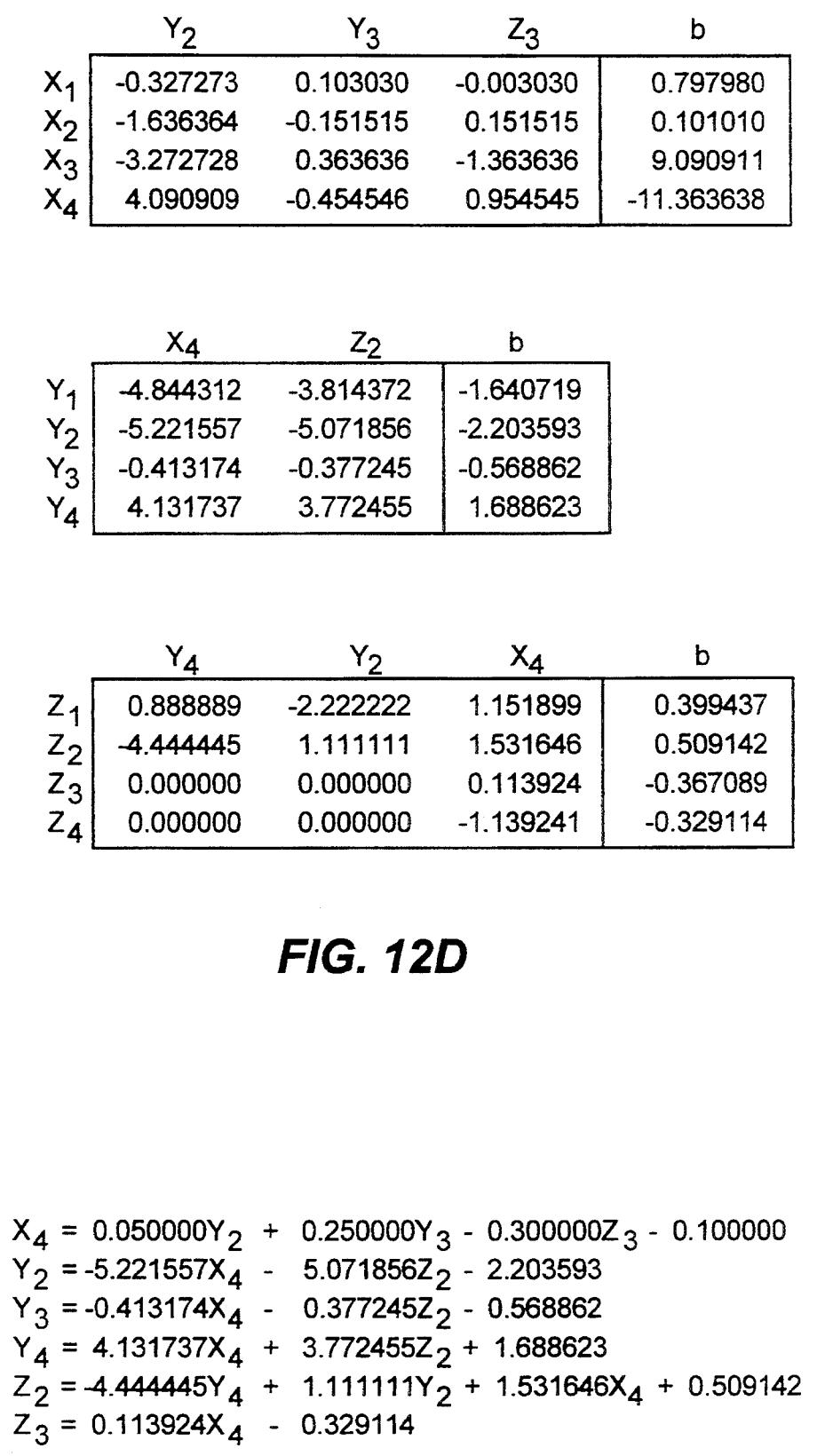

The Decomposition Approach to the ON method will be described with reference to FIGS. 11a–11b and 12a–12g. In step I1 a system of N linear equations is divided into a number subsystems of linear equations. The number of linear equations in each subsystem will be defined by user requirements, such as the number of linear equations, processing time constraints, and other hardware constraints. For purposes of example a system of twelve linear equations has been divided into three subsystems of linear equations of four linear equations each as shown in FIG. 12a. In step 12 the ON method is performed on each of the subsystems of linear equations. The results of the ON method application to subsystem 1 is shown in FIG. 12b. In FIG. 12c is shown an alternative graphical form for expressing a PSS. In FIG. 12c, the variables along the left side of the rectangle are the internal variables of the equations in FIG. 12b. The variables along the top side of the rectangle are the external variables and constant b. The values inside the rectangle represent the coefficients of the external variable and constant for each linear equation.

FIG. 12d shows the results of the ON method applications to subsystems 1–3. In step I3, the external variables without duplicates in the last PSS of each linear equations are identified. These external variables are $x_4$, $y_2$, $Y_3$, $Y_4$, $z_2$, and $z_3$. For each of the identified external variables, the linear equations in the last PSS of each subsystem where the external variable is the internal variable with a non-zero coefficient is identified in step I4. Then in step I5, a second system of linear equations is formed from the identified linear equations in step I4. FIG. 12e shows the linear equations in the last PSS of each subsystem where the above identified external variables of FIG. 12d are the internal variable with a non-zero coefficient. In step I6, the ON method is applied to the second system of linear equations. FIG. 12f shows the results of the ON method application to the second system of linear equations in FIG. 12e. In step I7, the solutions obtained in step I6 are substituted into the PSSs of step I2 to solve the subsystems of linear equations in step I1; and therefore, complete the solution to the system of N linear equation. FIG. 12g shows the solution of the remaining unsolved variables in the three subsystems of linear equations in FIG. 12a. The solution process of step I17 is called backsolving.

Further modifications to the above decomposition approach are capable by one skilled in the art. The system of N linear equations can be ordered as described above prior to division into subsystems. Alternatively, each individual subsystem can be ordered as described above after the system of N linear equations has been divided into subsystems. Upper triangular implementation can also be applied to the solution method to reduce processing time requirements.

Hardware Implementation of the Decomposition Approach

Figure 13A:
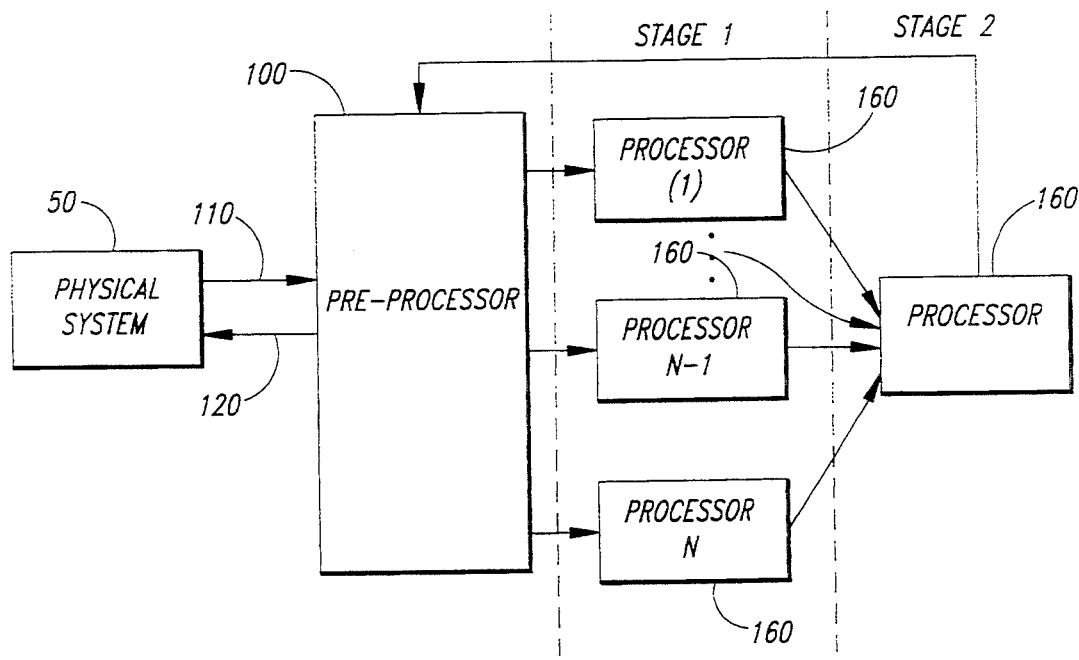
FIGS. 13a-13c are three embodiments of an apparatus for performing the Decomposition Approach to the ON method.
Figure 13B:
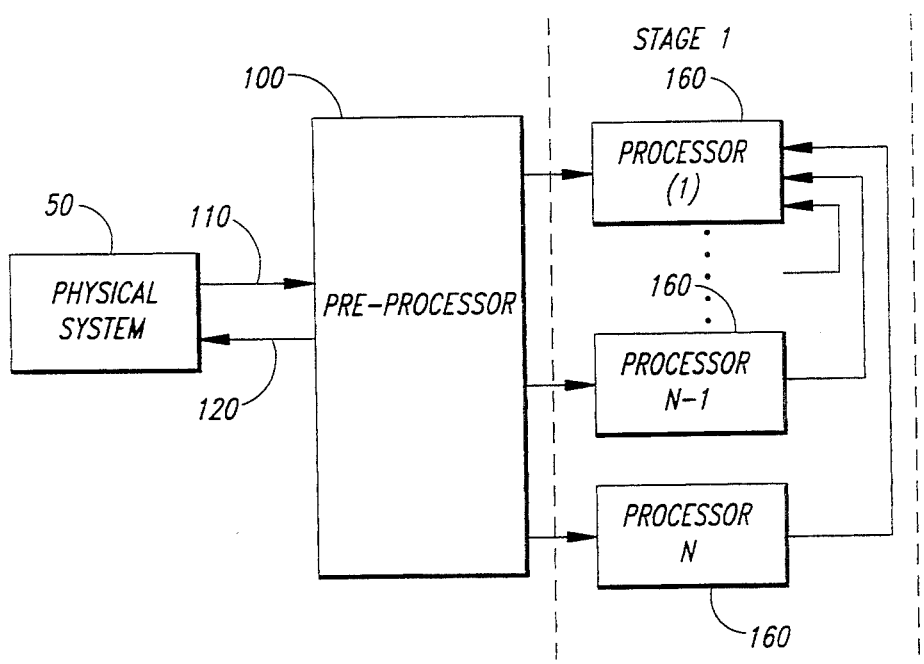
Figure 13C:
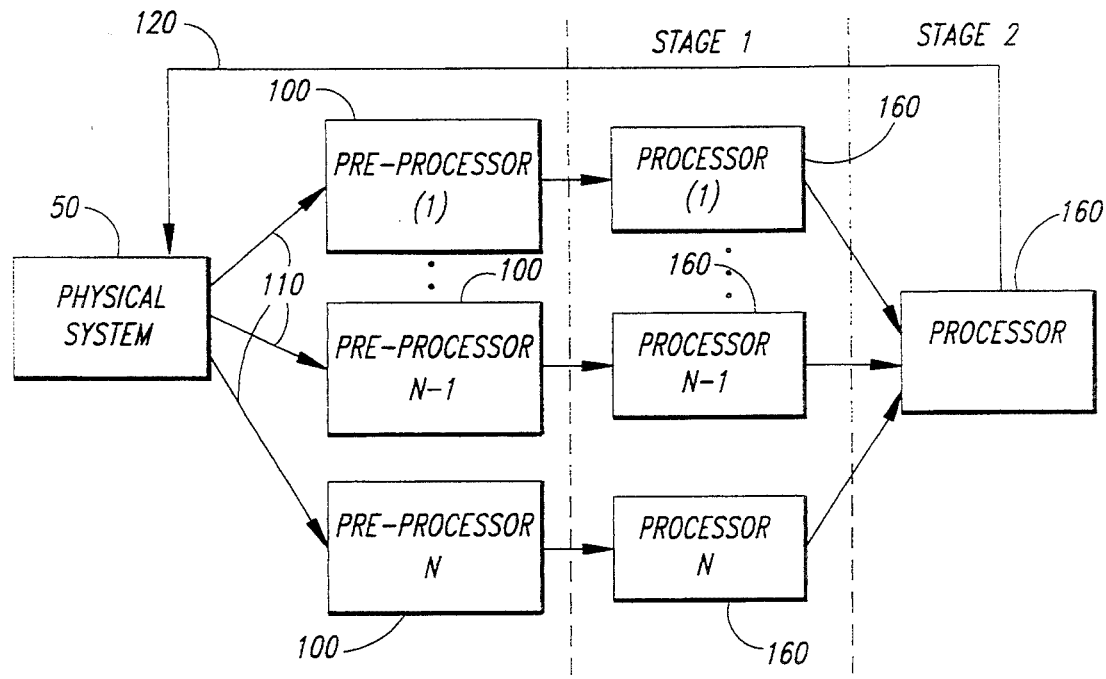

As discussed previously with respect to the Hardware Implementation of the ON method, the hardware implementation of the Decomposition Approach may be accomplished as shown and described above with respect to FIGS. 9 and 10. However, a more desirable approach utilizes the capabilities of parallel processing as shown in FIGS. 13a–13c. Like reference numerals have been used to specify like elements. In FIG. 13c, preprocessor 100 performs similar to that in FIG. 9 with the additional task of dividing the system of linear equations into subsystems of linear equations. A physical system 50 may be such that the physical system is composed of physical subsystems. Instead of a preprocessor, each physical subsystem could output its system state variables directly to stage 1 processors 160. Stage 1 processors 160 apply the ON method to a subsystem of equations assigned by preprocessor 100. The stage 1 processors in communication with stage 2 processor 160 output the identified equations of step I4 to stage 2 processor 160. Stage 2 processor 160 then applies the ON method to the system of identified equations and provides the solution thereto back to the stage 1 processors. The stage 1 processors, using the stage 2 processor 160 solutions, complete the solution to the system of linear equations modeling physical system 50. In FIG. 13a the results of the Decomposition Approach application to the physical system 50 are shown being output from stage 2 processor-160 to preprocessor 100. Preprocessor 100 then outputs the system control signals 120 to the physical system 100 or outputs the operating state condition.

It is within the skill of one skilled in the art to make various modifications to the above embodiment of the present invention. For instance, stage 2 processor 160 could after solving the system of identified linear equations, input the subsystems of equations from each stage 100 processor and solve them.

Further, communication of the solution is not restricted to being output by stage 2 processor 160, but could be supplied to preprocessor 100 by each stage 1 processor 160.

Additionally instead of utilizing a stage 2 processor 160, one of the stage 1 processors 160 could by supplied with the identified equations of step I14 for application of the ON method as shown in FIG. 13b. Furthermore, instead of a single preprocessor 100, use could be made of a preprocessor 100 corresponding to each stage 1 processor 160 as shown in FIG. 13C. The parallel processing approaches of FIGS. 13a–13c can be combined to achieve the best operating performance for a given set of user requirements.

Multi-Stage Decomposition Approach

Figure 14:
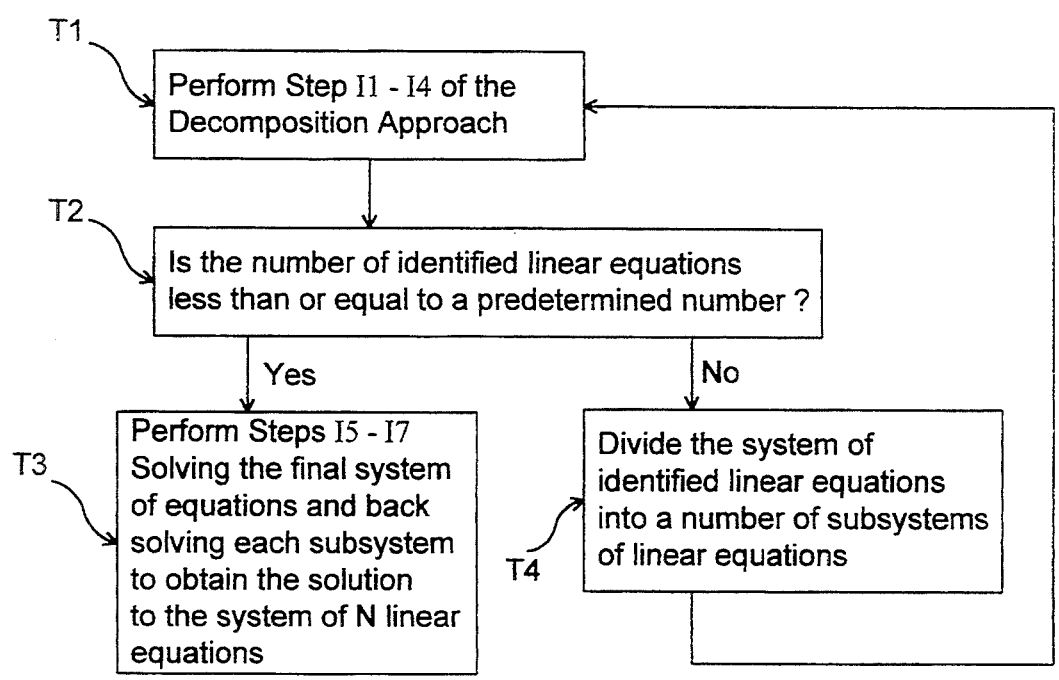

The Decomposition Approach is not limited to a two stage process as described above. The decomposition approach may be multi-staged depending on the number of linear-equations used to represent a physical system, and the speed and memory requirements of the user, i.e., user requirements. FIG. 14 lists the steps of the Multi-stage Decomposition Approach. In step T1, steps I1–I4 of the Decomposition Approach are performed. In step T2, the number of identified linear equations is determined to be less than or equal to a predetermined number set based on user requirements. If the number of identified linear equations is less than or equal to the predetermined number, control proceeds to step T3. In step T3, steps I15–I17 of the Decomposition Approach are performed, wherein the final system of linear equations of the multi-stage application of the ON method is solved and each subsystem created during the Multi-stage Decomposition Approach is backsolved. If the number of identified equations is greater than the predetermined number, then control proceeds to step T4. In step T4, the system of identified linear equations is divided into a number of subsystems of identified equations, less than N, and control proceeds back to step T1 for the subsystems of identified linear equations.

Further modifications to the above multi-stage decomposition approach are capable by one skilled in the art. The system of linear equations or system of identified linear equations can be ordered as described above prior to division into subsystems. Alternatively, each individual subsystem of linear equations or identified linear equations can be ordered as described above after the linear equations have been divided into subsystems.

Hardware Implementation of the Multi-stage Decomposition Approach

Figure 15B:
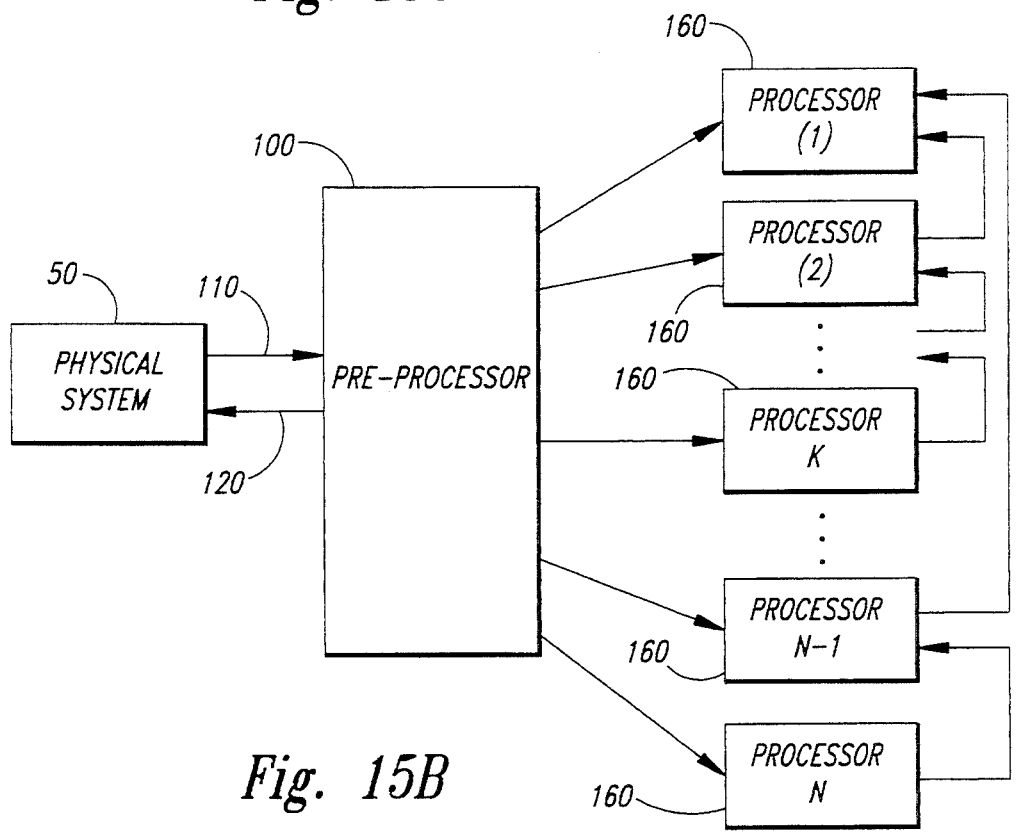
FIGS. 15a-15b are two embodiments of an apparatus for parallel processing using the ON method.
Figure 15A:
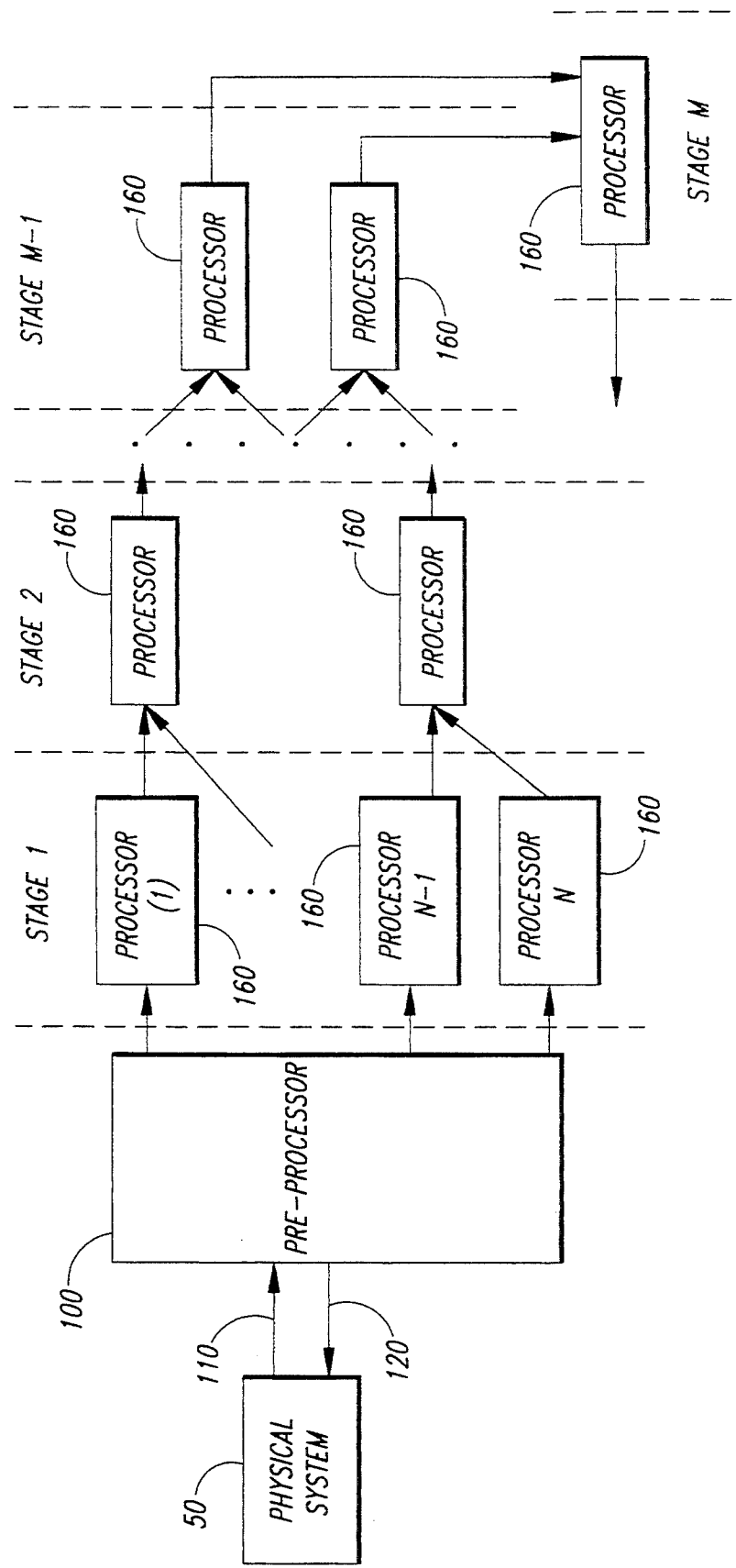

The hardware implementation of the multi-stage decomposition approach may be accomplished as shown and described above with respect to FIGS. 9, 10, and 13a–13c. However, a more desirable approach utilizes the capabilities of multi-stage parallel processing as shown in FIGS. 15a–15b. FIG. 15a is similar to FIG. 13a except multi-stage parallel processing is depicted. FIG. 15b corresponds to FIG. 13b, except that a multiple stages are being processed potentially requiring many more processors 160. It is within the skill of one skilled in the art that a stage of parallel processor is not strictly necessary for each stage of the Decomposition Approach. Instead the number of parallel processing stages is determined by the operating performance and specifications determined by the user. The parallel processing approaches of FIGS. 15a and 15b can be combined to achieve operation performances that best suit user requirements. Furthermore, the modifications discussed above with respect to the decomposition approach hardware implementation equally apply to the Multi-stage Decomposition Approach hardware implementation.

As noted above, while the novel method and apparatus of the invention involves basically two kinds of techniques of PSS on the ON method and of TPS on the decomposition method, three practical examples of the embodiment of the present invention will be described in the following three sections:

The Finite Element Method

First Practical Example for PSS on the ON Method

Figure 16A:
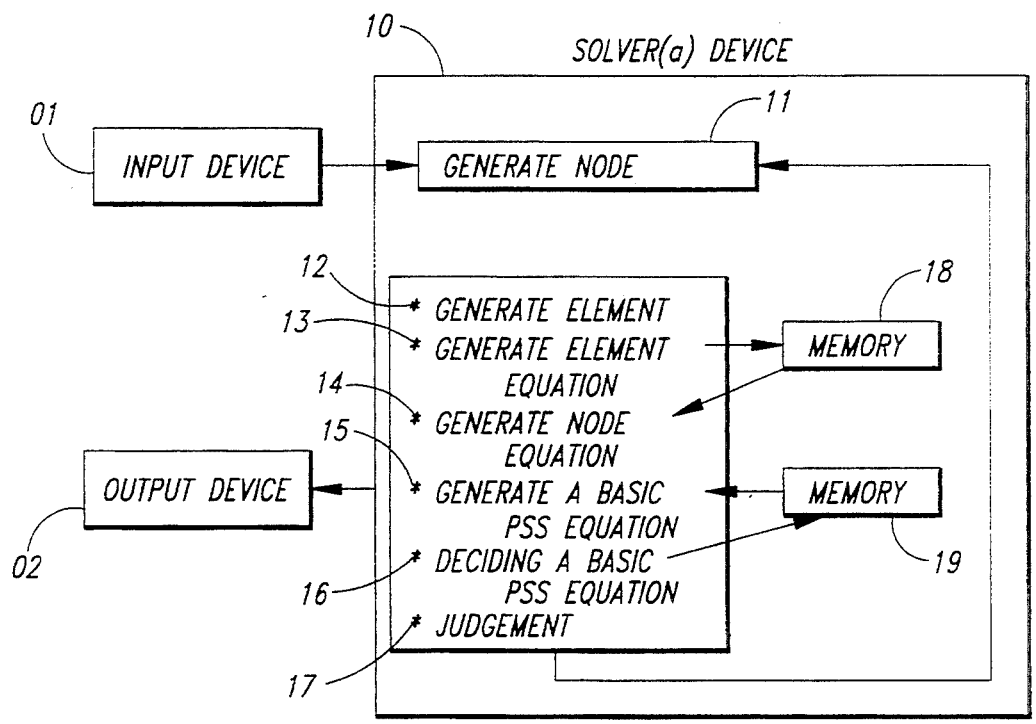
FIG. 16A shows a block diagram of a PSS analyzer which is utilized in accordance with the ON method for a new finite element modeling (NFEM).

An apparatus for PSS on the ON method as the first practical example is shown in FIG. 16A. It has basically three main processing devices, including an input device 01, an output device 02, and a solver(a) device 10. In the apparatus of FIG. 16A, the analytical processing steps for NFEM correspond to the flowchart of FIG. 17A, and the number of the processing block in the apparatus of FIG. 16A corresponds to the number of column (step) in the flowchart of FIG. 17A.

With reference to this flowchart and the processing block of FIG. 16A, the first method and apparatus of the invention for PSS using the ON method will now be described in greater detail below.

As the first step 01, data is input to the input device 01. These data represent physical parameters of an object such as size, shape of structure, quality, characteristics, etc., and boundary condition data. The data also include information defining how to divide a simulation object to meshes or elements as shape and number of elements, etc., at the input data block 01. The next step 11 at generating node block 11 arranges nodes of an object in accordance with input data and selects one node, node$_K$, to be determined. The subscript K represents the number of the node to be determined. The first node is selected as node$_1$ with K being incremented by 1 for each subsequent node. The next step 12, performed by generating element block 12, constructs only those elements relating to the selected node$_1$ before dividing the object in accordance with a design of the data's shape. Then the selected elements are numbered. The next step 13, performed by generating element equation block 13, generates the linear equations which are called "element equations" for all elements generated above. The element equations are based on the partial differential equations, and are generated with a node group constructed by one element. The element equations are then stored in memory block 18. The next step 14, performed by generating nodal equation block 14, generates linear equations for the kth node by selecting the equations with respect to the kth node by selecting the equations with respect to the kth node from the element equations stored in memory block 18. We call this linear equation a "nodal equation." The next step 16 is an assembly of the nodal equations and boundary conditions of the kth node into a basic PSS equation at block 15. The next step 17 is a solution of the basic PSS equation generated in step 16. This equation is stored in memory block 19. The next step 19 is an evaluation of the condition of the kth node at judgment block 19. If the kth node is not the last node, the next step is a return to step 11 in block 11 and a continuation of the process at step 16. If the kth node is the last node, the next step will be to exit solver(a) 10 and enter output block 02 and ending the simulation process.

Thereby, the simulation result can be obtained by the first method and apparatus of the invention shown on the ON method. A more detailed description of each performance will be shown as follows.

(a) Generate the Elements

The first main step of NFEM above is to divide a physical object for simulation into special elements. The shape of these elements may generally have several kinds of structures such as a triangular form, a square form, an isoparametric form in a two-dimensional field, a hexahedral form and a tetrahedral form in a three-dimensional field, etc. The conventional dividing technique for the elements automatically generates the arbitrary shapes of the element with the input data.

Figure 17A:
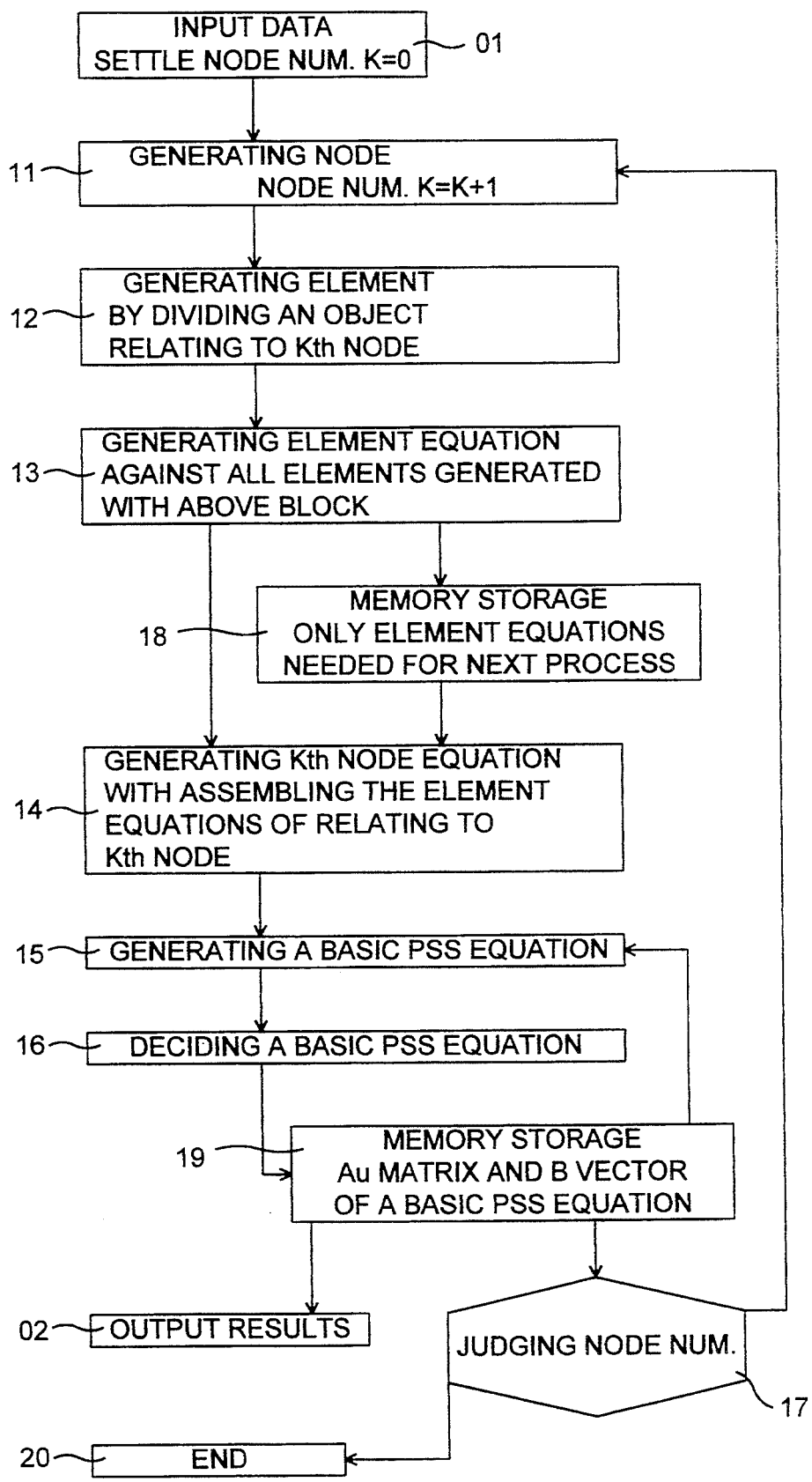
FIG. 17A is a flowchart illustrating an example of the NFEM method for analyzing in accordance with FIG. 16A.
Figure 18:
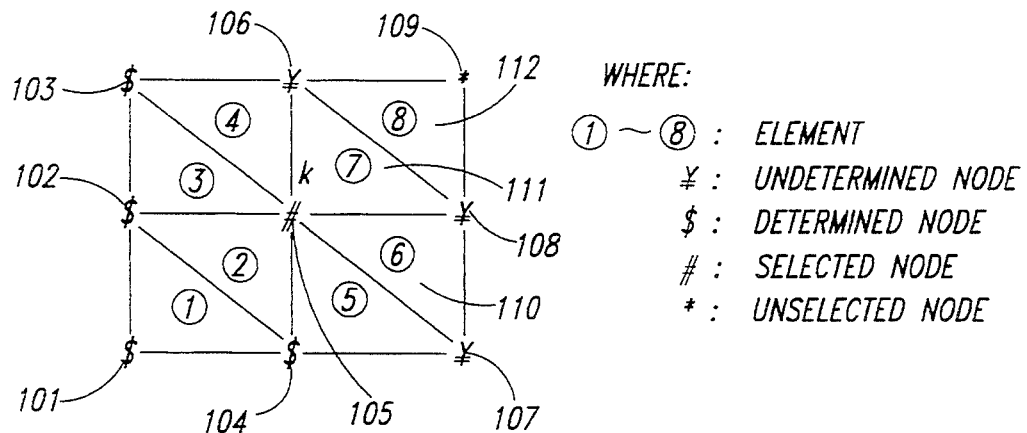
FIG. 18A is an explanatory diagram depicting an example of a region that is divided with triangular elements.
FIG. 18B is an explanatory diagram depicting an example of a region that is divided with triangular elements.

Depicted in FIG. 18 is the simulation object 100 which serves as an example of a region that is divided into triangular elements. This simulation object will be divided into eight elements denoted by the numbers 1 to 8, and will have the nodes numbering from node 101 to node 109. For a selected node from the PSS, the timing of the generating elements is based on a generational rule. For example, if an element includes a kth node before a step, its element will have been generated in an earlier step. If the first node 101 is selected (when the number k equals 1), and element 1 is generated, the next step will follow the flowchart in FIG. 17A from 12 to 19, thereby returning to the performance 11. If the second node 102 is selected, elements 2 and 3 are generated. If the third node 103 is selected, element 4 is generated. If the fourth node 104 is selected, element 5 is generated. If the fifth node 105 (when the number k equals 5) is selected, elements 6 and 7 are generated. If node 106 is selected, element 8 is generated. No further nodes can be generated for any element after nodes 107, 108 and 109 are fixed.

(b) Generate the Element Equation

Figure 19:
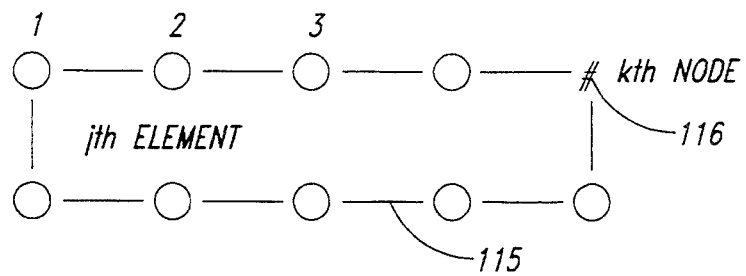
FIG. 19 is an explanatory diagram depicting an example of an element with many nodes.

If a node has two-dimensional coordinates, the variable vector of that node is expressed by two variables. In the example of FIG. 19, a jth element 115 is constructed with an mth number of nodes. The element equations of the jth element 115 are expressed by 2 mth-dimensional simultaneous first order equations as shown in linear equation (5), in which a constant matrix Aqj shows the relation between a forcing variable Bj (which are due to boundary condition on each nodes), and a field variable Xj at given nodes.

$$Aqj \cdot Xj = Bj \qquad (5)$$

The unknown field 2m-vector Xj will have component vectors [x1,x2, . . . ,xk, . . . ,xm]. Each component vector xk will have two scalar variable components [xk1,xk2], and the forcing vector Bj will have a 2mth vector while the constant matrix Aqj will have a rank [2m,2m].

The node equations of an arbitrary kth node 116 (k varies from 1 to m) are only constructed by the node equation (5) and are represented by equation (6).

$$Aqj(k,k) \cdot x_k = - \sum_{h=1,j}^{m} B_h \qquad (6)$$

Aqj(k,k) and Aqj(k,h) have two-dimensional components (k,k) and (k,h) in matrix Aqj and Bj(k,h) has a two-dimensional component (k,h) vector.

For example, the kth node 105 in the object 100 at FIG. 3 is selected (when the number k equals 5). The element equations that are generated in performance 12 for both elements 6 and 7 are generated by using equation (6). Finally, these equations are stored in memory block 18.

(c) Generate the Node Equation

The kth node equation in all element equation groups is generated by selecting all equations g (g=1, ... k, .. . nj) that include the variable at the kth node as shown in the following equation (7).

$$\sum_{g=1}^{nj} Aqj(k,k) \cdot x_k = \sum_{h=1,hj}^{m} \sum_{g=1}^{nj} \{Aqg(k,h) \cdot x_h + Bg(k,h)\} \qquad (7)$$

This equation is rearranged as follows:

$$mAqjk \cdot x_k = Aqk \cdot Xk + Bk \qquad (8)$$

where the unknown vector Xk has component vectors [x1,x2, ... xg, ... xnk]. The subscript nk is the number that depends on the constitution and shape of the element. For example, when the kth node 105 in the object 100 at FIG. 3 is selected (when the number k=5), the element equations including the variable vector xk at node 105 is in the sixth triangular elements 2, 3, 4, 5,6 and 7. These element equations are selected from memory block 18. The kth node equations are rearranged with equation (8).

(d) Assemble the Node Equations into a Basic PSS Equation on the ON Method

The principle for assembling the nodal equations and boundary conditions into a basic PSS equation is made clear in the following detailed description. The basic PSS equation is given in equation (9), where $X_d k$ is an nth order variable vector, $X_u k$ is a kth order unsettled variable vector, Bk is a constant vector, Auk is a constant matrix of maximum rank [m×n].

$$A_d k \cdot X_d k = A_u k \cdot X_u k + Bk \qquad (9)$$

This equation performs for each node on NFEM. This basic PSS equation is used in the determination process. Presented by the linear equation above, the node equations are solved with the ON method previously shown.

The determination technique follows the following procedure: The PSS is obtained by placing the selected decided variable of the first linear equation on the left side of the first basic PSS equation (9), placing the remaining undecided variables and constant of the first node equation on the right side of the first basic PSS equation (9). Next, a kth PSS is obtained for an arbitrary kth linear equation for k=2 to N by placing the selected decided variable of the kth node equation on the left side of the kth basic PSS equation in decided variables vector $X_d k$, placing the undecided variables and constant of the node equation on the right side of the kth basic PSS equation in undecided variables vector $X_d k$ and constant vector Bk, where the notation k on each vector Xd, Xu, B represents the kth order of a determined node number.

Following is an explanation of how to assemble the node equations and boundary conditions into a basic PSS equation.

A basic PSS equation (10) for the k−1th node will be generated as follows.

$$X_d k-1 = Auk-1 \cdot Xuk-1 + Bk-1 \qquad (10)$$

The $A_u k-1$ matrix is constructed with components $[A_u 1, A_u 2, A_u 3, \ldots, A_u(n-k+1)]$, $A_u 1, A_u 2, \ldots, A_u(n-k+1)$ are vectors for the number 1,2, ... ,n−k+1; and Xdk−1 and Xuk−1 are vectors with components $[X_d 1, X_d 2, \ldots, X_d(k-1)]$ and $[X_u k, X_u(k+1), \ldots, X_u n]$, and X1, X2, ... vectors for nodes numbers 1,2, ... ,n. Then, the formula of the node equation (8) is rearranged to the basic PSS node equation (11). In equation (8), Ak2 an Ak1 matrices are constructed with components [a1k,a2k,a3k, ... ,a(k−1)k] and [akk,a(k+1)k,a(k+2)k, ... ,ank]; a1k,a2k- ,a3k, ... ,akk, ... ,ank are 2-dimensional vectors relating to nodes numbers 1,2, ... ,nk. XkL is a vector with components X(n+1),X(n+2), ... ,X(n+m) where X(n+1), X(n+2), ... ,X(n+m) are 2-dimensional vectors for nodes numbers n+1,n+2, ... ,n+m.

$$A_k 2 \cdot X_d k-1 = Ak1 \cdot X_u k-1 + A_u kk \cdot XkL + Bk \qquad (11)$$

The kth nodal equation (11) is assembled with a basic PSS equation (9) and then a kth basic PSS equation (12) is generated.

$$A_d k \cdot X_d k = A_u k \cdot X_u k + Bk \qquad (12)$$

where $$A_d k = \begin{bmatrix} I & A_u 1 \\ Ak2 & akk \end{bmatrix}; A_u k = \begin{bmatrix} A'_u k - 1 & 0 \\ Ak1' & A_u kk \end{bmatrix} \qquad (13)$$

where $A'_u k-1$ and Akl′ matrices are constructed with components $[A_u 2, A_u 3, \ldots, A_u(n-k+1)]$ and [a(k+1)- k,a(k+2)k, ... ,ank] and $X_u k$ and $X_u k$ are vectors with components Xdk−1, Xk and X(k+1), ... ,Xn,XkL,Xk, X(k+1), ... ,Xn,XkL are 2-dimensional vectors relating to the node number k,k+1, ... ,n,kL. I is a unit matrix of klth dimension and akk is a coefficient matrix of Xk in equation (11). If a variable vector Xk is not included in a variable vector $X_u k-1$ but included in a variable vector XkL, then all components in the vector $Au^u l$ have a zero value.

For example, when the kth node 105 in an object 100 at FIG. 3 is selected (when the number k equals 5) is settled, the selected node 105 is noted by a symbol (or mark or sign (#), the decided nodes 101,102,103,104 are noted by a symbol ($), the undecided nodes 106,107,108 are noted by a symbol (\) and the ungenerated node 109 is noted by a symbol (*) on object 100. In the k−1th (104) basic PSS equation (10), a decided variable vector $X_d k-1$ is constructed with a variable x101,x102,x103 for decided nodes 101,102,103 and an undecided variable vector $X_u k-1$ is constructed with a variable of x104,x105,x106,x107 for undecided nodes 104,105,106,107. The node equation (8) is generated by the six triangular elements, that elements include a variable x105 for node 105 in the nodal equation (11). A undecided variable vector $X_u L$ is constructed with a variable x108 for undecided nodes 108 in equation (11). A kth (105) basic PSS equation (12) is generated with assembling a basic PSS equation (11) and node equation (11) by moving a undecided variable x105 into $X_uk-1$ to a determined variable in $X_dk$ of the equation (12).

(e) Determine a basic PSS equation

The determination technique is shown as follows; A kth basic PSS equation (12) is decided by making matrix $A_dk$ in equation (12) to a unit matrix. There is some technique for generating an unit matrix. A unit matrix can be obtained by the very simple process against matrix $A_dk$ that has very few nonzero components. A kth basic PSS equation decided is presented by the following equation (12) and stored in memory block 19 in FIG. 1A.

$$X_dk = A_uk' \cdot X_uk + Bk' \tag{13}$$

(f) Judge the Condition

The judgment whether to continue or not to the next step of the partially solving process is controlled by the following condition; if the kth node is not last node, the next step is to return to the earlier step of generating the elements, if the kth node is last node, then the next step is to end to all performance by outputting the analytical results.

For example, this judgment process in an object 100 at FIG. 18 is continued until all nodes considered have the notation of symbol ($). Indication that the decided process of a node has been completed is made by changing the symbol (\) to the symbol (#), and thereafter changing the symbol (#) to the symbol ($) on the nodes. For example, when the kth node 105 (when the number k equal 5) is settled, the decided nodes 101,102,103,104 have been noted by a symbol ($). A symbol (\) of node 105 is changed to a symbol (#) at the start performance 11 and a symbol (#) of node 105 is changed to a symbol ($) at the end of step 17.

(g) A First Concrete Executive Example

A concrete executive example of a two-dimensional elastic solid model 130 at FIG. 20 will be considered as follows. The solid model 130 may be a wooden post, a steel beam, a cantilevered beam or the like.

This technique was specifically applied to the problem of a two-dimensional elastic system, such as a steel beam, to verify its effectiveness. As shown and described more fully herein with respect to FIGS. 20-22, analysis of a solid beam performed using 22 nodes and 20 triangular elements. Boundary conditions were set for both ends of the solid beam. An external force, F, acts on the solid beam at point A-A'in the direction of the arrows and the other end of the solid beam is fixed to a structure at points B-B'. A system verification was performed on the elastic structure. The results of the steel beam analysis based on this inventive method yielded the same states (strain deformation at each node) as conventional methods, but were more efficient, as described herein. FIGS. 20-22 also illustrate the progression of strain deformation when an external force is propagated through a solid structure such as a steel beam, the steel beam being a type of an elastic structure.

Having summarized FIGS. 20-22, they will now be described in more detail. The width (on x-axis) and vertical (on y-axis) side of an object 130 have 10 and 2 length, respectively, in an (x,y) axis coordinates. The boundary conditions are that the external force F1 along the y-axis direction is pressed on surface side noted A-A' and another side noted B-B' is fixed. The phenomena of the displacement and the stress at an arbitrary place along the object 100 will be analyzed along a flowchart in FIG. 17A and an apparatus as shown at FIG. 16A. This executive example gives the 22 nodes shown by notation N1,N2, . . . ,N21,N22 on the object 130 in FIG. 20. With these nodes, the 20 triangular elements shown by notation 1, 2, . . . ,19, 20 of the object 130 will be divided at step 12. The nodes and the elements are numbered by ordering from a low number node with comparing the width with the vertical of node numbers and that from the side pressed by the external force as shown at FIG. 20. The displacement Xi is noted for the ith node is expressed by two variables components xi, yi.

Each step of PSS is carried out along the flowchart shown in FIG. 17A. At first, a first number of the node N1 on object 130 is selected at step 11, and only one element (a) for N1 node is constructed by settling another node N2 and N3 at step 12. An element equation of the element (a) is generated at step 13 and stored in memory block 18. A node equation is formed by only using an element equation of the element (a) at step 14, etc. The assembly of the next step 15 is not needed because no other equations exist. At last processing step of the flowchart in FIG. 11A, a basic PSS equation (14) for node N1 is obtained. Xi is a displacement variable vector having two variable components xi,yi for the Ni node (the ith has the number value of 1, 2, 3).

$$X_d1 = A_u1 \cdot X_u1 + B1 \tag{14}$$

where the determined vector $X_d1$ equals the vector X1 that has the components [xl, yl], and the undetermined vector $X_u1$ is the component vectors [X2, X3] that equals the valuable components $[x2,y2,x3,y3]^T$. The constant matrix $A_u1$ and the constant vector B1 are expressed in the follow matrices:

$$A_ui = \begin{bmatrix} 0.300416 & -0.24033 & 0.699584 & 0.24033 \\ 0.101130 & 0.919096 & -0.101130 & 0.080904 \end{bmatrix} \tag{15}$$

$$B1 = [-0.000010, 0.000018]^T$$

The component values of $A_y1$ and B1 are presented in table form in FIG. 21A for simplicity.

If the node N1 is the last node, the process ends, as a basic PSS equation is produced. The result for node 2 is shown by a matrix A2 and a vector B2 in FIG. 21B. The same steps as presented in the flowchart are followed for each node from N3 to N21. The constant matrix and vector values result for the representative nodes N3,N4,N12 are shown in FIG. 21C, FIG. 21D, FIG. 21E, respectively. At the last node N22, a basic PSS equation is represent by following equation (16). The matrix $A_u22$ is a zero matrix and the constant vector B22 is shown in FIG. 21F.

$$, X_d22 = B22 \tag{16}$$

At this point, node N22 is identified as the last node. The processor ends the computation of values and outputs the analytical results giving the component values of a vector B22 containing the displacement value of each nodes.

(h) Evaluation of Results

The conventional Cholesky-band matrix method in FEM for the same elastic solid model 130 presented in FIG. 20 has been performed. The result of the conventional method is shown in FIG. 6G. The results shown in FIG. 6F of the inventive approach and the results in FIG. 6G of the prior art approach are consistent with each other, yet the inventive approach is a more efficient analysis, using less computer processing time, and less memory. Importantly, the inventive approach permits an analysis of the parts and then the combining into analysis of the whole, an approach that differs from the prior art.

For the evaluation described above on the PSS, the memory contents of the matrix $A_u$ and the vector B only requires a maximum rank of [5×44]. The memory requirements of the Cholesky-band matrix method are twice those of the above method. If undecided variable vector $X_u k$ (where k equals 1 to 21) makes compulsory the zero elements vector, the equation (9) becomes the following equation (17).

$$, X_d k = Bk \qquad (14)$$

This constant vector Bk that equals the selected variable vector $X_d k$ shows the displacement effect of the external force F1 on the selected node. The results of each partially solving process are shown by the representative drawing of FIG. 22. Each of the overlaid figures shows the propagating states of the displacement generated by that external force of the side A–A' at each node. The results of FIG. 22 are determined more quickly with the inventive method than is achievable with conventional methods because conventional methods will need 22 iterations to process the solution.

The present invention thus provides a simple and efficient method and apparatus which requires a small amount of memory and decreased processing time in analyzing NFEM. The present invention of the ON method can also apply to other numerical analyses of physical phenomena, including produced or physical systems as the thermal conductance analysis, heat transfer analysis, fluid flow analysis, and electrical or magnetic field analysis, as well as elastic structures analysis. The method presents a most powerful new FEM and can be employed in computer-aided engineering tools.

At this point, a summary of the process used on the beam 130 is instructive. This summary follows with reference to FIG. 21A. The processing which takes place at each step will be explained using the simplified block diagram of FIG. 21A. In this figure, the symbols ①  to ⑦ represent elements, ○ are nodes of undetermined variables, ● are nodes of determined variables, ◉ is the node whose state is currently being determined, and X indicates a uncataloged variable.

Step(0-1) Configure nodes. The node configuration for analysis objects will differ depending on the form of the analysis object and boundary situation. Here, they have already been configured (as indicated by the numbers 1 to 9 in FIG.1).

Step (0-2) Form element partitions.

Make a preliminary decision how to handle the partitioning of elements. The explanation here is not for a specific structure, but is given for the general case.

Step (0-3) Assign node numbers.

Assign node numbers in sequence starting at the node where the analysis will begin and continuing in a predetermined order. How this node order is assigned is important from the standpoint of the analysis. Here, for the sake of convenience, they have been assigned topologically according to the structure in FIG. 18.

Step (1) Select a node.

The analysis proceeds while executing the processes described below in node order sequence beginning with node No. 1. Here, we will focus on the jth (5th) node.

Step (2) Generate new elements

Node j of FIG. 1 has been chosen. The new elements which will be generated from this node are ⑤ and ⑥, and they are mapped as solid lines in FIG. 21. To this, node 8 is introduced as a new variable.

Step (3) Prepare element equations.

Here, element equations are generated for each new element (⑤ and ⑥) generated by the new mapping.

Step (4) Prepare node equations

Node j of FIG. 21 is connected to five elements—②, ③, ④, ⑤ and ⑥. Accordingly, all the equations relating to node j (5) are extracted from the element equations derived from these elements, and adding all these together, a single node equation is prepared.

Step (5) Combine into determined equations.

Here, the node equations obtained above are rewritten using the ON Method form. This rewriting is performed in the following manner. In FIG. 1, the ● symbols are already determined and the ○ symbols are of undetermined state. So, distribute variables corresponding to the ○ symbols to the $X_u$ term and variables corresponding to the ● symbols to $X_d$.

Step (6) Determine ON equations

Install the node equations of the ON Method form into the 0N Method fundamental expression. This is represented by the fundamental expression form (1). Use the ON Method to process this form so that it takes the form of expression (3).

Step (0-4) End determination

When all nodes with a ○ symbol become a ● symbol, the state of the whole system will be determined.

Figure 16B:
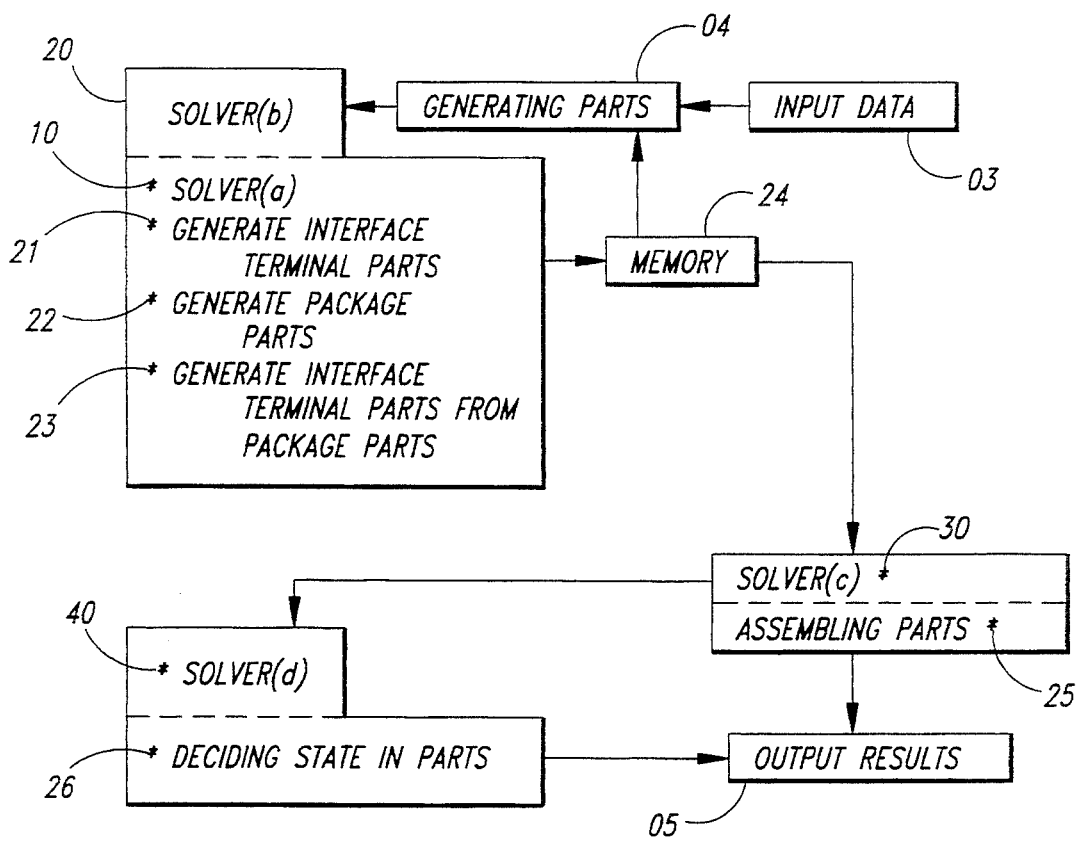
FIG. 16B shows a block diagram of an analyzer of TPS for NFEM in sequence processing.

(2) Second Practical Example For TPS On Decomposition Method In Sequence Processing An apparatus for TPS on decomposition method in sequence processing as second practical example is shown in FIG. 16B. Its apparatus has basically seven main processing devices including an input device 03, an output device 05, a generating parts device, a solver(b) device 20, a solver(c) device 30, a solver(d) device 40 and a memory device 24. In the apparatus of FIG. 16B, the analysis processing of the NFEM executes with reference to the flowchart of FIG. 17B, and the number of the processing block in the apparatus of FIG. 16B corresponds to the number of the column (step) in the flowchart of FIG. 17B.

Figure 17B:
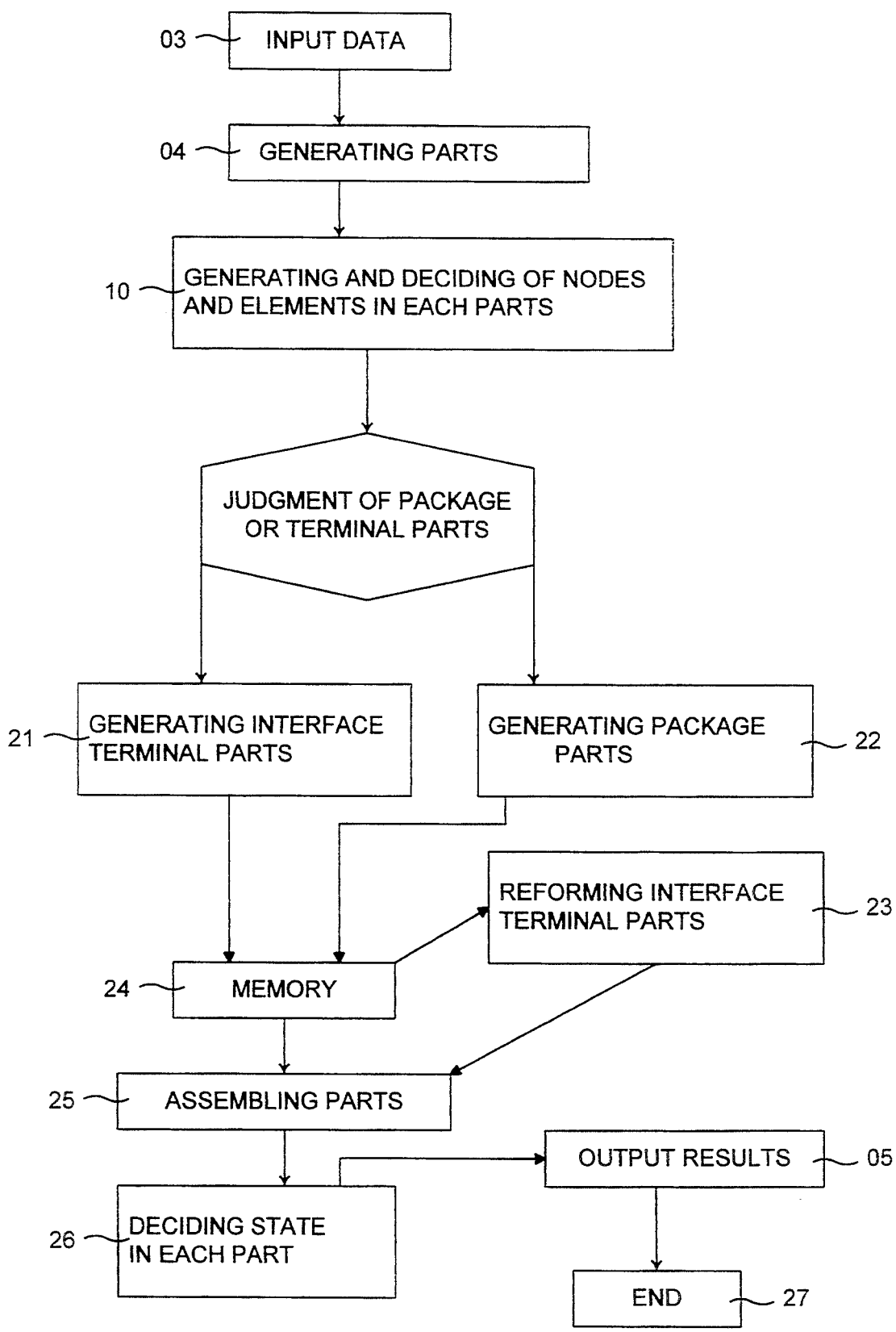
FIG. 17B is a flowchart illustrating an example of the NFEM method for analyzing in accordance with FIG. 16B.

With reference to the flowchart of FIG. 17B and the block diagram of FIG. 16B, the second method and apparatus of the invention for TPS on decomposition method will now described in greater detail.

The first step 03 at the input data block 03 starts to input the data that are added to the information data of how to the number and shape for decomposing a simulation object to subsystems called "parts" into the input data block 01 in FIG. 16A.

The next step 04 at generating parts block 04 decomposes a simulation object to a number of parts, and its parts are numbered as the kth part (where number of k is 1 to m; m shows a total number decomposed ).

The next step 10 determines all state of "internal nodes" which include "internal terminal nodes" in the kth part (where k numbers from 1 to m) by carrying out the all steps in the solver(a) device 10 shown in FIG. 16A.

In solver(a) 10, the step 11 arranges the nodes in a part, selects one node to be calculated and numbers the node. Step 12 generates only the equations relating to the selected ith node (where the ith number is all number of node in one part) and numbers its elements. Step 13 generates the element equations for all elements generated and stores these element equations in memory 18. Step 14 generates the node equations in respect of the ith node by using the element equations. Step 15 assembles the nodal equations of the ith node into a basic PSS equation.

Step 15 determines a basic PSS equation that is stored in memory block 19 in FIG. 16A. Step 17 judges the proceeding condition for the job by determining if the node is the last node to be evaluated, as described earlier.

Step 21 at the generating interface terminal part block 21 in FIG. 16B produces the "interface terminal" for each part by making clear the relation between the internal terminal variables and the external terminal variables. If there are similar groups of interface terminal parts, evaluated by examining whether each of the parts has constructive similarity at step 04, step 22 at the generating package block 22 produces a package for a similar part group. All of these parts or packages are stored in a memory 24. If all parts or packages in a simulation object have been completely produced, step 25 at assembling parts block 25 assembly by connecting each the interface terminal of the part to other interface terminal of the part or the package for recovering an original object. The assembling process can determine the state of the interface terminal variable by using the PSS and by processing using a backsolving technique. The next step 26 at solver(d) block 26 decides the state of the internal variables in the parts by substituting the external terminal valuables to the basic PSS equations in each part. The next step at end block 27 enters to output block 05 and ends the simulation process. Thereby, the simulation result can be obtained by the second method and apparatus on the TPS of the invention shown here.

A more detailed description of each step will be shown as follows.

(a) Generating A Part

Figure 23:
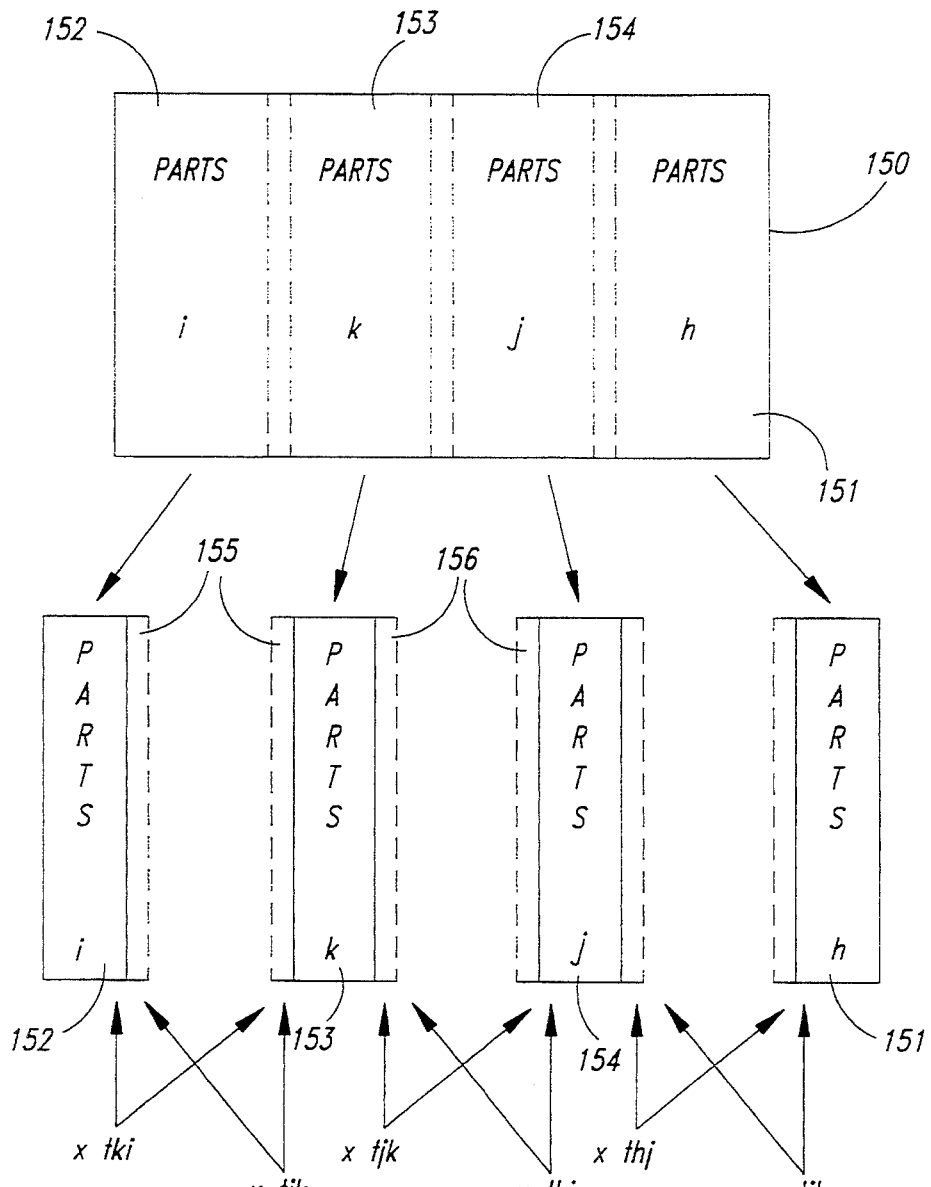
FIG. 23 is an explanatory diagram depicting a state of the object of FIG. 20 when it is analyzed with NFEM are decomposed to some parts with interface terminals.

At step 04, a simulation object is decomposed to a number of parts. There are a number of structures which can be used, such as two-dimensional quadratic structures or three-dimensional structures, etc., on the simulation object. But, for the simple example, a two-dimensional quadratic object model 150 at FIG. 23 is presented in the following discussion. As shown in FIG. 23, an object has been decomposed to four parts (subsystems) that have the arbitral size of the interface terminals. For example, the kth part 153 has two interface terminals 155, 156. For instance, the interface terminal 155 connects between the ith part 152 and the kth part 153. For example, as the kth part 160 that corresponds with part 153 in FIG. 23 is shown in more detail in FIG. 24A. One part is constructed with three related node groups. One group is an "internal node" group 161 that is isolated from other parts. The state of the nodes of internal node group 161 are shown by the variable vector Xok. The second group is an "internal terminal node" group 162 that directly relates to other parts and connects to the interface terminal node 155. The state of the nodes of the internal terminal node group 162 are shown by the variable vector Xtki. The third group is a "external terminal node" group 163 that relates to internal terminal nodes groups of other parts. The state of the nodes of the external node group 163 are shown by the variable vector Xtik.

One of the efficient treatments requires the separation of the kth interface terminal part Pk 160 into a terminal part Tcik 165 and the kth part Pko without an interface terminal as shown in FIG. 9B eliminating repetition of calculations already performed by the same interface terminal relating to other parts.

In NFEM analysis, the interface terminal 155 or 163 is constructed by two kinds of node groups, the internal terminal nodes 163 and the external terminal nodes 162 and one group of elements.

(b) Generating An Interface Terminal Part

Figure 24A:
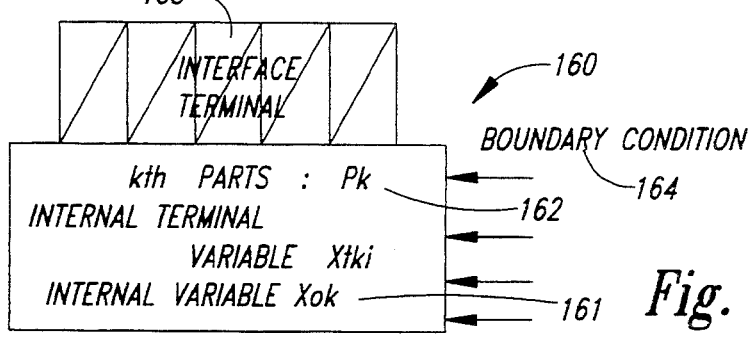
FIG. 24A is a schematic diagram depicting a Kth interface of terminal parts Tk for the physical object of FIG. 20.

If the kth part 160 having the interface terminal 163 as shown in FIG. 24A is constituted by the elements, the state of this kth part 160 is determined by carrying out the PSS on solver(a) 10 in FIG. 16B and can be expressed with the following basic PSS equation (18).

$$X_d k = A_u kp \cdot X_u k + Bk \tag{18}$$

where the decided vector $X_d k$ is constituted by two kinds of components, the internal variable vector Xok and the internal terminal variable vector Xtkl (the number l is all other connective parts), the undecided vector $X_u k$ is constituted by one kind of component to an external terminal variable vector Xtlk for each kth part, and Bk is a constant vector based on the boundary condition at all nodes of the kth part.

The internal terminal vector Xtkl (the number l is all other connective parts) is selected from a determined variable vector Xdk and in equation (18) is reformed as the equation (19).

$$X_d tk = A_u tk \cdot X_u tk + Btk \tag{19}$$

where $X_d tk = [Xtkl; l=1, \ldots ,m]T$ and $X_u tk = [Xtlk; l=1, \ldots ,m]T$.

The relation of the external and internal terminal variable vectors in this equation (19) generates an interface terminal part. The detailed expression will be shown by using the kth part in a simulation object 150 in FIG. 23. For the kth part 153 or 163, the determined vector Xdk is constituted by the components of Xok, Xtki and Xtkj. Xok 161 in FIG. 24A is the internal variable vector, Xtki 162 is the internal terminal variable vector, Xtkj 171 is the internal terminal variable vector for ith part 154. The undetermined vector Xuk is constituted by the two kind components of Xtlk 163, Xtjk 172 shown in FIG. 25; where Xtlk and Xtjk are the external terminal variable vectors for connecting each ith and jth part. The component vectors Xtki and Xtkj in the determined variable vector $X_d k$ in equation (18) are selected and are reformed as the equation (20).

$$, X_d tk = A_u tik \cdot Xtlk + A_u tjk \cdot Xtjk + Bk \tag{20}$$

where $X_d tk$ is constituted by Xtki and Xtkj.

Figure 25:
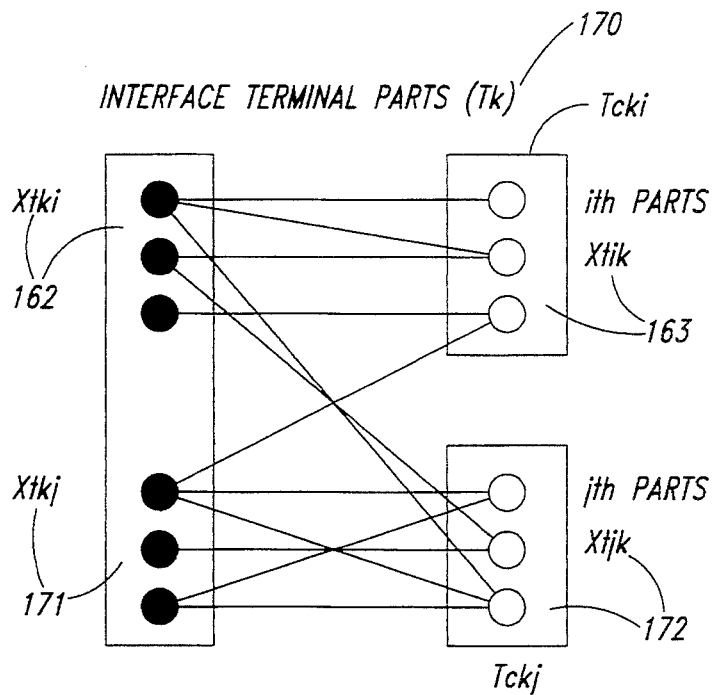
FIG. 25 illustrates the embodiment of Kth interface terminal parts Tk.

The relation of the internal terminal variable vectors (Xtlk, Xtjk), and the external terminal vectors (Xtki, Xtkj) in this equation (20) generate the interface terminal part 170 in FIG. 25.

(c) Generate A Package There are many objects, structures and systems that are produced by assembling parts of constructive similarity. For example, a house is built by using many similar posts and walls. These posts and walls have been constructed as discrete packages to simplify assembly. It is necessary to make these packages similar. The package approach described herein not only reduces processing times but also memory contents, and is preserved in the memory as a public package which can be used for later processing.

In generating the package, if the parts of similar construction exist for other interface terminal parts, new pth adjustable nodes are made to adjust the difference in construction and boundary conditions in all similar parts. Then, the variable vectors Xup and Xcp in respect of adjustable nodes are generated and combined with the common similar part structures. The state of the package is expressed by equation (21) in remaking equation (19)

$$X_{dP} = A_{uP} \cdot X_{utp} + C_{cp} \cdot X_{cp} + C_b \cdot X_{bp} \quad (21)$$

where $X_{dP} = [Xop, Xtp]T$.

Figure 26:
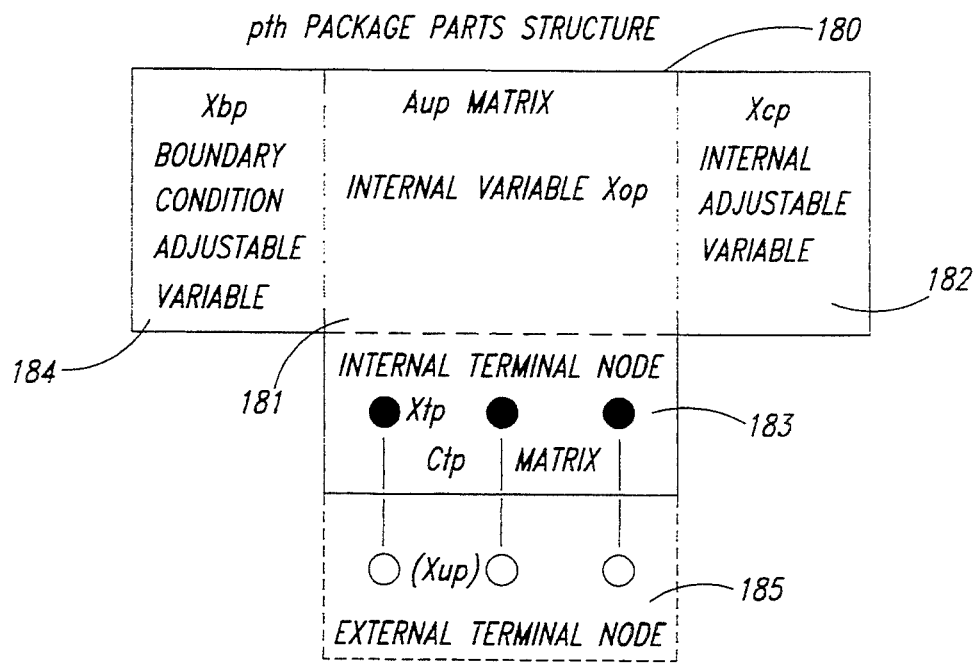
FIG. 26 illustrates the embodiment of Pth package structure.

The pth package is shown by the basic package structure 180 in FIG. 26. Its equation (21) has new variable vectors Xop, Xcp, Xbp and Xtp which are the internal adjustable variable vector 102, the internal terminal adjustable variable vector 183, the boundary condition adjustable variable vector 184 and the external terminal adjustable variable vector 185, respectively.

(d) Generate The Parts From A Package

If the packages or parts have been completely produced in a simulation object, before assembling each part, all parts that may be included in a package and needed to assemble in the simulation object are produced by setting adjustable variables Xop, Xcp, $X_u$tp in the equation (21) to fixed values. Then, the terminal parts are given by equation (22) in reforming the equation (21).

$$X_{dtk} = A_{upk} \cdot X_{utpk} + (C_{cpk} \cdot X_{cpk} + C_{bpk} \cdot b_k) = A_{utk} \cdot X_{tk} + B_{tk} \quad (22)$$

In an example model presented in FIGS. 10 and 11, the kth interface terminal part 170 in FIG. 25 is able to be generated from package 180 in FIG. 26.

(e) Assemble The Parts

For assembly of parts, we show again the state of the jth part Pj with following equation (23) by using the same PSS techniques as in equation (18).

$$X_{dj} = A_{ujp} \cdot X_{uj} + Bj \quad (23)$$

where an undecided vector $X_{uj}$ has the component vector Xtkj, Xthj and a decided vector Xdj has the component vector Xoj, Xtjk, Xtjh.

Figure 27:
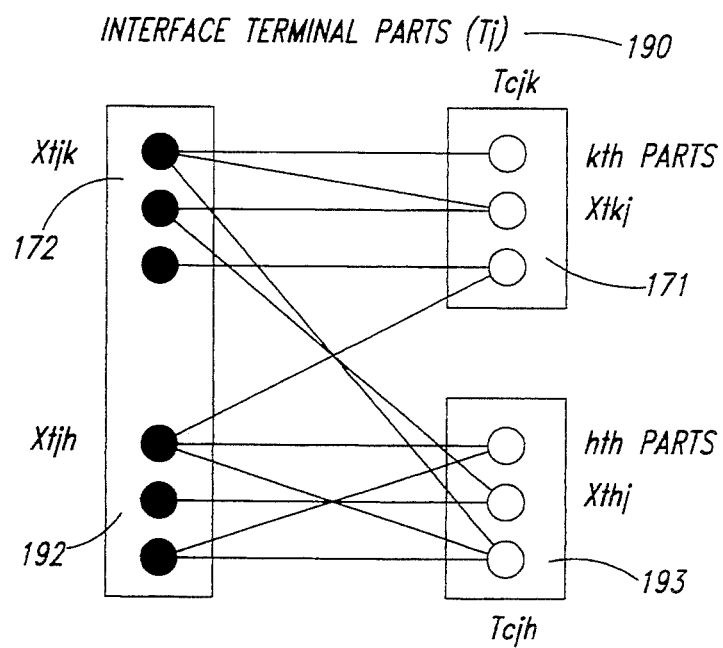
FIG. 27 illustrates the embodiment of Jth interface terminal parts

The state of the ith interface terminal part Tj 190 in FIG. 27 is shown with the equation (24) by arranging the equation (23) as well as equation (20).

$$X_{dtj} = A_{utj} \cdot X_{utj} + Btj = A_{utjk} \cdot Xtkj + A_{utjk} \cdot Xthj + Bj \quad (24)$$

where the decided vector $X_d$tj has the component vector Xtjk, Xtjh.

The assembly of the kth parts Tk 170 in FIG. 25 and the jth parts Tj 190 in FIG. 27 means that the connection between equation (20) and equation (24) is able to produce the following equation (25) by using the basic PSS equation and generating a new part Pkj:

$$A_{dtkj} \cdot X_{dtkj} = A_{utkj} \cdot X_{utkj} + B_{tkj} \quad (25)$$

where the determined vector $X_d$kjt, the undetermined variable vector $X_u$kjt, the constant vector Btkj, the constant matrix $A_d$tkj and $A_u$tkj are constructed by connecting the equation (20) and (24) as follows:

$$X_{dkjt} = Xtki, Xtkj, Xtjk, Xtjh \ IT,$$

$$X_{ukjt} = [Xtik, Xtjh]T$$

$$B_{tkj} = [Btk, Btj]T$$

$$A_{dtkj} = \begin{bmatrix} I & A_utkj \\ A_utjk & I \end{bmatrix}, A_utkj = \begin{bmatrix} A_utki & 0 \\ 0 & A_utjh \end{bmatrix}$$

The terminal variable vectors Xtjk and Xtkj in this equation (25) are completely decided by making matrix $A_d$tkj a unit matrix by using the ON method. With reference to FIG. 25 and FIG. 27, the state of the new part is generated with the following equation (26) by adjusting the vectors Xtkj 171 and Xtjk 172 from the basic PSS equation (25). The new part is shown with the kjth interface terminal part Tkj 191 in FIG. 13.

$$X_{dtkj} = A_utkj' \cdot X_utkj + Btkj' \quad (23)$$

where the undecided variable vector $X_u$tkj is the same as in equation (25). The decided variable vector $X_d$tki is shown as follows:

$$X_dtkj = [Xtki, Xtjh]T$$

Figure 28:
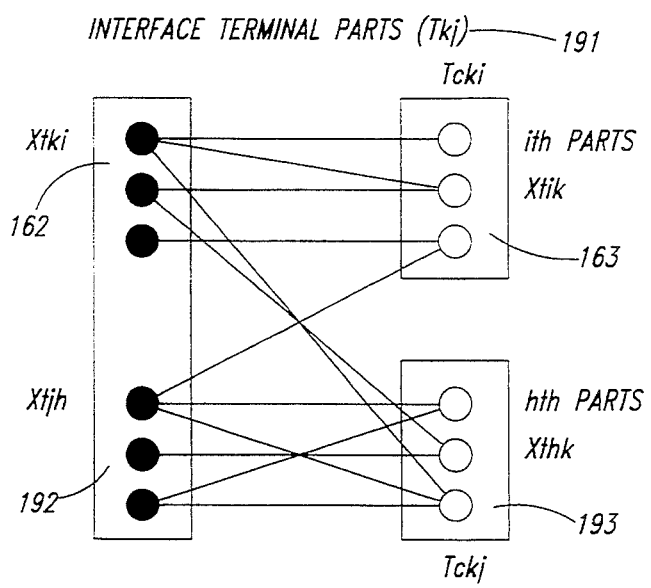
FIG. 28 illustrates the state of a new interface terminal parts Tkj by connecting Jth and Kth interface terminal parts.

The kjth part 191 in FIG. 28 is the same construction as compared to one of the parts 170 in FIG. 25 or of the parts 190 in FIG. 27. The assembling of parts is that the external terminal Xtjk 172 and the internal terminal Xtkj 171 in the kth part Tk 170 in FIG. 25 are connected to each other with the internal terminal Xtkj 172 and the external terminal Xtjk 171 on the jth parts Tj 190 of FIG. 27. The result of assembling produces new parts Pkj 191 shown in FIG. 28. These connected terminals can been included in the internal variable of a part Pkj 191.

Figure 29:
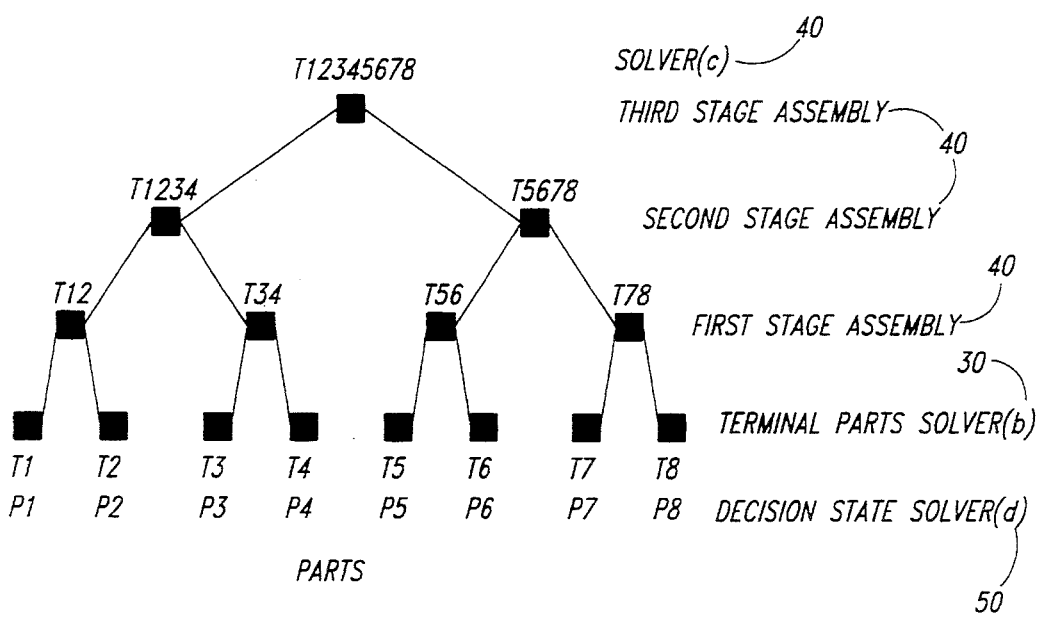
FIG. 29 is a schematic diagram for one way of assembling structure for hierarchical parallel processing for many parts.

There are many ways of assembling the interface terminal parts. But generally, the sequential assembling where a newly constituted part is generated based on combining the terminals of the same parts as sequence processing, may be basically used as a practical example for a computer system. For example, in a parallel processing computer system, this assembling of parts can be processed in hierarchical parallel processing as shown with a hierarchy structural illustration in FIG. 29. This method is called the "Hierarchical Assembly Method" and is given by the detailed description below.

(f) Determine The Internal Variable Vector In Each Part

If all parts are built up as one system by freely connecting the interface terminals of each of the parts, all external variable states are decided by substituting the value of the decided external variable vector into equation (24) and equation (19). The solution of the first system of the linear equations (18) can be determined through the backsolving technique by substituting the decided external vectors into each equation (18) of each part.

(g) A Second Concrete Executive Example

For better comprehension, a second concrete executive example using the same two-dimensional elastic solid body model 130 of FIG. 20 will be analyzed. The phenomena of the displacement and the stress at any arbitrary place on model 130 will analyzed following the flowchart of FIG. 17B and using the apparatus of FIG. 16B.

Figure 30:
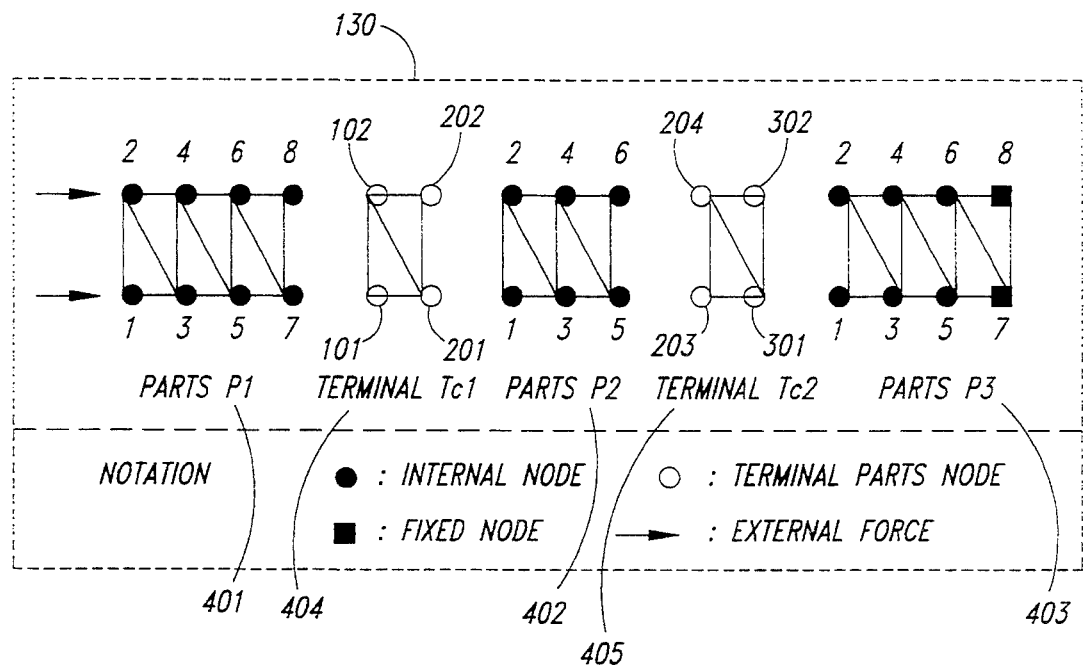
FIG. 30 is an explanatory diagram depicting an example that a same object shown in FIG. 20 is decomposed by three parts and two interface terminal parts, for demonstrating (evaluation) in accordance with the process flow shown in FIG. 17B throughout using an apparatus shown in FIG. 1B.
Figure 36:
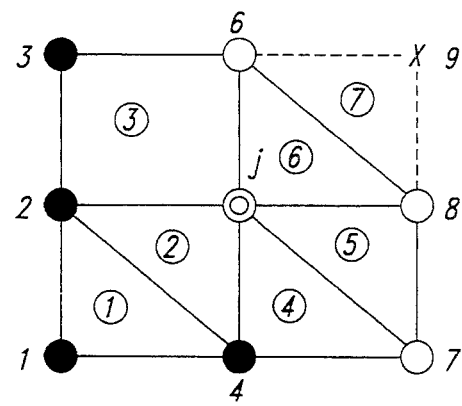
FIG. 36 is a diagrammatic representation presenting relationships between nodes.

A simulation object 130 is decomposed into three parts, parts 401, 402, 403, and two interface parts 404, 405 as shown in FIG. 30. As each part includes the interface terminal nodes, the relations of the internal and external node at each parts T1, T2 and T3 are given by a contrasted table of FIG. 31. If one node has two-dimensional coordinates variables (x,y) and the number of the terminal nodes in terminal part 404 shows the corresponding number of the terminal variables, its vectors in equation (19) are expressed as followings:

Xt12=Xt21=[x101,y101,x102,y102,x201,y201,x202,y202]T

Xt23=Xt32=[x203,y203,x204,y204,x301,y301,x302,y302]T

Figure 24B:
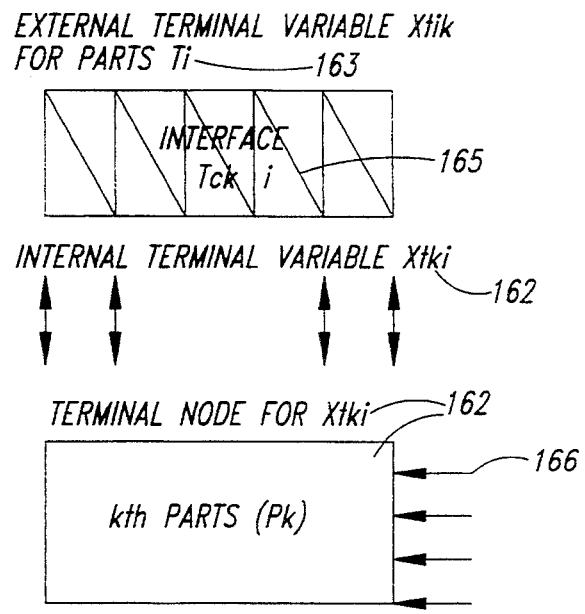
FIG. 24B is a schematic diagram depicting a Kth parts Pk and terminal parts Tck with separating Kth interface terminal pans Tk for the physical object of FIG. 20.

Each part of the interface terminal has been generated by using solver(b) 20 with reference to the flowchart in FIG. 17B. These parts generated are shown in form of the matrix $A_u$tk (where the notation k is the number of parts) and vector Btk in the equation (19). The component values of the matrix $A_u$tk and vector Btk of each interface terminal part 401,402 and 403 are shown by the each table in FIG. 32A, FIG. 32B and FIG. 32C with same expression from in FIG. 24.

As the structure of the interface terminal part 402 and part 403 have a similarity, a package can be generated. The matrix $A_u$tk is shown in FIG. 33A, forming of the equation (22). This matrix includes the same components in the both table in FIG. 33B and FIG. 33C. Giving the adjustive variable vector as Xtp, $X_{dP}$, $X_u$tk, $X_d$tk in equation (22) to the following variable; for part 402, Xtp=[xtp1,ytp1,xtp2,ytp2,xtp3,ytp3,xtp4,ytp4]T $X_d$p=[xdp1,ydp1,xdp2,ydp2,xdp3,ydp3,xdp4,ydp4]T $X_u$t2=[x101,y101,x102,y102,x301,y301,x302,y302]T $X_d$t2=[x201,y201,x202,y202,x203,y203,x204,y204]T for a part 403, Xtp=[xtp1,ytp1,xtp2,ytp2,xtp3,ytp3,xtp4,ytp4]T $X_d$p=[xdp1,ydp1,xdp2,ydp2,xdp3,ydp3,xdp4,ydp4]T $X_u$t3=[x203,y203,x204,y204,0,0,0,0]T $X_d$t3=[x301,y301,x302,y302,0,0,0,0]T Two interface terminal parts 402 and 403 can been generated from this package. In the next step of assembling of three interface terminal parts 401,402 and 403, at first the new part P12 and new interface terminal part T12 are generated by connecting the interfaces of part TI 401 and T2 402. These results are presented in table of FIG. 34A and FIG. 34B. Assembling new interface terminal parts T12 and interface terminal part T3 403 generates another new part P123 which is shown with a table in FIG. 35. Then, all terminal variables are decided, because no more external terminal variables remain for parts P123 as shown by the table in FIG. 35.

These determined variable values are the node's displacement of the elastic solid object. The next step decides all states of each interface terminal variable using the backsolving technique. Beginning the backsolving process, the value of the decided terminal variable $X_d$t123 in part P123 in FIG. 35 substitutes the undecided terminal variable $X_u$t12 in table of part P12 on FIG. 34A. Then, the $X_d$12 vector is decided by having only constant values. Next, in the backsolving process, the values of the decided terminal variable $X_d$t12 of part P12 substitutes the undecided terminal variable vector $X_u$t1 and $X_u$t2 in the table of parts T1 in FIG. 32A and T2 in FIG. 32B, and then, the $X_d$1 and $X_d$2 vectors are decided by having only constant values. Then, all variables of part PI 401, P2 402 and P3 403 in simulation parts are determined by substitution. The results are shown below:

for part P1,

| | | | |
|---|---|---|---|
| x1 = −0.002235 | y1 = 0.037214 | x2 = 0.002146 | y2 = 0.037201 |
| x3 = −0.002208 | y3 = 0.031688 | x4 = 0.002129 | y4 = 0.031676 |
| x5 = −0.002138 | y5 = 0.026272 | x6 = 0.002068 | y6 = 0.26259 |
| *x7 = −0.002024 | *y7 = 0.021074 | *x8 = 0.001963 | *y8 = 0.021062 | for parts P2,

| | | | |
|---|---|---|---|
| *x1 = −0.001866 | *y1 = 0.016205 | *x2 = 0.001815 | *y2 = 0.016192 |
| x3 = −0.001664 | y3 = 0.011773 | x4 = 0.001622 | y4 = 0.011761 |
| *x5 = −0.001419 | *y5 = 0.007888 | *x6 = 0.001386 | *y6 = 0.007876 | for parts P3,

| | | | |
|---|---|---|---|
| *x1 = −0.001130 | *y1 = 0.004659 | *y2 = 0.001107 | *y2 = 0.004647 |
| x3 = −0.000797 | y3 = 0.002196 | x4 = 0.000784 | y4 = 0.002183 |
| x5 = −0.000421 | y5 = 0.000607 | x6 = 0.000416 | y6 = 0.000594 |
| x7 = 0.000000 | y7 = 0.000000 | x8 = 0.000000 | y8 = 0.000000 | where the notation * shows the terminal variables.

These variable values are consistent with the result shown in FIG. 21E and FIG. 21F by the ON method.

Then, the present invention thus provides a simple and efficient method and apparatus requiring a smaller amount of memory and decreased processing time in analyzing a system using the NFEM. This present invention as TPS method can apply to all numerical analysis of physical phenomenon and is a most powerful new finite element method. The system may be applied advantageously in computer-aided engineering tools. According to the invention, only some of the parts of beam 130 need be analyzed and a full solution of those parts is provided.

(3) The Third Practical Example For TPS On Decomposition Method In Hierarchical Parallel Processing.

Figure 16C:
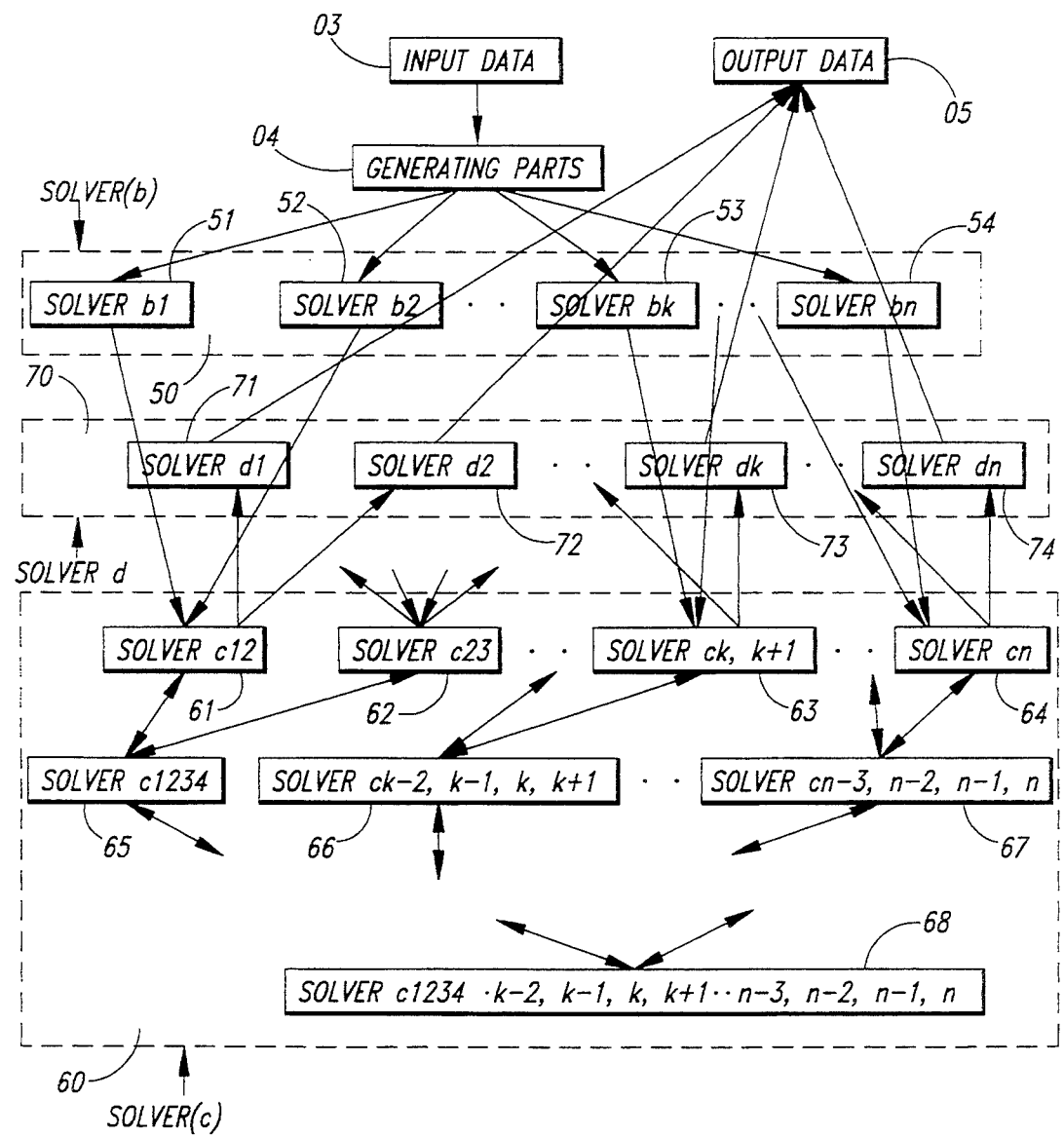
FIG. 16C shows a block diagram of an analyzer of TPS for a new finite element modeling with hierarchical parallel processing.
Figure 17C:
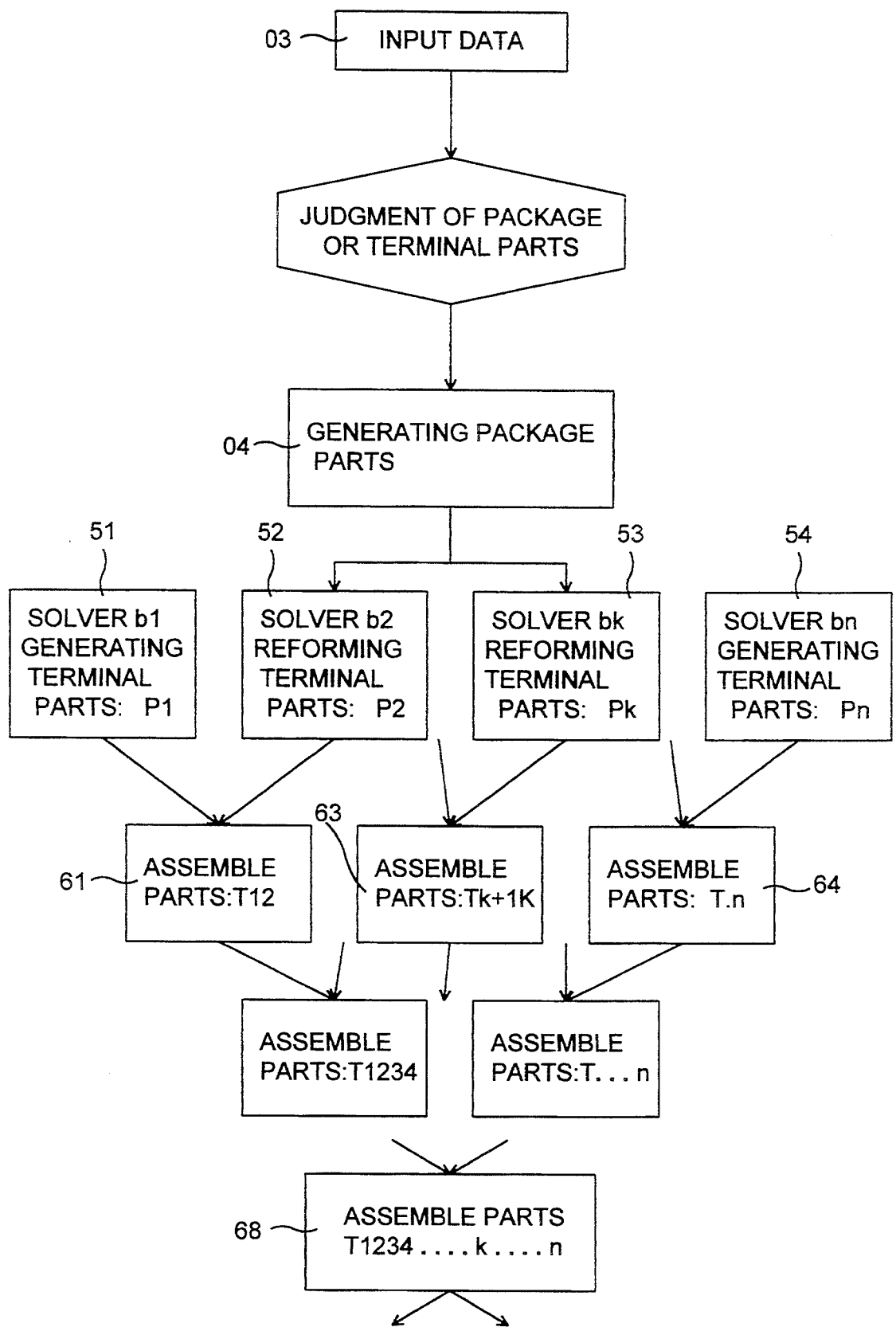
FIG. 17C is a flowchart illustrating an example of the NFEM method for analyzing in accordance with FIG. 16C.
Figure 17C:
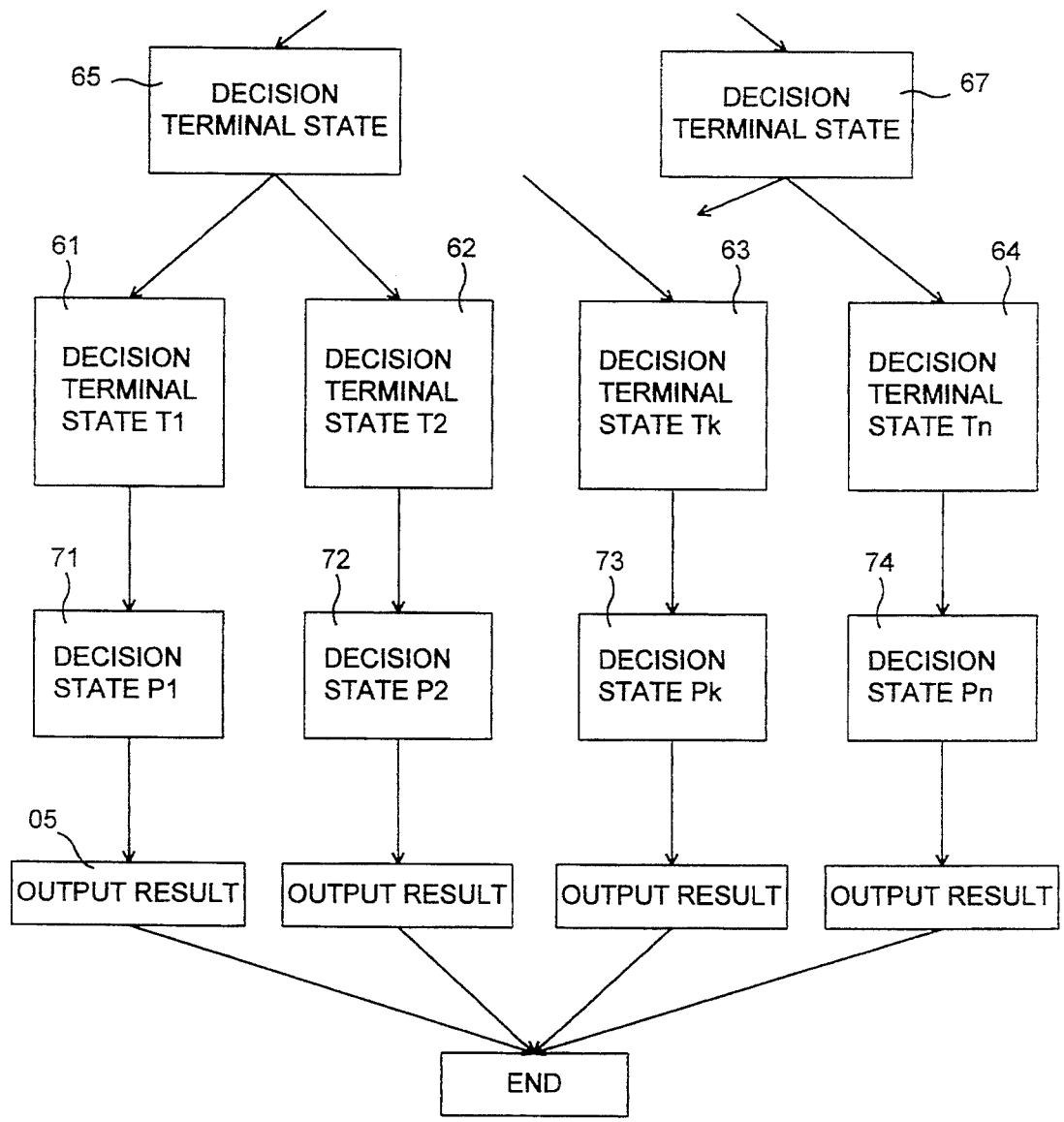

An apparatus for the terminal part system (TPS) on decomposition method in hierarchical parallel processing as a third practical example is shown in FIG. 16C. The apparatus basically has six class processing devices, an input device 03, an output device 05, parts generating device 04, a solver(b) device 50, a solver(c) device 60 and a solver(d) device 70. In the apparatus of FIG. 16C, the analysis processing for FEM executes with reference to the flowchart of FIG. 17C. The process has two main parallel processing steps 50, 70 and one hierarchical parallel processing step 60 in FIG. 17C. The numbers of the processing blocks in the apparatus of FIG. 16C correspond to the number of columns (steps) in the flowchart of FIG. 17C. By following the flowchart and referring to the processing block of FIG. 16C, the third method and apparatus of the invention for TPS with the hierarchical parallel method will now described in more detail.

The step 03 at the input data block 03 starts to input the information data and the next step indicates the number and shape of decomposing a simulation object to the parts. At generating part block 04, an object is decomposed into many parts.

In next stage block 50, the step carries out in parallel for each part the following actions: first inputting data that are physical data, boundary condition data, information data of the shape and number of elements, and data of the external and internal terminal nodes in the part. Next the interface terminal parts are generated, including the generation of the package. The next stage 60 carries out the assembly and determination of the interface terminal parts in hierarchical parallel processing in a forward and backward decided process. The last stage 70 is the determination of inside states and the output of results analyzed in each part with parallel processing. Each step in this stage is the same as described above in the second practical example.

The technique proposed herein is a new technique for finite element analysis in which the analysis procedure differs from conventional methods. Because this technique processes the nodes of the analysis object topologically, one can not only know how the boundary conditions will be propagated through the analysis object, but compared to conventional methods, the analysis process can be performed at high speeds using an extremely small memory capacity. It also offers the potential to interface to a parallel processor, something which previously has been impossible. Regarding this conversion to an interface, the analysis system is divided into several partitions, and a partitioned subsystem is presumed to be a part attached to the interface. Joining these interface parts together makes analysis of the entire system possible.

Thereby, the simulation result can be obtained in a shorter processing time with this alternative embodiment of the method and apparatus of the invention using hierarchical parallel processing on TPS.

I claim:

1. An apparatus for analyzing a physical or produced system based on linear systems applied to a terminal part system (TPS) based on a decomposition method for finite element modeling or partial differential modeling, comprising:

an input device for receiving information data on a number and shape for decomposing a modeling system to input parts;

a generating part device which decomposes a modeling system to a number of parts using the information data;

a solver(a) device for each said part;

a generating node block which arranges nodes on an object, selects a node for deciding itself, numbers its node as a kth node;

a generating element block which constructs only elements of relating to the selected kth node by dividing an object in accordance with a design of the shape data and numbers its elements;

a generating element equation block for generating element equations from the elements generated above;

an assembly means for assembling the element equations connected to a selected node;

a memory block for storing the assembled element equations;

a generating block for generating nodal equations which generates the nodal equations for the kth node by selecting the equations connected to the node from the element equations stored in memory block;

a PSS equation-making block which assembles the node equations and boundary conditions of kth node into a basic PSS equation;

a PSS equation-determining block;

a memory block for storing the basic PSS equation;

a judgment block for determining if the kth node is the final node.

a solver(b) device for each said processing part;

a means for producing an interface terminal part for each part;

a means for producing a package for groups of similar part;

a means for producing an interface terminal part from the package;

a solver(c) device for assembling the interface terminal part to produce a system of equations representative of the system before decomposition;

a solver(d) device for each said processing part;

a means for determining the state of the interface terminal nodes and all nodes by backsolving technique;

a storing device for storing a basic PSS equation of each said processing part; and representing device for presenting the simulation result obtained.

2. The apparatus of claim 1 wherein said means for analyzing the physical or produced systems based on the linear systems or nonlinear systems, including dynamical systems or time depending systems operates by applying the terminal parts system (TPS) to finite element modeling or partial differential modeling.

3. The apparatus of claim 1, further comprising:
means for iteratively processing until a solution within a predetermined error is obtained for nonlinear system;

a solving device for solving large scale matrices having nonzero components or a diagonal band structure of nonzero components.

4. The combination of claim 1, further comprising a means for performing parallel processing on each said processing part.

5. A method for analyzing a physical system using linear equations with finite element modeling or partial differential modeling, comprising the steps of:
 (a) inputting information data as to the number and the shape for decomposing a system model to parts;
 (b) generating parts decomposed from a system model in accordance with the information data;
 (c) arranging nodes of the object to be analyzed in accordance with information of input data;
 (d) numbering the arranged nodes;
 (e) selecting one node as a kth node to be determined where k is 1 for the first node selected and subsequent nodes are incremented;
 (f) constructing only elements connected to the selected kth node within the modeling system data;
 (g) numbering the elements constructed;
 (h) generating element equations for all elements generated based on a partial differential equation;
 (i) storing the element equations in memory;
 (j) generating nodal equations for the selected kth node by selecting the equations in respect of kth node from the element equations stored in memory;
 (k) assembling the nodal equations and boundary conditions of the kth node into a basic PSS equation;
 (l) finding a solution to the basic PSS equation;
 (m) storing the solution to the basic PSS equation in memory;
 (n) judging the state in reference with the condition that, if the kth node is not last node, returning to step (d) and repeating steps (b) to (m) until the kth node is the last node or if kth node is the last node, then ending the simulation process and outputting the analyzed results.
 (o) producing a terminal pan by decomposing the object to be analyzed to produce an interface terminal pan.
 (p) producing with a solver(b) device the interface terminal part from the terminal part;
 (q) producing the package by gathering similar parts;
 (r) producing the interface terminal pans from the package;
 (s) assembling the interface terminal pans with solver(c) device to recover an original system;
 (t) determining the state of the interface terminal nodes and all nodes by backsolving for each said processing parts;
 (u) storing a basic PSS equation of each processing part; and
 (v) outputting an indication of the physical characteristics of the physical system.

6. The method as recited in claim 5 wherein the step of generating said parts comprises the step of decomposing a modeling system to parts which have a group according to physical similarities 7. The method as recited in claim 5, further comprising the steps of:
 generating a basic PSS equation for the part wherein the terminal part is constructed from three kinds of variable vector groups, including an internal variable group isolated from the interface nodes of other parts, said an internal terminal variable group having internal terminal variables directly connected with the interface terminal variable and an external terminal variable group including external terminal variables connected to the interface nodes of other parts; and
 wherein generating the terminal part includes the step of generating the interface terminal parts for the part without the interface terminal from the terminal part.

8. The method as recited in claim 7, further including parallel processing of nodes and generating method for generating the terminal parts in parallel.

9. The method as recited in claim 7 wherein generating the interface terminal parts comprises the steps of:
 selecting the internal terminal variable from the decided variable and external terminal variable from the undecided variable in the basic PSS equation;
 producing the relation between the internal terminal variables and the external terminal variables for the interface terminal part; and
 including a constant vector with the boundary conditions.

10. The method as recited in claim 9 wherein generating the package comprises the steps of:
 examining whether other parts have the constructive similarity; grouping the similar parts in the package;
 adding in the common status of similar parts to the adjustable new nodes for adjusting the difference nodes or construction and boundary conditions in all similar parts;
 repeating steps (d) to (q) of claim 5;
 generating a basic PSS equation for the part wherein the terminal part is constructed from three kinds of variable vector groups, including an internal variable group isolated from the interface nodes of other parts, said an internal terminal variable group having internal terminal variables directly connected with the interface terminal variable and an external terminal variable group including external terminal variables connected to the interface nodes of other parts;
 generating the interface terminal part; and
 storing the package in memory.

11. The method as recited in claim 7 wherein producing the terminable parts from the package comprises the step of setting adjustable variables to fixed values for the similar part groups in the package.

12. The method as recited in claim 7 wherein assembly of the interface terminal part for recovering an original system comprises the steps of:
 connecting the internal terminal of each ith part to the external terminal of each other jth parts to each other on the interface terminal;
 connecting the external terminal of ith parts and internal terminal of the jth parts to each other on the interface terminal;
 determining the variables relating to the connected terminals using a PSS technique; and
 producing a new interface terminal part connecting the ith and jth interface parts.

13. The method as recited in claim 12, including sequentially generating the newly constituted interface terminal parts.

14. The method of claim 12 wherein the step of generating the newly constituted interface terminal parts is performed by parallel processing.

15. The method as recited in claim 12 wherein the step of generating the newly constituted interface parts is performed by hierarchical processing.

16. The method as recited in claim 7 wherein determining the internal variable vector for each part comprises the step of substituting the value of the determined external variable vector into the external variable of the interface terminal part produced through backsolving and substituting the determining external vector into each basic PSS equation of each part, thereby determining the external variables of the parts.

17. The method of claim 5 wherein the step of generating the part comprises the steps of:
producing parts separately and independently;
storing the produced parts in storage memory or in storing on memory disks as a database of parts; and
retrieving the stored parts directly from the storage device without consuming processing time.

18. The combination of claim 1 wherein said device is operative to analyze coupled systems, the coupled systems formed by combining a number of the different physical systems.

19. The apparatus of claim 18 wherein the coupled systems comprise a plurality of different systems selected from the group of structural systems, fluid systems, mechanical systems and electrical systems.

20. The combination of claim 18 wherein finite element modeling or partial differential modeling relate to analyses selected from the group of nonlinear analysis, transient analysis, dynamics analysis, time domain analysis and interaction analysis.

* * * * *

UNITED STATES PATENT AND TRADEMARK OFFICE
CERTIFICATE OF CORRECTION

PATENT NO. : 5,442,569
DATED : August 15, 1995
INVENTOR(S) : Minetada Osano

It is certified that error appears in the above-indentified patent and that said Letters Patent is hereby corrected as shown below:

In column 35, claim 5, line 41, please delete "pan" and insert therefor --part--.

In column 35, claim 5, line 43, please delete "pan" and insert therefor --part--.

In column 35, claim 5, line 47, please delete "pans" and insert therefor --parts--.

In column 35, claim 5, line 49, please delete "pans" and insert therefor --parts--.

Signed and Sealed this

Thirtieth Day of January, 1996

Attest:

BRUCE LEHMAN

Attesting Officer

Commissioner of Patents and Trademarks